US012284807B2

(12) United States Patent
Ogawa et al.

(10) Patent No.: US 12,284,807 B2
(45) Date of Patent: Apr. 22, 2025

(54) THREE-DIMENSIONAL MEMORY DEVICE WITH SEPARATED CONTACT REGIONS

(71) Applicant: SANDISK TECHNOLOGIES LLC, Addison, TX (US)

(72) Inventors: Hiroyuki Ogawa, Nagoya (JP); Hardwell Chibvongodze, Hiratsuka (JP); Zhixin Cui, Nagoya (JP); Rajdeep Gautam, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 648 days.

(21) Appl. No.: 17/397,777

(22) Filed: Aug. 9, 2021

(65) Prior Publication Data

US 2023/0038557 A1     Feb. 9, 2023

(51) Int. Cl.
  *H10B 43/27*     (2023.01)
  *G11C 16/04*     (2006.01)
  (Continued)

(52) U.S. Cl.
  CPC ......... *H10B 43/27* (2023.02); *G11C 16/0483* (2013.01); *G11C 16/08* (2013.01); *G11C 16/24* (2013.01); *H01L 23/5226* (2013.01); *H01L 23/5283* (2013.01); *H10B 41/10* (2023.02); *H10B 41/27* (2023.02); *H10B 41/35* (2023.02);
  (Continued)

(58) Field of Classification Search
  CPC ........ H10B 41/10; H10B 41/27; H10B 41/35; H10B 41/40; H10B 43/10; H10B 43/27; H10B 43/35; H10B 43/40; H10B 43/50; H10B 80/00; H01L 23/5226; H01L 23/5283; G11C 16/0483; G11C 16/08; G11C 16/24

See application file for complete search history.

(56) References Cited

U.S. PATENT DOCUMENTS 5,915,167 A     6/1999   Leedy
9,224,747 B2   12/2015   Mizutani et al.
(Continued)

FOREIGN PATENT DOCUMENTS

| JP | 2016062901 A | 4/2016 |
|---|---|---|
| KR | 20190015773 A | 2/2019 |
| KR | 20200057936 A | 5/2020 |

OTHER PUBLICATIONS

USPTO Office Communication, Non-Final Office Action for U.S. Appl. No. 17/397,846, mailed Jun. 1, 2023, 12 pages.
(Continued)

*Primary Examiner* — Marcos D. Pizarro
(74) *Attorney, Agent, or Firm* — THE MARBURY LAW GROUP PLLC

(57) ABSTRACT

A memory die includes an alternating stack of insulating layers and electrically conductive layers through which memory opening fill structures vertically extend. The memory die includes at least three memory array regions interlaced with at least two contact regions, or at least three contact regions interlaced with at least two memory array regions in the same memory plane. A logic die including at least two word line driver regions can be bonded to the memory die. The interlacing of the contact regions and the memory array regions can reduce lateral offset of boundaries of the word line driver regions from boundaries of the contact regions.

20 Claims, 43 Drawing Sheets

(51) Int. Cl.
| | |
|---|---|
| *G11C 16/08* | (2006.01) |
| *G11C 16/24* | (2006.01) |
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |
| *H10B 43/50* | (2023.01) |

(52) U.S. Cl.
CPC ............. *H10B 41/40* (2023.02); *H10B 43/10* (2023.02); *H10B 43/35* (2023.02); *H10B 43/40* (2023.02); *H10B 43/50* (2023.02)

(56) References Cited

U.S. PATENT DOCUMENTS

| | | | |
|---|---|---|---|
| 10,468,433 B2 * | 11/2019 | Kim | H01L 29/1037 |
| 10,692,606 B2 | 6/2020 | Bender et al. | |
| 10,861,871 B2 | 12/2020 | Tobioka | |
| 10,861,873 B2 | 12/2020 | Kim et al. | |
| 10,872,899 B2 | 12/2020 | Kim et al. | |
| 10,903,237 B1 | 1/2021 | Hosoda et al. | |
| 11,081,443 B1 | 8/2021 | Mizutani et al. | |
| 11,114,459 B2 | 9/2021 | Iwai et al. | |
| 11,133,252 B2 | 9/2021 | Ito et al. | |
| 11,139,237 B2 | 10/2021 | Shao et al. | |
| 11,322,440 B2 | 5/2022 | Kubo et al. | |
| 11,355,506 B2 | 6/2022 | Tokita et al. | |
| 11,367,736 B2 | 6/2022 | Tokita et al. | |
| 2016/0071876 A1 | 3/2016 | Mizuno et al. | |
| 2017/0263556 A1 * | 9/2017 | Tessariol | H01L 21/76877 |
| 2019/0043879 A1 | 2/2019 | Lu et al. | |
| 2019/0081061 A1 * | 3/2019 | Tessariol | H01L 21/76877 |
| 2019/0237477 A1 | 8/2019 | Baek et al. | |
| 2019/0280001 A1 | 9/2019 | Terasawa et al. | |
| 2019/0371728 A1 * | 12/2019 | Gossman | H01L 21/76816 |
| 2019/0378855 A1 | 12/2019 | Kim et al. | |
| 2019/0393240 A1 | 12/2019 | Kim et al. | |
| 2020/0161326 A1 | 5/2020 | Oh et al. | |
| 2020/0295028 A1 | 9/2020 | Kim et al. | |
| 2021/0057442 A1 * | 2/2021 | Zhang | H10B 43/10 |
| 2021/0242128 A1 | 8/2021 | Ito et al. | |
| 2021/0391257 A1 * | 12/2021 | Nguyen | H01L 23/5283 |
| 2022/0302146 A1 | 9/2022 | Shimomura et al. | |

OTHER PUBLICATIONS

USPTO Office Communication, Notice of Allowance and Fee(s) Due for U.S. Appl. No. 17/397,678, mailed Jun. 14, 2023, 15 pages.

USPTO Office Communication, Notice of Allowance and Fee(s) Due for U.S. Appl. No. 17/556,298, mailed Feb. 5, 20 pages.

Endoh et al., "Novel Ultra High Density Memory with a Stacked-Surrounding Gate Transistor (S-SGT) Structured Cell," IEDM Proc. (2001) 33-36.

U.S. Appl. No. 16/881,346, filed May 22, 2020, Sandisk Technologies LLC.

U.S. Appl. No. 16/881,401, filed May 22, 2020, Sandisk Technologies LLC.

U.S. Appl. No. 16/921,146, filed Jul. 6, 2020, Sandisk Technologies LLC.

U.S. Appl. No. 16/985,305, filed Aug. 5, 2020, Sandisk Technologies LLC.

U.S. Appl. No. 17/081,458, filed Oct. 27, 2020, Sandisk Technologies LLC.

U.S. Appl. No. 17/226,321, filed Apr. 9, 2021, Sandisk Technologies LLC.

U.S. Appl. No. 17/397,678, filed Aug. 9, 2021, Sandisk Technologies LLC.

U.S. Appl. No. 17/397,846, filed Aug. 9, 2021, Sandisk Technologies LLC.

ISR—Notification of Transmittal of The International Search Report and Written Opinion of the International Searching Authority for International Patent Application No. PCT/US2022/028266, mailed Apr. 18, 2023, 11 pages.

* cited by examiner

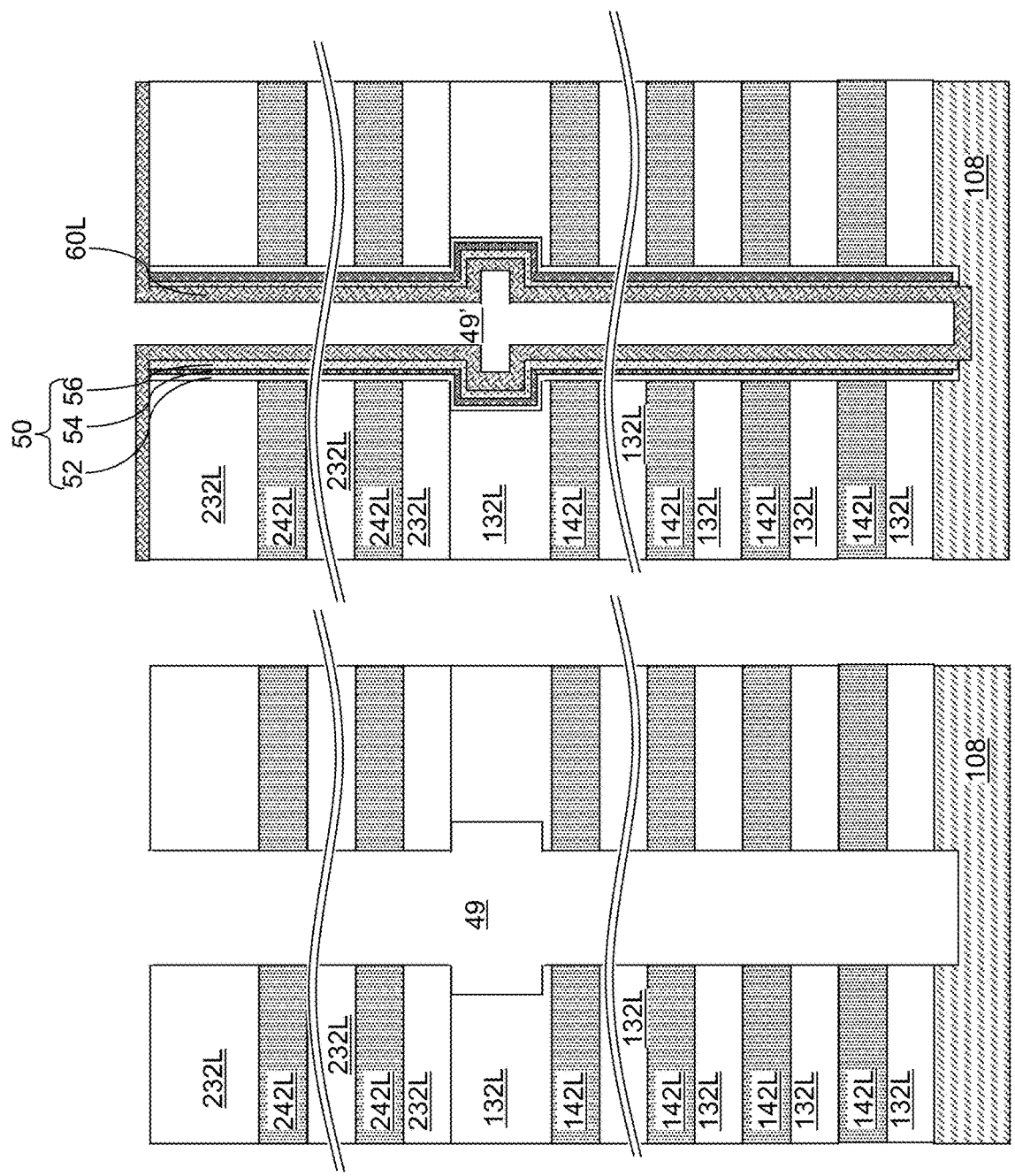

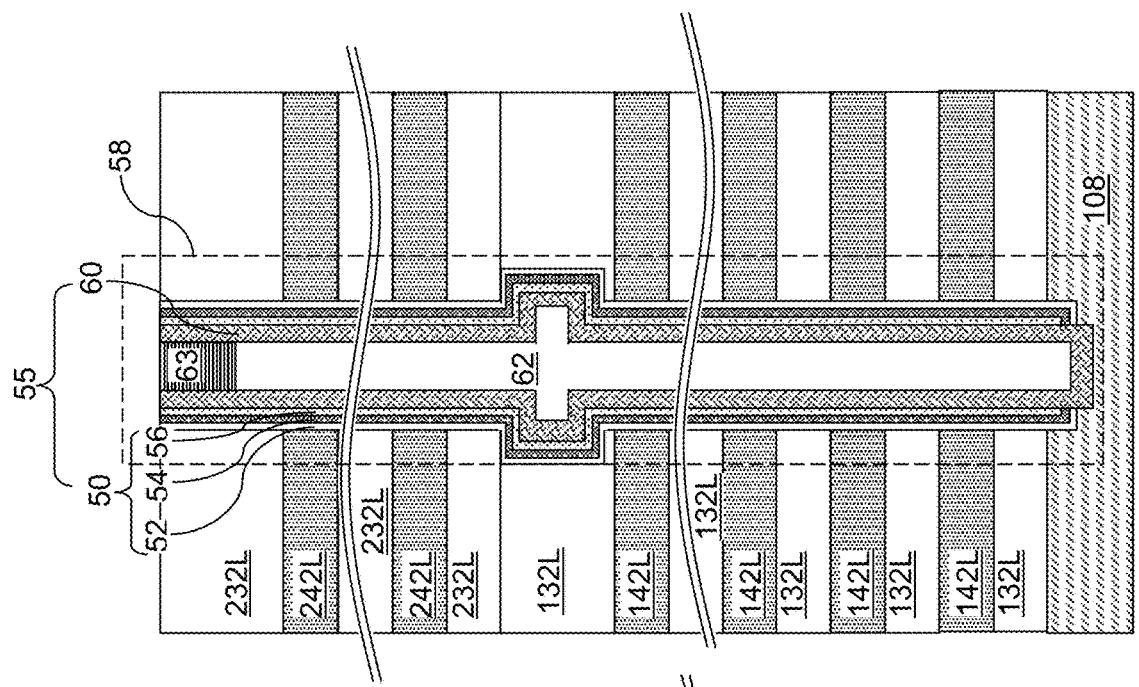
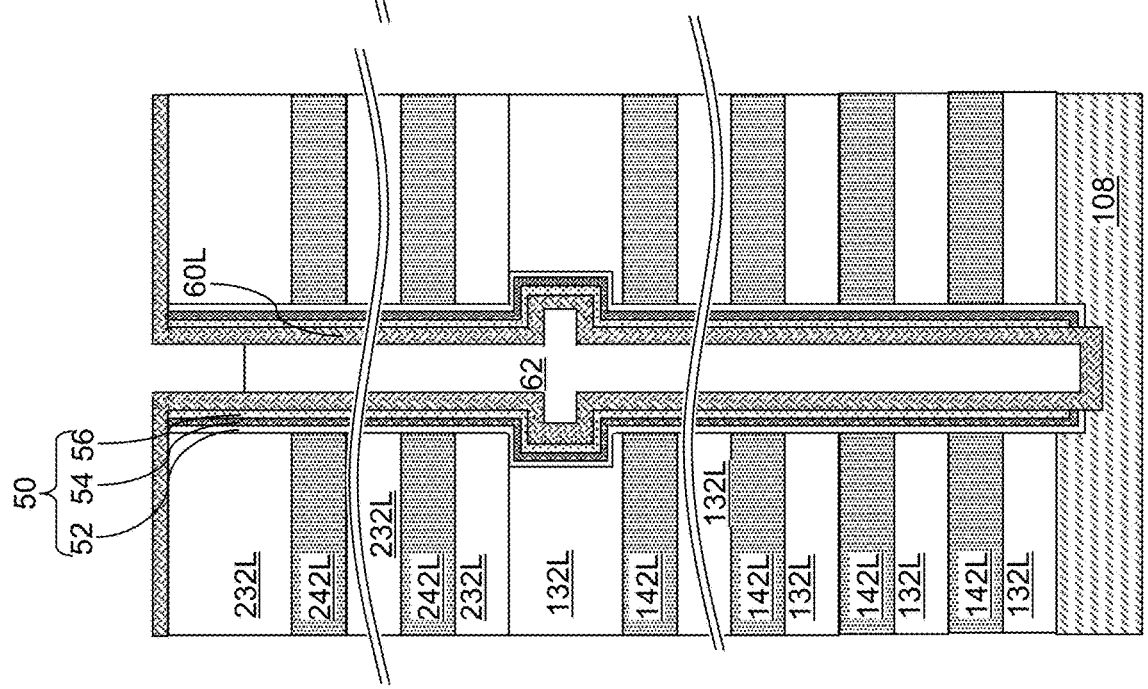

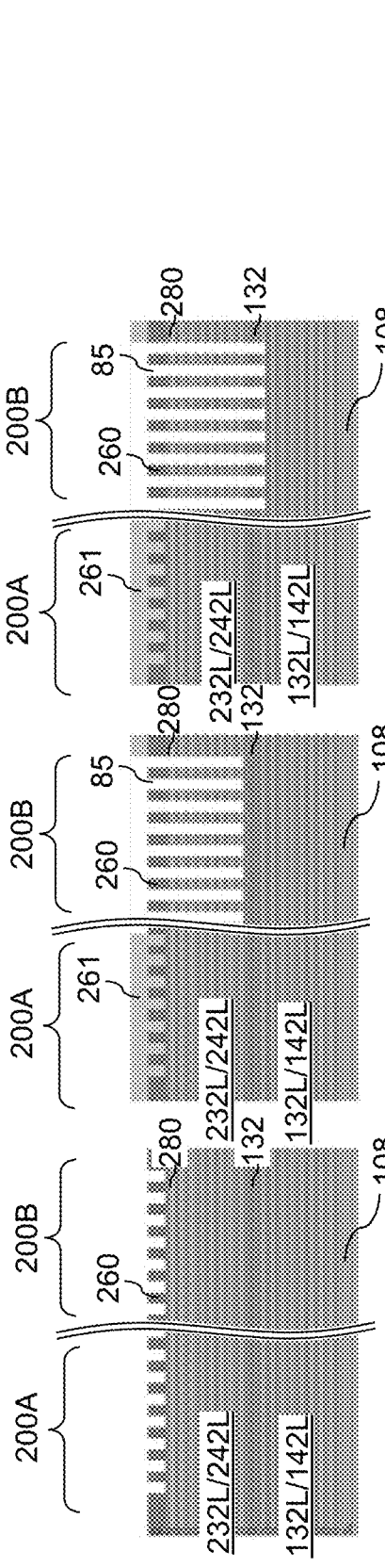
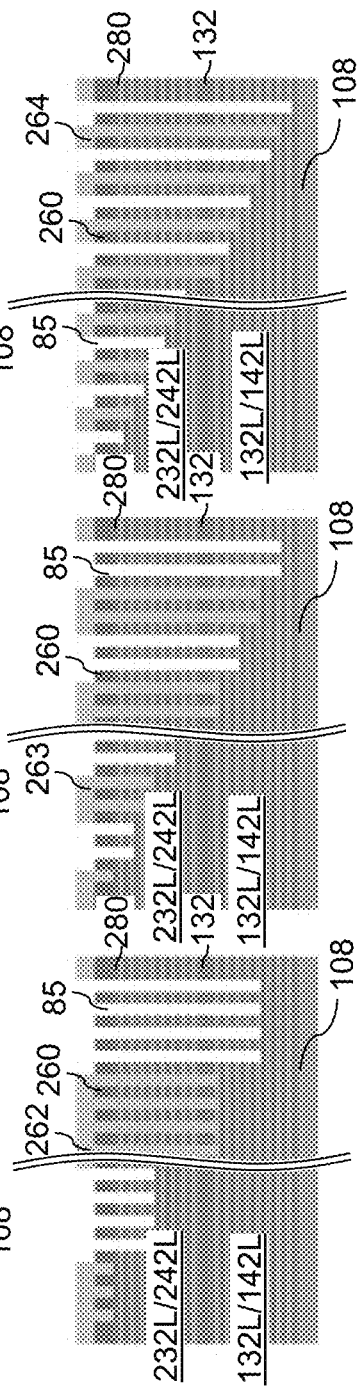

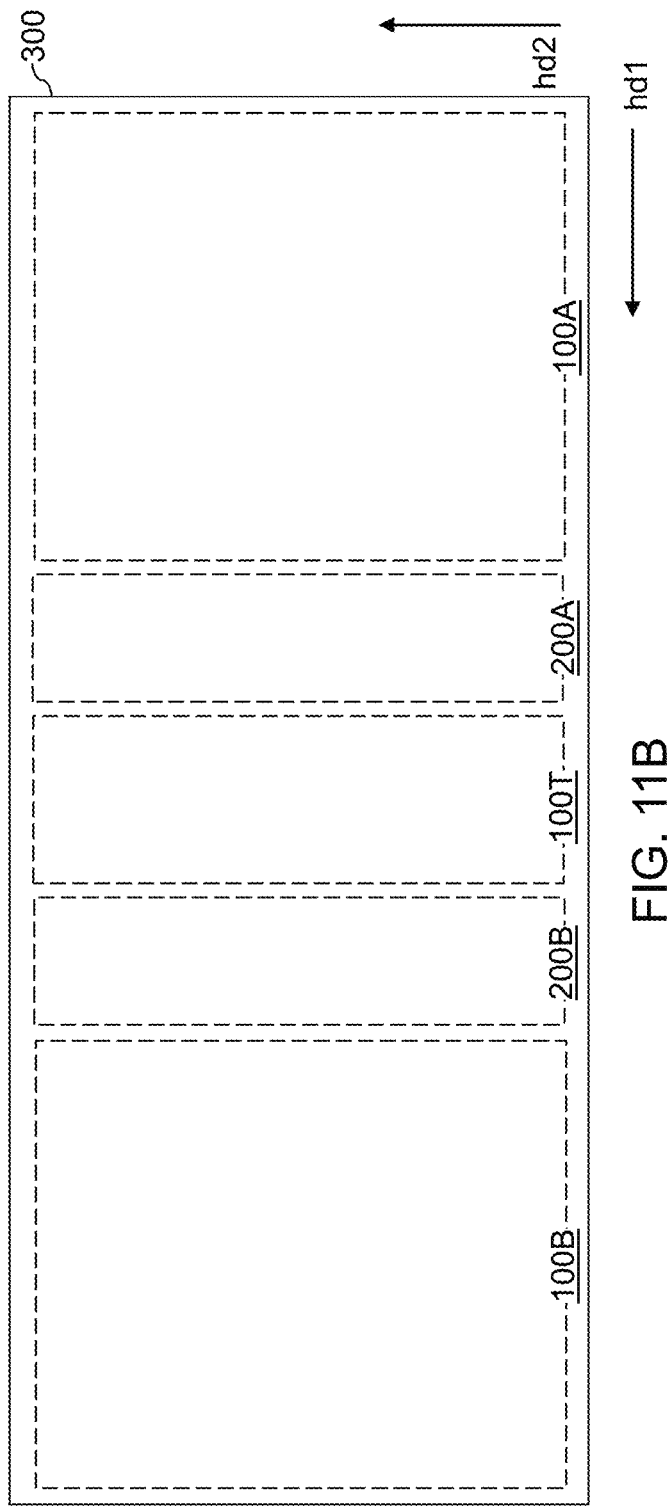
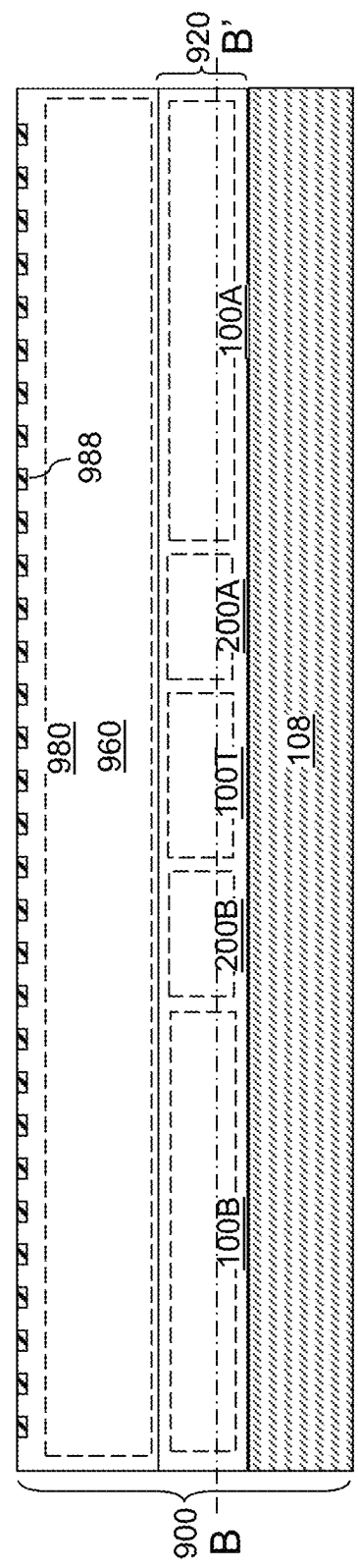
FIG. 11B
FIG. 11A

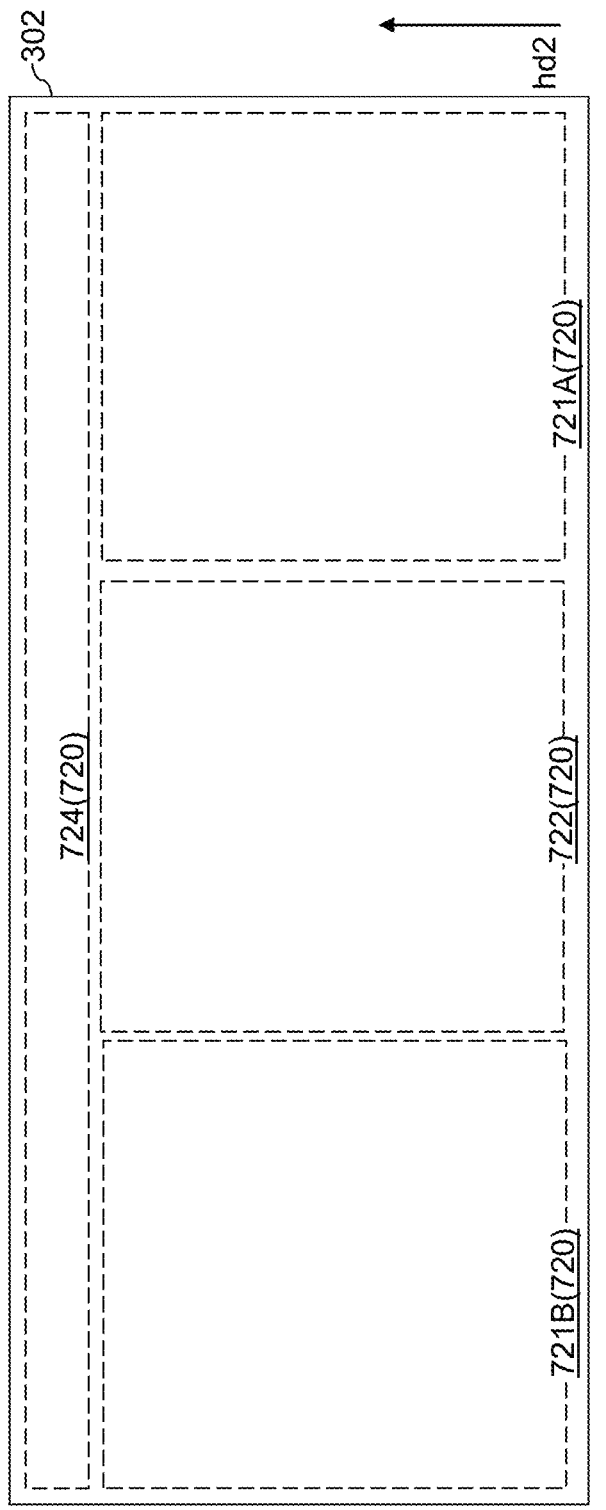
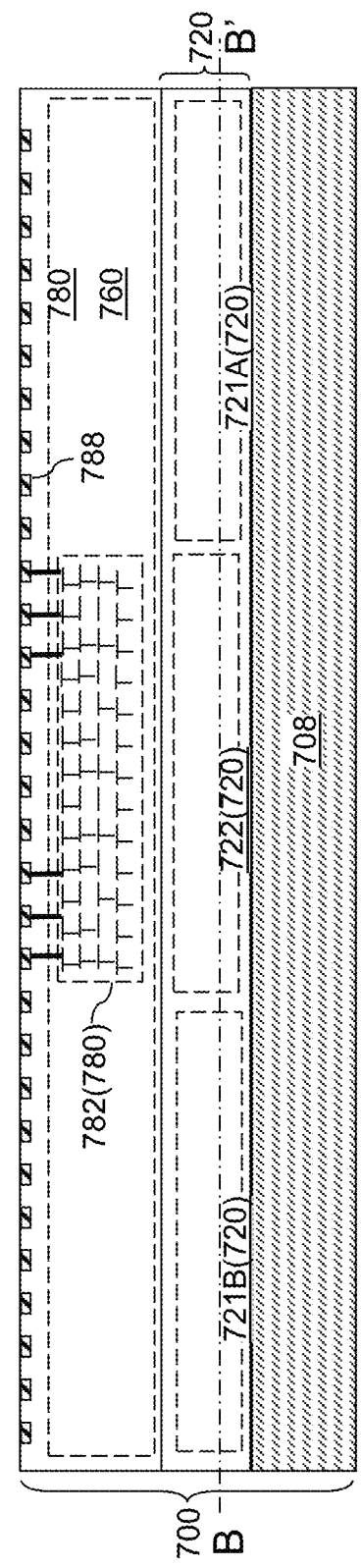
FIG. 12B
FIG. 12A

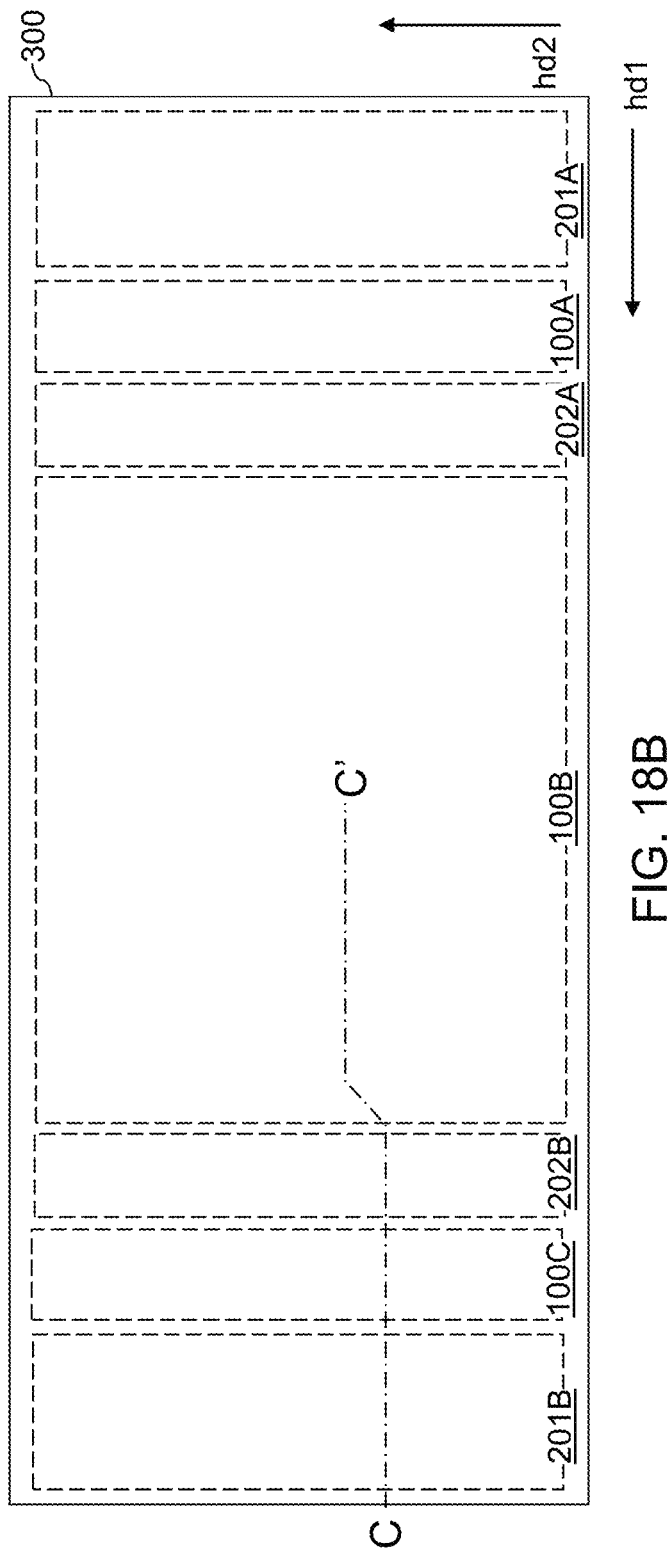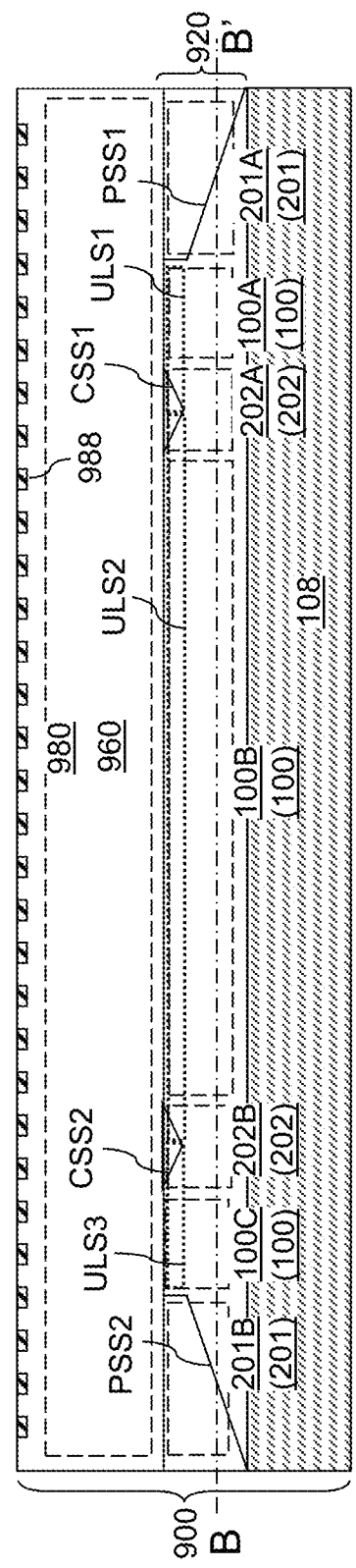
FIG. 18B
FIG. 18A

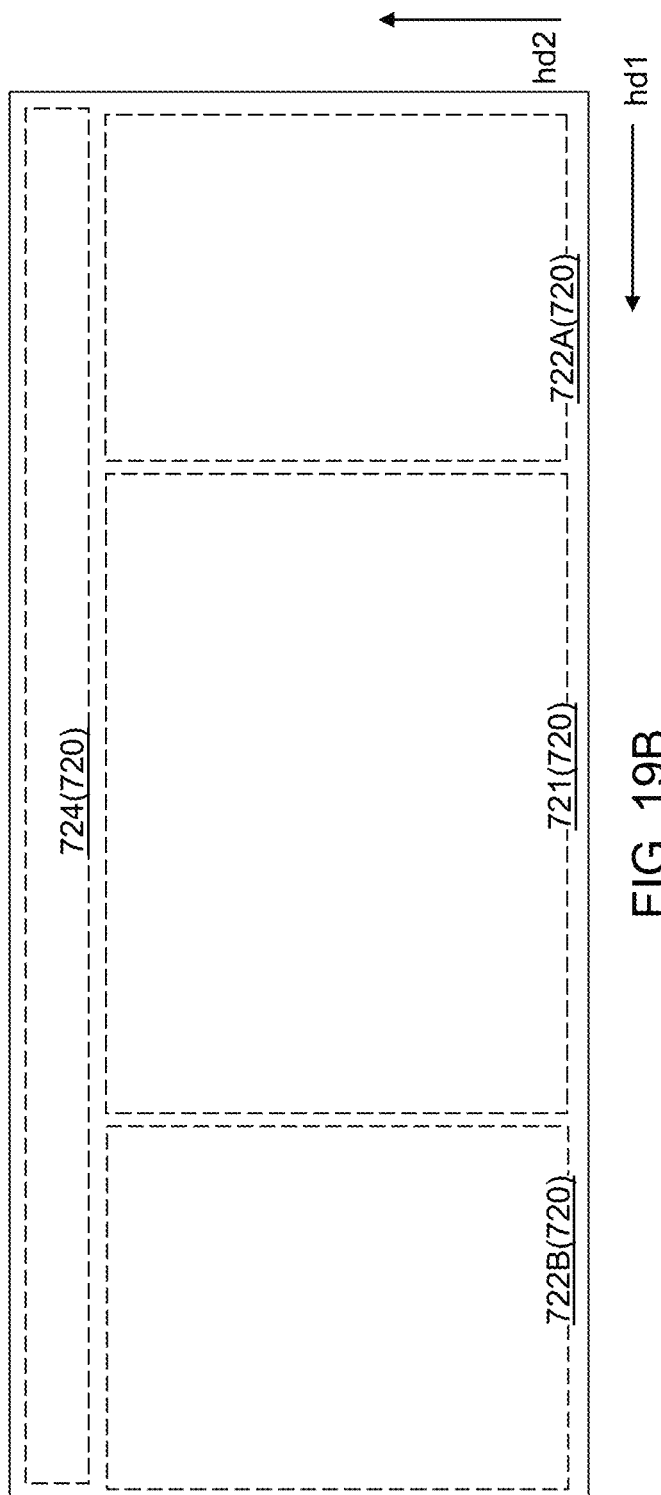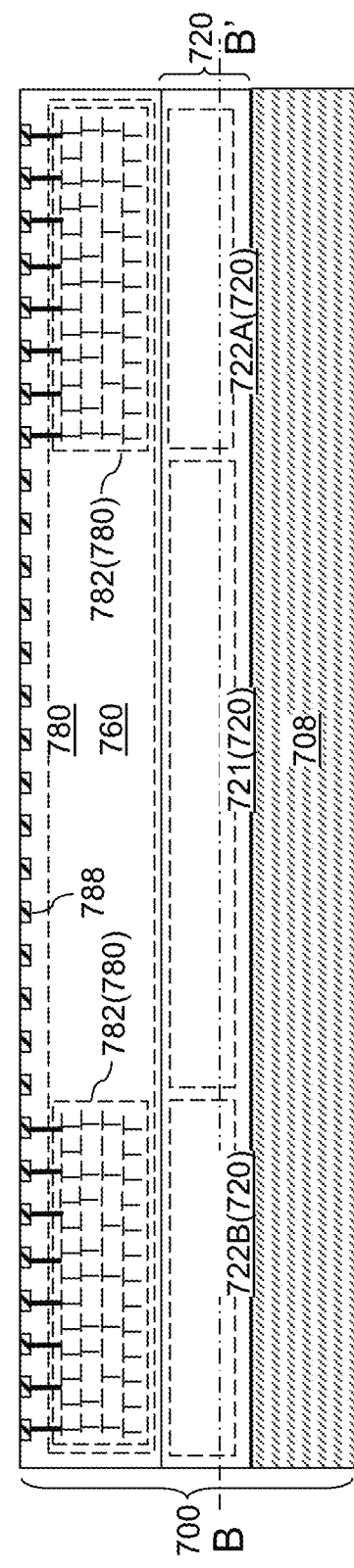
FIG. 19B
FIG. 19A

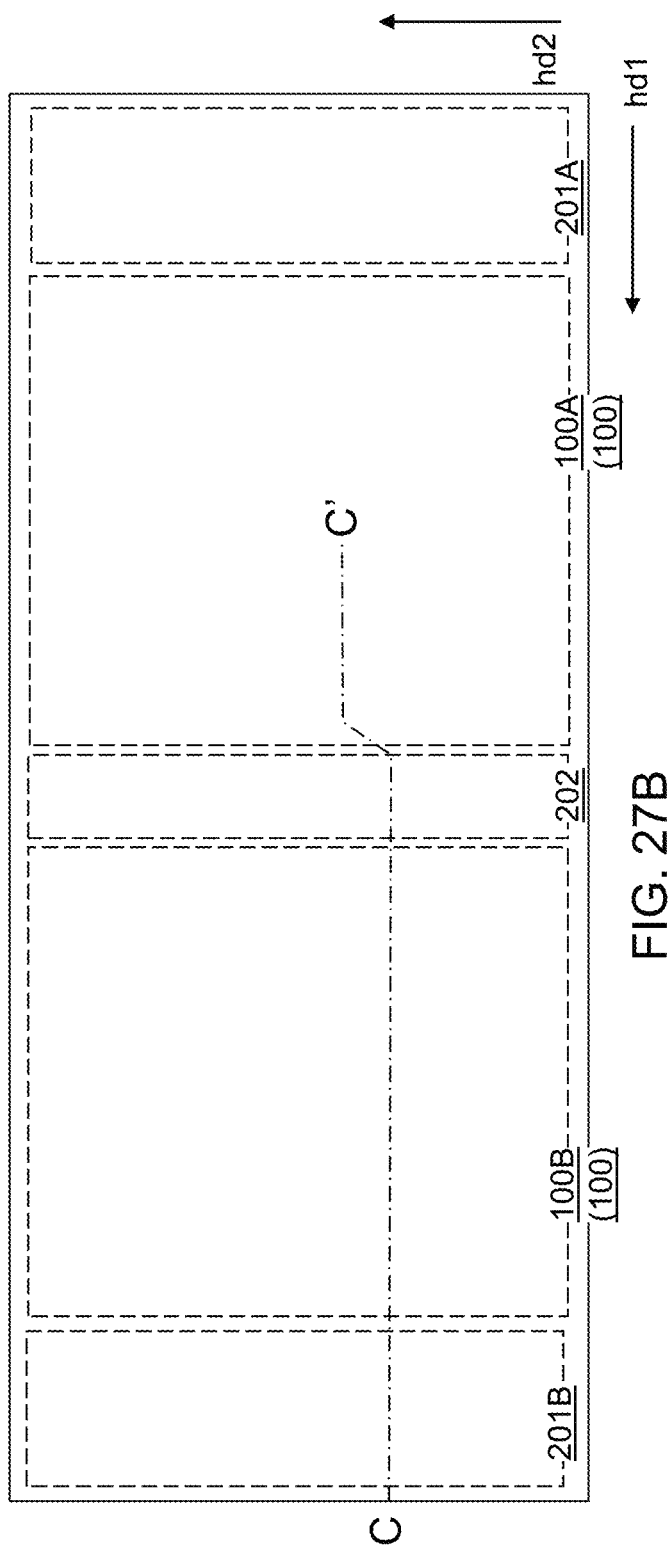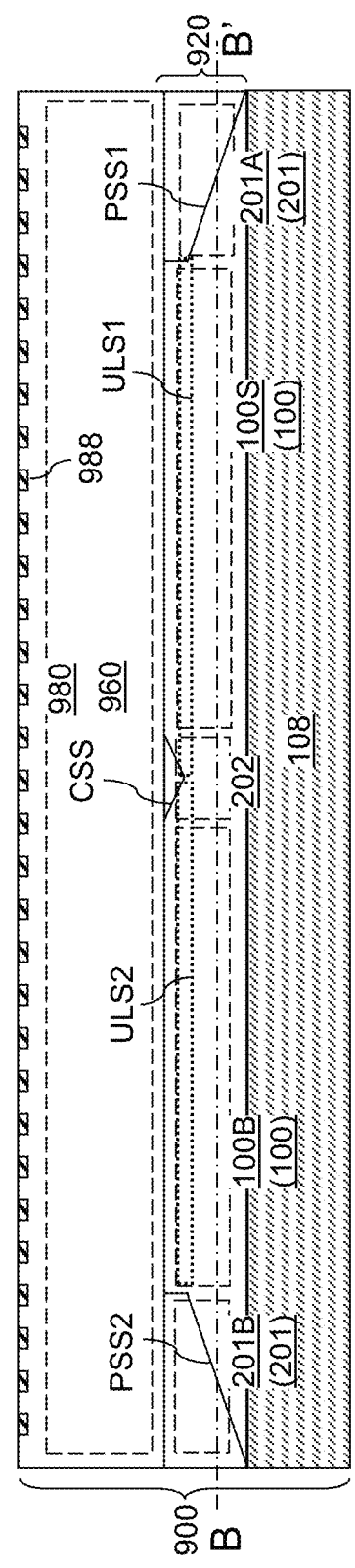
FIG. 27B
FIG. 27A

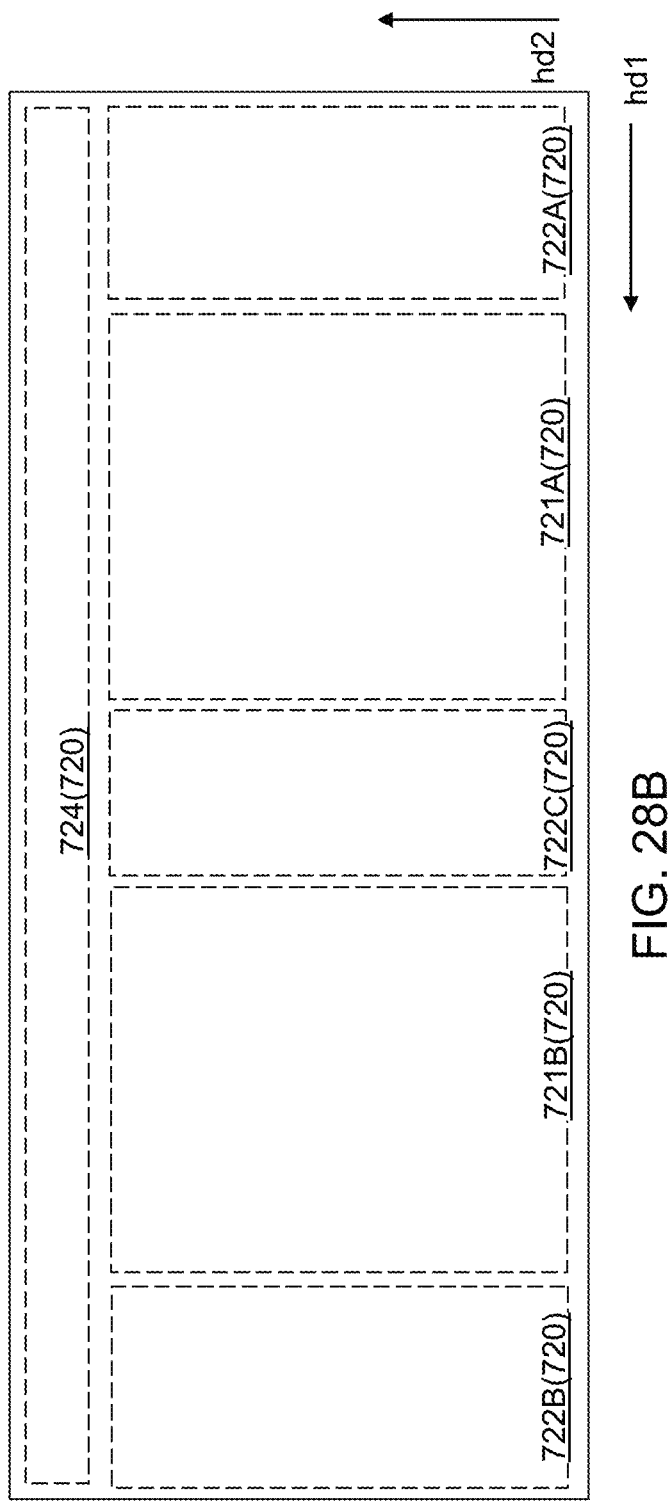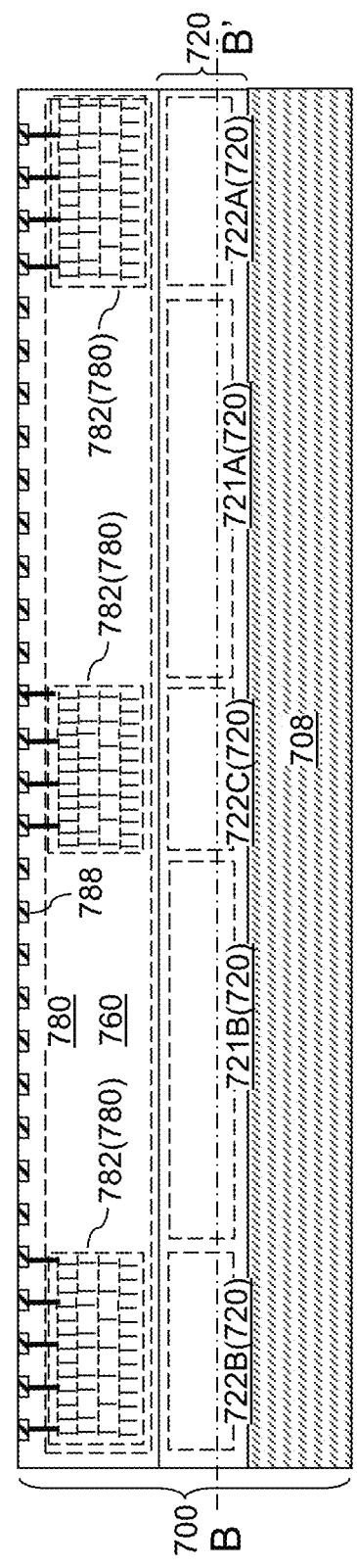
FIG. 28B
FIG. 28A

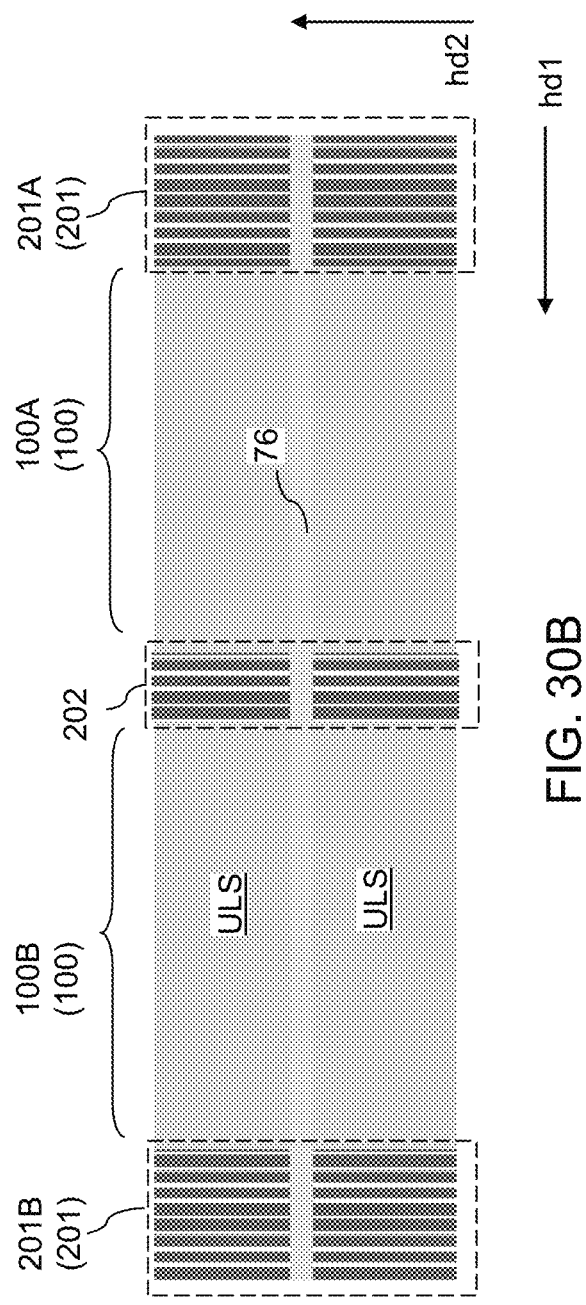
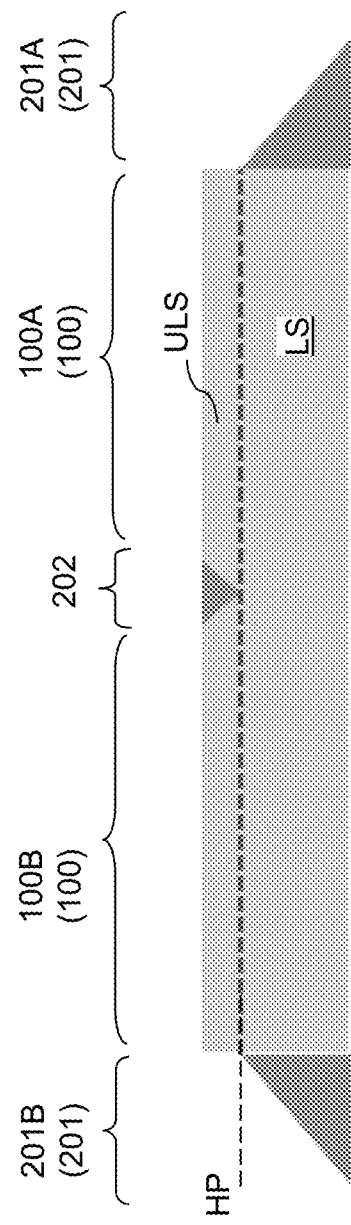
FIG. 30B
FIG. 30A

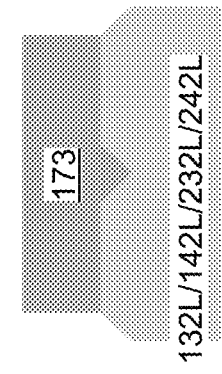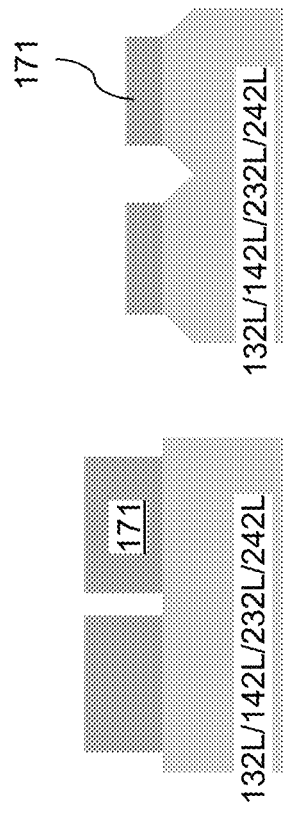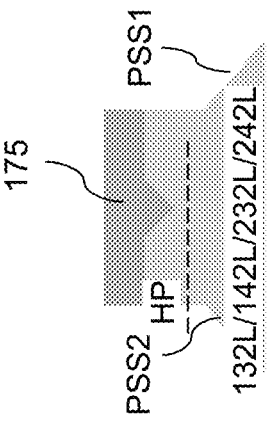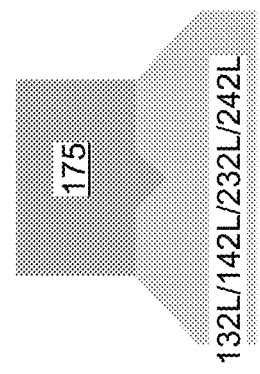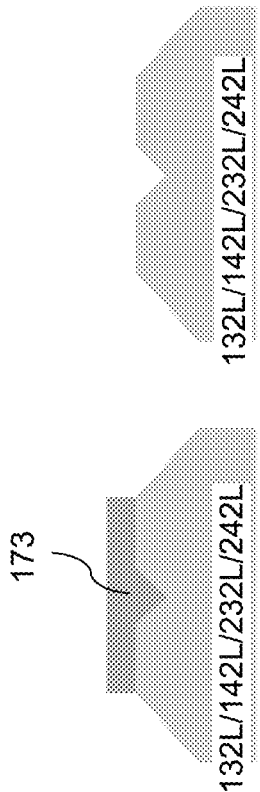

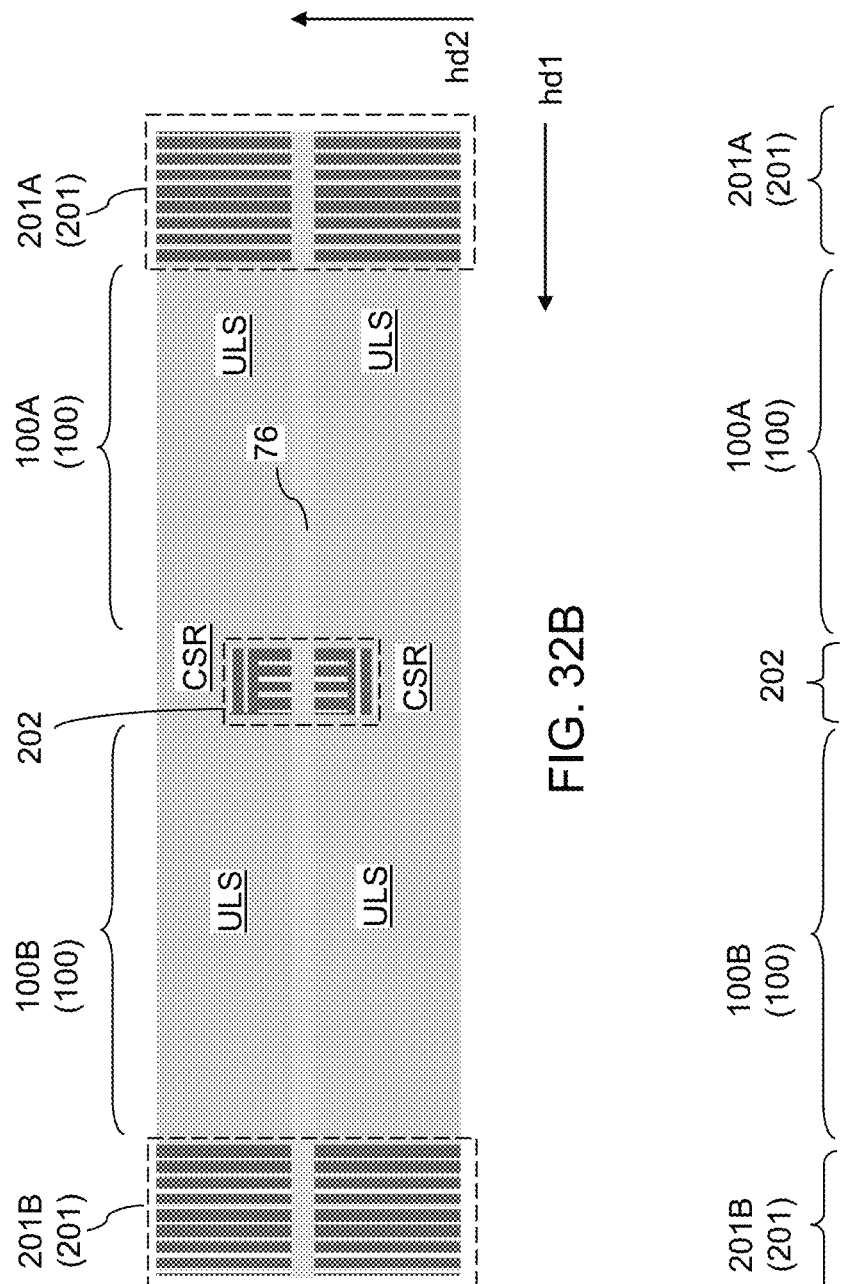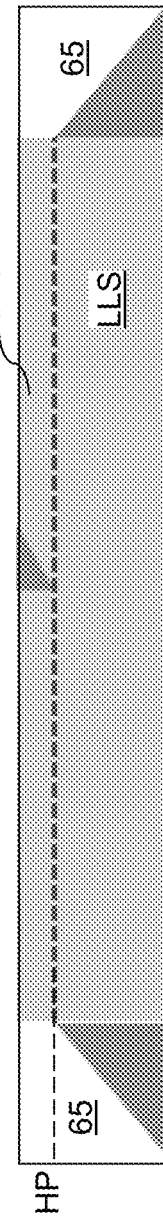
FIG. 32B
FIG. 32A

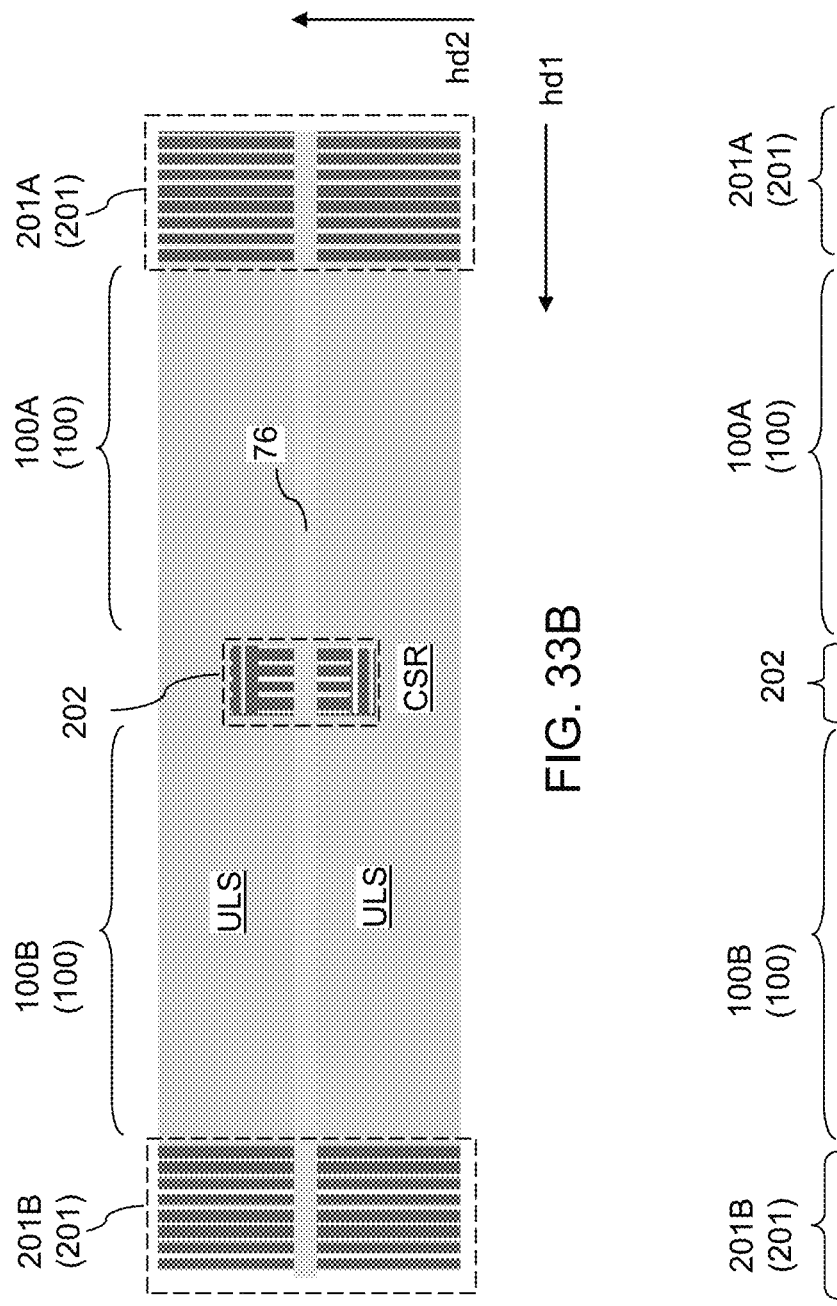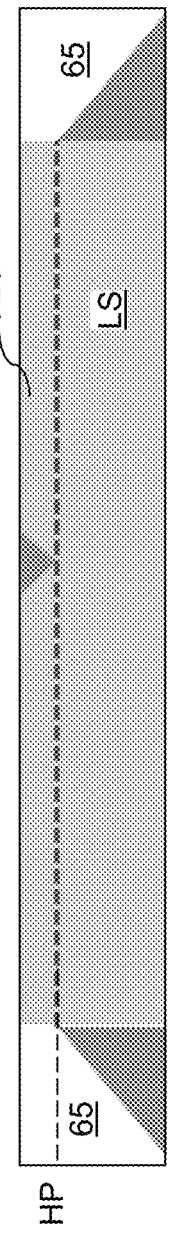

THREE-DIMENSIONAL MEMORY DEVICE WITH SEPARATED CONTACT REGIONS

FIELD

The present disclosure relates generally to the field of semiconductor devices, and particularly to a three-dimensional memory device with separated contact regions that are laterally spaced apart and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure comprising a memory die is provided. The memory die comprises: an alternating stack of insulating layers and electrically conductive layers overlying a substrate and laterally extending through a series of regions that comprises, in a spatial order along a first horizontal direction, a first memory array region, a first contact region, a central memory array region, a second contact region, and a second memory array region; arrays of memory openings located in the first memory array region, the central memory array region, and the second memory array region, wherein the electrically conductive layers continuously extend from the first memory array region to the second memory array region; and arrays of memory opening fill structures located within the arrays of memory openings and comprising a respective vertical stack of memory elements.

According to another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers, wherein the alternating stack laterally extends through a series of regions that comprises, in a spatial order along a first horizontal direction, a first memory array region, a first contact region, a central memory array region, a second contact region, and a second memory array region, wherein the electrically conductive layers continuously extend from the first memory array region to the second memory array region; forming arrays of memory openings located in the first memory array region, the central memory array region, and the second memory array region; and forming arrays of memory opening fill structures within the arrays of memory openings.

According to yet another aspect of the present disclosure, a semiconductor structure comprising a memory die is provided. The memory die comprises: an alternating stack of insulating layers and electrically conductive layers, wherein the alternating stack comprises a lower layer stack including a first subset of the insulating layers and a first subset of the electrically conductive layers located underneath a horizontal plane, a first upper layer stack including a second subset of the insulating layers and a second subset of the electrically conductive layers located above the horizontal plane, and a second upper layer stack including a third subset of the insulating layers and a third subset of the electrically conductive layers located above the horizontal plane and laterally spaced apart from the second layer stack, wherein the lower layer stack laterally extends through a series of regions that comprises, in a spatial order along a first horizontal direction, a first contact region, a first memory array region, an auxiliary contact region, a second memory array region, and a second contact region, and wherein the first upper layer stack laterally extends through the first memory array region and a first portion of the auxiliary contact region, and the second upper layer stack laterally extends through a second portion of the auxiliary contact region and the second memory array region; arrays of memory openings located in the second memory array region and the first memory array region; and arrays of memory opening fill structures located within the arrays of memory openings and comprising a respective vertical stack of memory elements.

According to still another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers, wherein the alternating stack laterally extends through a series of regions that comprises, in a spatial order along a first horizontal direction, a first contact region, a first memory array region, an auxiliary contact region, a second memory array region, and a second contact region; forming arrays of memory openings located in the first memory array region and the second memory array region; and forming arrays of memory opening fill structures within the arrays of memory openings, wherein each of the memory opening fill structures comprises a respective vertical stack of memory elements, wherein the alternating stack comprises a lower layer stack including a first subset of the insulating layers and a first subset of the electrically conductive layers located underneath a horizontal plane, a first upper layer stack including a second subset of the insulating layers and a second subset of the electrically conductive layers located above the horizontal plane, and a second upper layer stack including a third subset of the insulating layers and a third subset of the electrically conductive layers located above the horizontal plane and laterally spaced apart from the second layer stack, wherein the first upper layer stack laterally extends through the first memory array region and a first portion of the auxiliary contact region, and the second upper layer stack laterally extends through a second portion of the auxiliary contact region and the second memory array region.

According to even another aspect of the present disclosure, a semiconductor structure comprising a memory die is provided. The memory die comprises: an alternating stack of insulating layers and electrically conductive layers overlying a substrate and laterally extending through a series of regions that comprises, in a spatial order along a first horizontal direction, a first contact region, a first memory array region, an auxiliary contact region, a second memory array region, and a second contact region; arrays of memory openings located in the first memory array region and the second memory array region; and arrays of memory opening fill structures located within the arrays of memory openings and comprising a respective vertical stack of memory elements, wherein: the alternating stack of insulating layers and electrically conductive layers comprises a lower layer stack including a first subset of the insulating layers and a first subset of the electrically conductive layers located underneath a horizontal plane, and an upper layer stack including a second subset of the insulating layers and a second subset of the electrically conductive layers located above the horizontal plane; the first contact region and the second contact region comprise first contact via structures contacting a respective electrically conductive layer of the first subset of the electrically conductive layers; and the auxiliary staircase region comprises second contact via structures contacting a respective electrically conductive layer of the second subset of the electrically conductive layers.

According to further another aspect of the present disclosure, a method of forming a memory die is provided, which comprises: forming an alternating stack of insulating layers and spacer material layers over a substrate, wherein the spacer material layers are formed as, or are subsequently replaced with, electrically conductive layers, wherein the alternating stack laterally extends through a series of regions that comprises, in a spatial order along a first horizontal direction, a first contact region, a first memory array region, an auxiliary contact region, a second memory array region, and a second contact region; forming arrays of memory openings located in the first memory array region and the second memory array region; forming arrays of memory opening fill structures within the arrays of memory openings, wherein each of the memory opening fill structures comprises a respective vertical stack of memory elements, wherein the alternating stack comprises a lower layer stack including a first subset of the insulating layers and a first subset of the electrically conductive layers located underneath a horizontal plane, and an upper layer stack including a second subset of the insulating layers and a second subset of the electrically conductive layers located above the horizontal plane; forming first contact via structures contacting a respective electrically conductive layer of the first subset of the electrically conductive layers in the first contact region and the second contact region; and forming second contact via structures contacting a respective electrically conductive layer of the second subset of the electrically conductive layers in the auxiliary contact region.

BRIEF DESCRIPTION OF THE DRAWINGS

FIGS. 4A-4D illustrate sequential vertical cross-sectional views of a memory opening during formation of a memory opening fill structure according to the first embodiment of the present disclosure.

FIGS. 10A-10F illustrate sequential vertical cross-sectional views of a region of the alternative configuration of the first exemplary structure during a set of processing steps that may be employed to form laterally-insulated contact via structures according to the first embodiment of the present disclosure.

FIG. 11A is a schematic vertical cross-sectional view of a plane of a memory die of the first exemplary structure.

FIG. 11B is a horizontal cross-sectional view of the plane of the memory die along the horizontal plane B-B' of FIG. 11A.

FIG. 12A is a schematic vertical cross-sectional view of a plane of a logic die according to the first embodiment of the present disclosure.

FIG. 12B is a horizontal cross-sectional view of the plane of the logic die along the horizontal plane B-B' of FIG. 12A.

FIG. 18A is a schematic vertical cross-sectional view of a plane of a memory die of a second exemplary structure according to a second embodiment of the present disclosure.

FIG. 18B is a horizontal cross-sectional view of the plane of the memory die along the horizontal plane B-B' of FIG. 18A.

FIG. 19A is a schematic vertical cross-sectional view of a plane of a logic die according to the second embodiment of the present disclosure.

FIG. 19B is a horizontal cross-sectional view of the plane of the logic die along the horizontal plane B-B' of FIG. 19A.

FIG. 27A is a schematic vertical cross-sectional view of a plane of a memory die of a third exemplary structure according to a third embodiment of the present disclosure.

FIG. 27B is a schematic plan view of the plane of the memory die along the horizontal plane B-B' of FIG. 27A.

FIG. 28A is a schematic vertical cross-sectional view of a plane of a logic die according to the third embodiment of the present disclosure.

FIG. 28B is a schematic plan view of the plane of the logic die along the horizontal plane B-B' of FIG. 28A.

FIG. 30A is a vertical cross-sectional view of a plane of the memory die in the third exemplary structure of FIG. 29 according to the third embodiment of the present disclosure.

FIG. 30B is a plan view of the plane of the memory die of FIG. 30A.

FIGS. 31A-31H schematically illustrates a sequence of processing steps that may be employed to pattern the staircase regions within the memory die of FIGS. 27A-27C according to the third embodiment of the present disclosure.

FIG. 32A is a vertical cross-sectional view of a plane of a memory die in a fourth exemplary structure according to a fourth embodiment of the present disclosure.

FIG. 32B is a plan view of the plane of the memory die of FIG. 32A.

FIG. 33A is a vertical cross-sectional view of a plane of a memory die in a first alternative embodiment of the fourth exemplary structure according to a fourth embodiment of the present disclosure.

FIG. 33B is a plan view of the plane of the memory die of FIG. 33A.

DETAILED DESCRIPTION

Figure 1A:
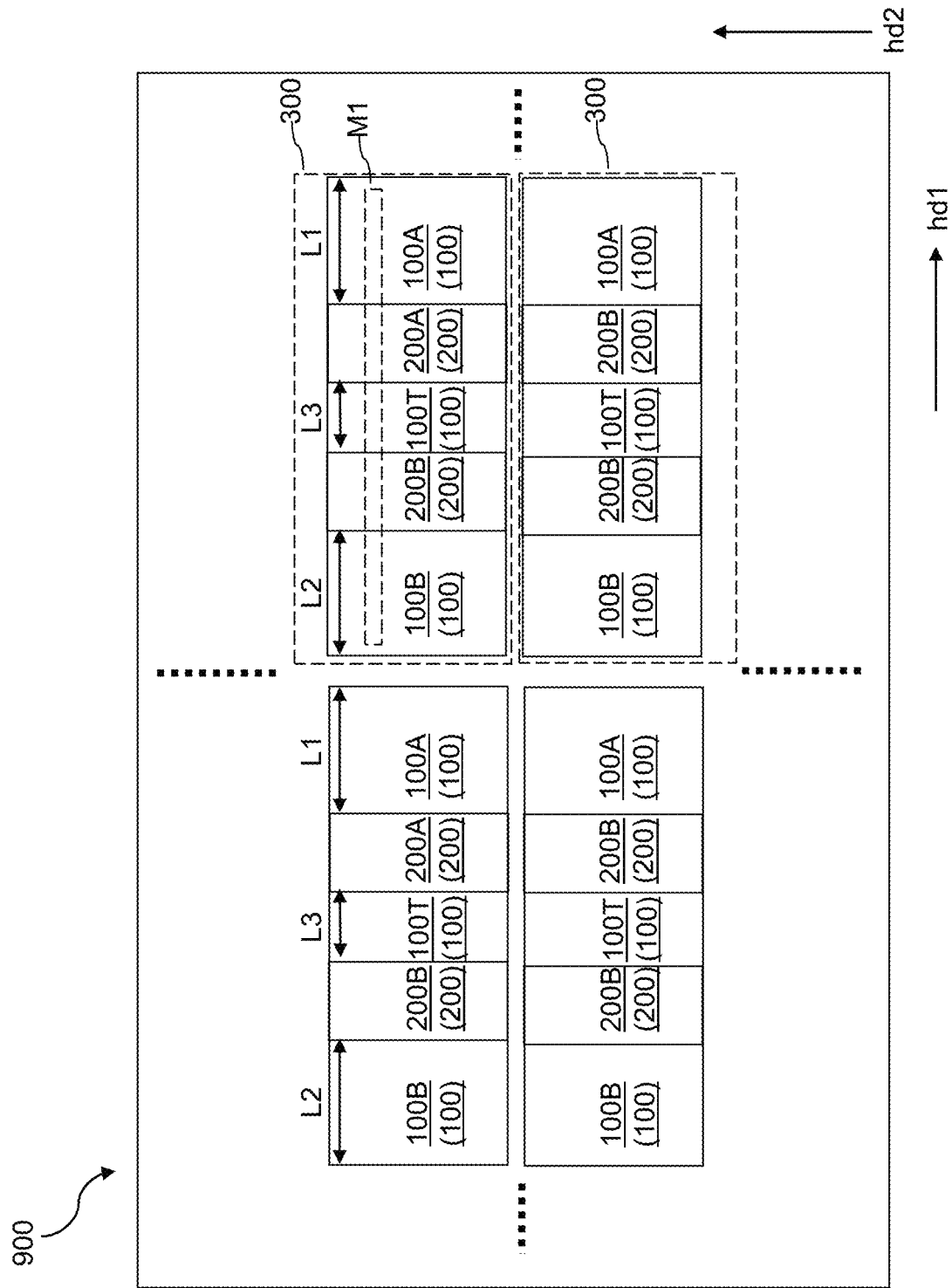
FIG. 1A is a plan view of a first exemplary semiconductor die including multiple planes according to a first embodiment of the present disclosure.

As discussed above, the embodiments of the present disclosure are directed to a three-dimensional memory device with separated contact regions that are laterally spaced apart and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.#

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1D, a first exemplary semiconductor die is illustrated, which can be a memory die 900 including at least one memory plane 300. An embodiment in which the memory die 900 includes multiple (e.g., four) planes 300 is illustrated. Each plane includes a plurality of memory array regions 100 and a plurality of contact regions 200 that are interlaced with each other along a horizontal direction, such as a first horizontal direction hd1 (e.g., word line direction) that is parallel to a sidewall of the memory die 900. According to an aspect of the present disclosure, each plane 300 can include, in a spatial order along the first horizontal direction hd1, a first memory array region 100A, a first contact region 200A, a central memory array region 100T, a second contact region 200B, and a second memory array region 100B. In one embodiment, word lines (which may comprise at least some of the electrically conductive layers (146, 246)) may laterally extend along the first horizontal direction hd1. A second horizontal direction hd2

(which may be the bit line direction) can be perpendicular to the first horizontal direction hd1.

The first memory array region 100A may have a first length L1 along the first horizontal direction hd1, the second memory array region 100B may have a second length L2 along the first horizontal direction hd1, and the central memory array region 100T may have a third length L3 along the first horizontal direction hd1. The ratio of L1 to L2 may be in a range from 0.5 to 2.0, such as from 0.8 to 1.25, such as 1, although lesser and greater ratios may also be employed. The ratio of L1 to L3 and the ratio of L2 to L3 may be in a range from 0.5 to 32, such as from 1 to 16 and/or from 2 to 8, although lesser and greater ratios may also be employed.

Generally, the memory die 900 can comprise an alternating stack of insulating layers (132, 232) and electrically conductive layers (146, 246) overlying a substrate 108 and laterally extending through a series of regions that comprises, in a spatial order along a first horizontal direction hd1, a first memory array region 100A, a first contact region 200A, a central memory array region 100T, a second contact region 200B, and a second memory array region 100B. In one embodiment, the alternating stack may comprise a multi-tier structure including a first-tier structure and a second-tier structure. The first-tier structure can include a first-tier alternating stack of first insulating layers 132 and first electrically conductive layers 146. The second-tier structure can include a second-tier alternating stack of second insulating layers 232 and second electrically conductive layers 246 located over the first-tier structure.

First arrays of memory openings can be located in the first memory array region 100A, central arrays of memory openings can be located in the central memory array region 100T, and second arrays of memory openings can be located in the second memory array region 100B. A memory opening fill structure 58 is located each of the memory openings, and comprises a respective vertical stack of memory elements (e.g., portions of a memory film) and a vertical semiconductor channel.

Figure 1B:
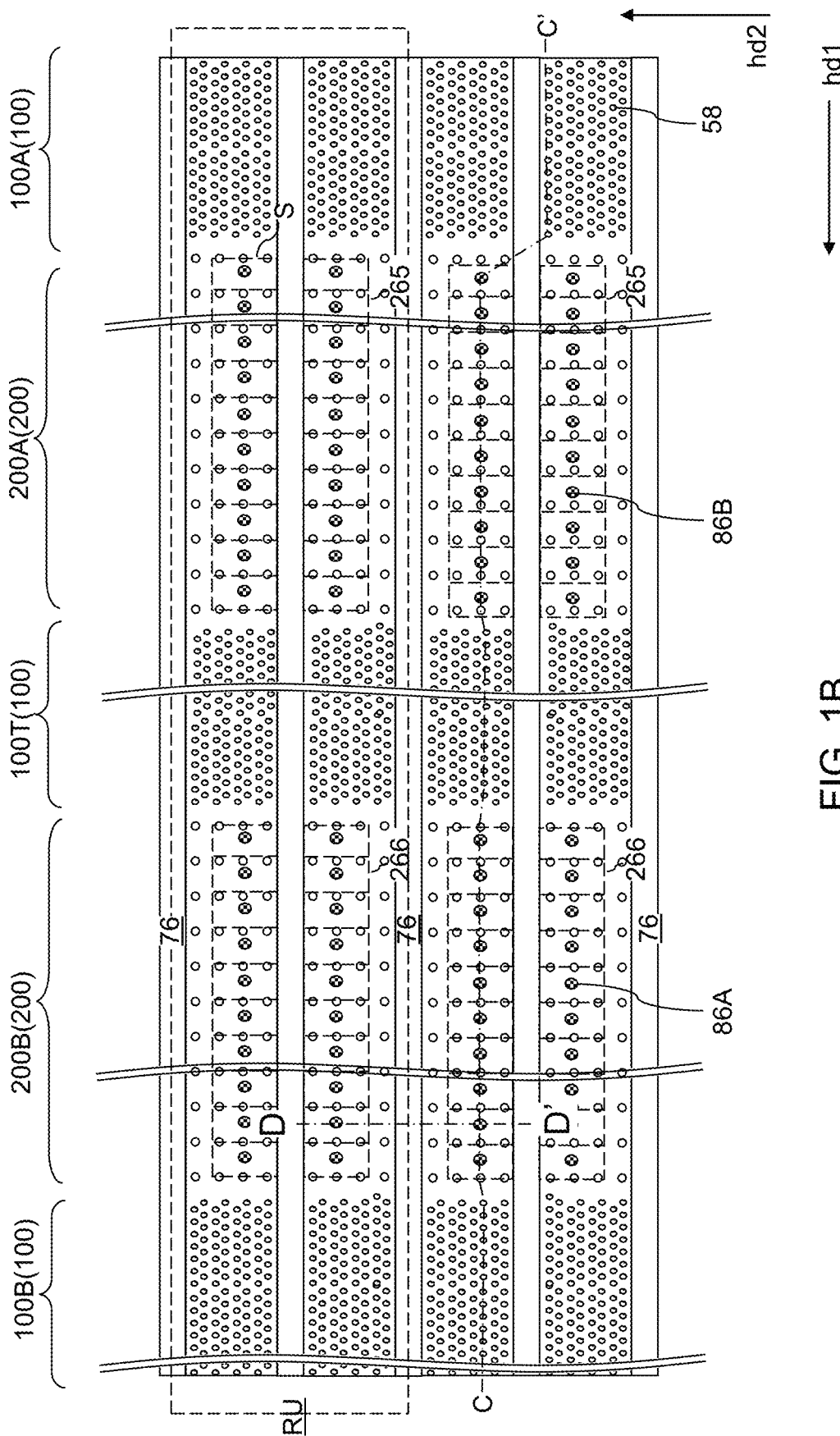
FIG. 1B is a schematic see-through top-down view of region M1 of FIG. 1A.
Figure 1C:
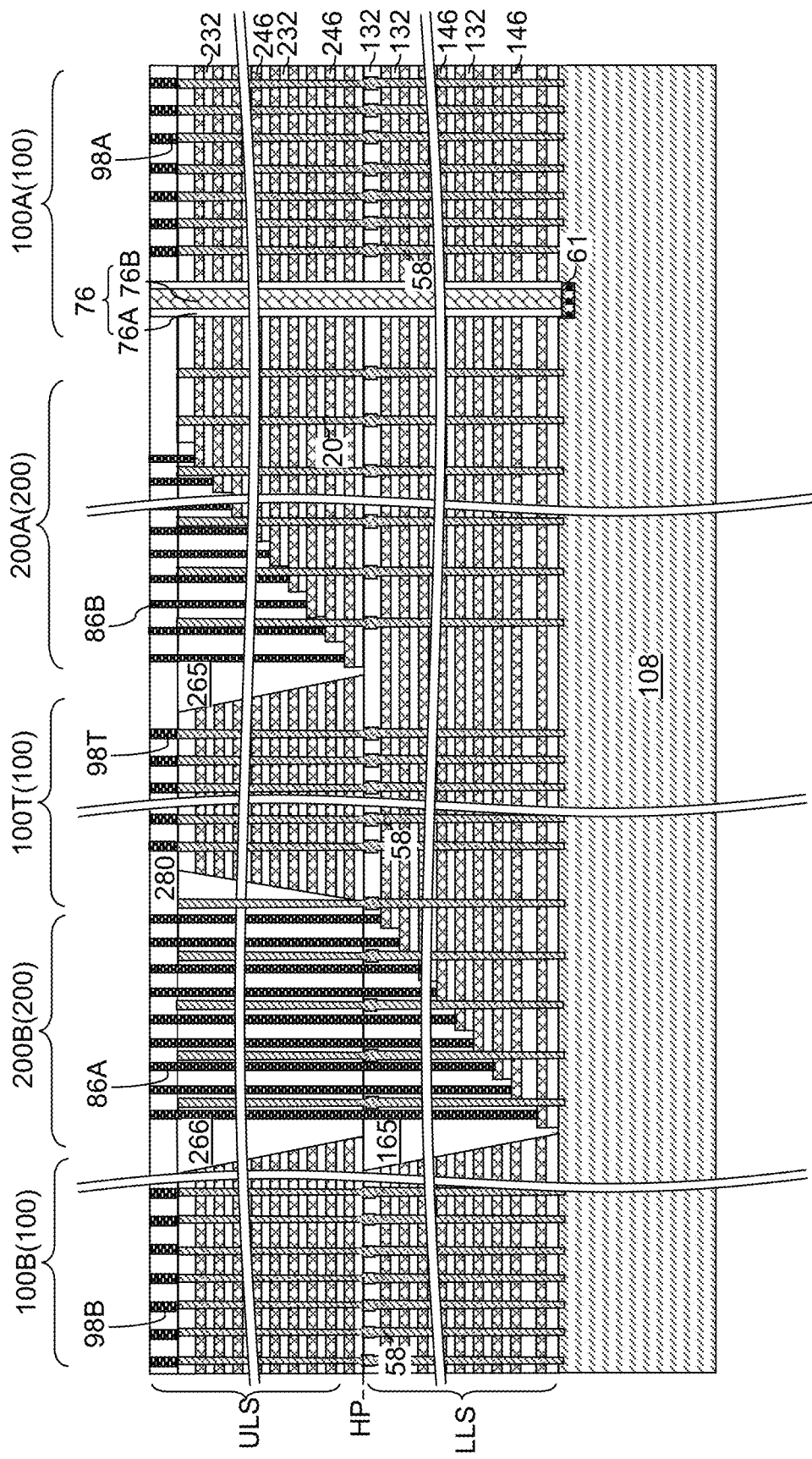
FIG. 1C is a schematic vertical cross-sectional view of a region of the first exemplary semiconductor die along the vertical plane C-C' of FIG. 1B.
Figure 1D:
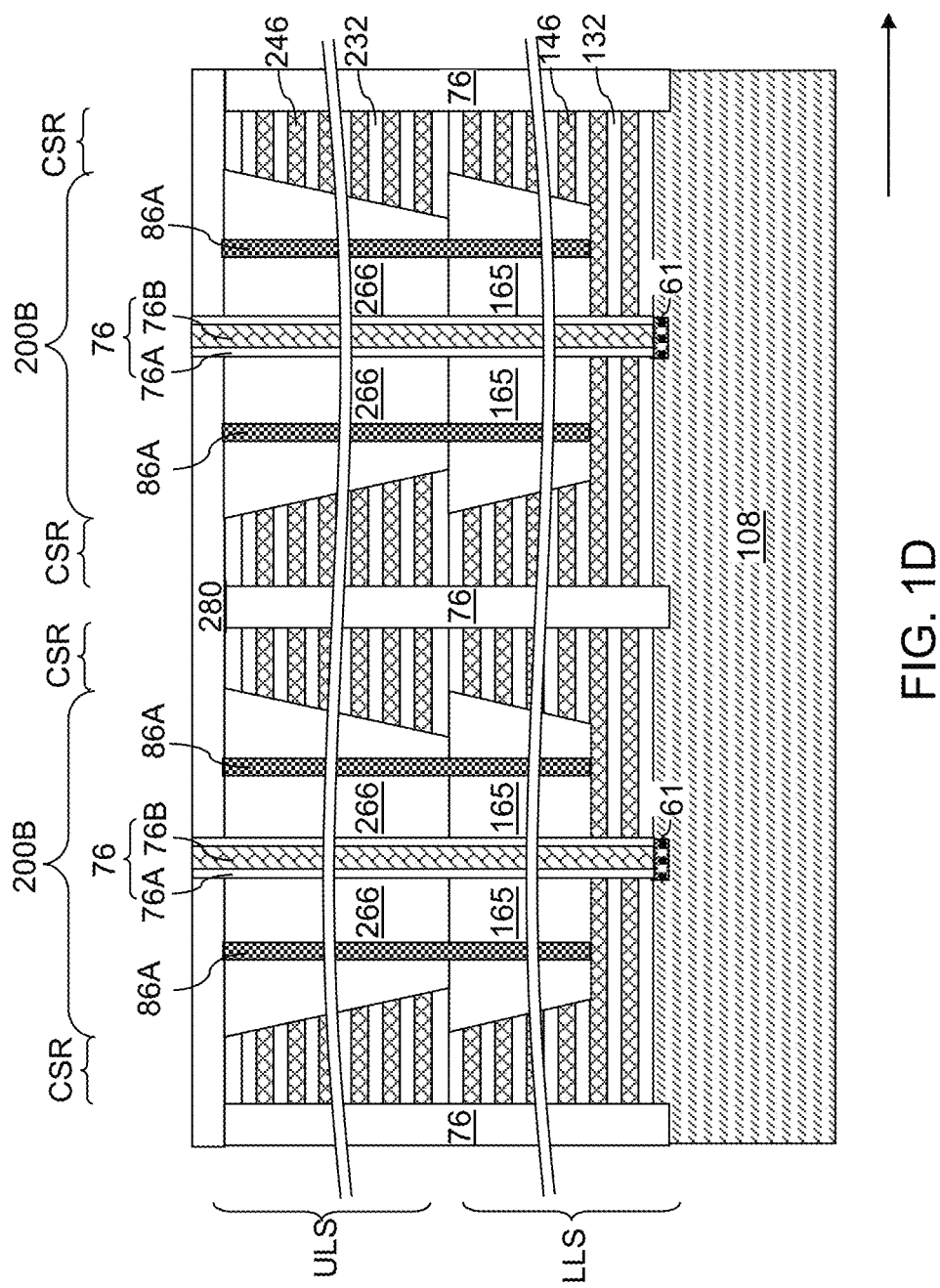
FIG. 1D is a schematic vertical cross-sectional view of a region of the first exemplary semiconductor die along the vertical plane D-D' of FIG. 1B.

According to an aspect of the present disclosure shown in FIGS. 1C and 1D, the alternating stack of insulating layers (132, 232) and electrically conductive layers (146, 246) comprises a lower layer stack LLS including a first subset of the insulating layers 132 and a first subset of the electrically conductive layers 146 of the first tier-structure located underneath a horizontal plane HP, and an upper layer stack ULS including a second subset of the insulating layers 232 and a second subset of the electrically conductive layers 246 of the second tier-structure located above the horizontal plane HP.

In one embodiment, the first contact region 200A comprises stepped surfaces of the upper layer stack ULS, and the second contact region 200B comprises stepped surfaces of the lower layer stack LLS, as shown in FIG. 1C. Locations of the vertical steps S are schematically illustrated in FIG. 1B. The second contact region 200B comprises first contact via structures 86A contacting a respective electrically conductive layer 246 of the first subset of the electrically conductive layers 246, and the first contact region 200A comprises second contact via structures 86B contacting a respective electrically conductive layer 146 of the second subset of the electrically conductive layers 146.

In one embodiment shown in FIG. 1C, the first contact region 200A comprises an upper retro-stepped dielectric material portion, such as a second-tier retro-stepped dielectric material portion 265, contacting, and overlying the stepped surfaces of the upper layer stack ULS. The second contact region 200B comprises a lower retro-stepped dielectric material portion, such as a first-tier retro-stepped dielectric material portion 165, contacting, and overlying, the stepped surfaces of the lower layer stack LLS, and a step-less dielectric material portion 266 overlying the lower retro-stepped dielectric material portion. In one embodiment shown in FIG. 1C, the step-less dielectric material portion 266 comprises a first straight sidewall laterally extending along a second horizontal direction hd2 that is perpendicular to the first horizontal direction hd1 and contacting sidewall segments of a portion of the upper layer stack ULS located within the central memory array region 100T, and a second straight sidewall laterally extending along the second horizontal direction hd2 and contacting sidewall segments of a portion of the upper layer stack ULS located within the second memory array region 100B. The straight sidewalls may be vertical or tapered (i.e., inclined at a non-zero angle) with respect to a normal direction to the top surface of the memory substrate 108.

In one embodiment, each of the memory opening fill structures 58 comprises a respective vertical semiconductor channel. The memory die 900 comprises first bit lines 98A electrically connected to end portions of a respective subset of the vertical semiconductor channels located in the first memory array region 100A, second bit lines 98B electrically connected to end portions of a respective subset of the vertical semiconductor channels located in the second memory array region 100B, and central bit lines 98T electrically connected to end portions of a respective subset of the vertical semiconductor channels located in the central memory array region 100T, as shown in FIG. 1C.

Each alternating stack of insulating layers (132, 232) and electrically conductive layers (146, 246) is located between a neighboring pair of backside trenches which extend along the first horizontal direction hd1. A first backside trench fill structure 76 having a first lengthwise sidewall that laterally extends along the first horizontal direction hd1 and contacting each layer within the alternating stack is located in a first backside trench. A second backside trench fill structure 76 having a second lengthwise sidewall that laterally extends along the first horizontal direction hd1 and contacting each layer within the alternating stack is located in the second backside trench. In this case, the alternating stack can be located entirely between the first backside trench fill structure 76 and the second backside trench fill structure 76.

In one embodiment, the second backside trench fill structure 76 is laterally offset from the first backside trench fill structure 76 along a second horizontal direction (e.g., bit line direction) hd2 that is perpendicular to the first horizontal direction hd1 by a backside trench spacing (i.e., the separation distance between the first backside trench fill structure 76 and the second backside trench fill structure 76). The first contact region 200A and the second contact region 200B have a respective width along the second horizontal direction hd2 that is less than the backside trench spacing, as shown in FIG. 1D. In one embodiment shown in FIG. 1D, a first connection strip region CSR including laterally-extending portions of each layer within the upper layer stack ULS can be located adjacent to the first contact region 200A, and can be laterally offset from the first contact region 200A along the second horizontal direction hd2. A second connection strip region CSR including laterally-extending portions of each layer within the lower layer stack LLS can be located adjacent to the second contact region 200B, and can be laterally offset from the second contact region 200B along the second horizontal direction hd2. The electrically conductive layers (146, 246) (e.g., word lines) continuously extend through the connection strip regions CSR between the memory array regions (i.e., between regions 100A and 100T adjacent to the first connection region 200A, and between regions 100T and 100B adjacent to the second connection region 200B).

In one embodiment, the sidewalls of the first-tier retro-stepped dielectric material portion 165, the second-tier retro-stepped dielectric material portion 265, or the step-less dielectric material portion 266 may have a taper angle with respect to a vertical plane extending along the first horizontal direction hd1. In this case, widths of the laterally-extending portions of layers within the upper layer stack ULS within the first connection strip region along the second horizontal direction hd2 decreases with a vertical distance from the memory substrate 108, and widths of the laterally-extending portions of layers within the lower layer stack LLS within the second connection strip region along the second horizontal direction hd2 decreases with the vertical distance from the memory substrate 108.

Source regions 61 can located within the memory substrate 108, which may include a semiconductor material (such as single crystalline silicon) having a doping of a first conductivity type (which may be p-type or n-type). The source regions 61 can have a doping of a second conductivity type that is the opposite of the first conductivity type. Each backside trench fill structure 76 can comprise a combination of an insulating spacer 74A and a backside contact via structure 76B.

Figure 2:
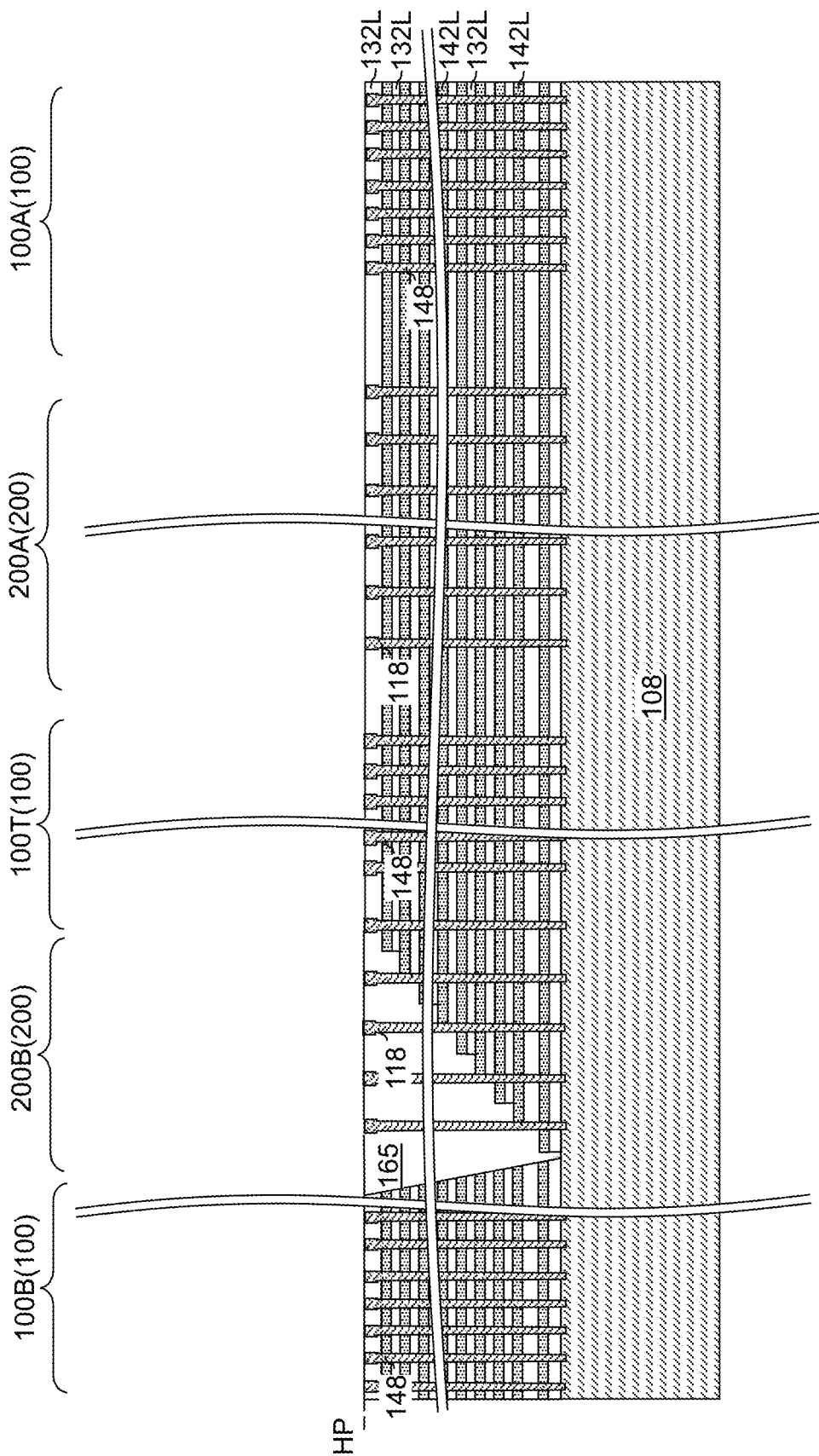
FIG. 2 is a vertical cross-sectional view of a first exemplary structure for forming a semiconductor die after formation of a first-tier structure according to the first embodiment of the present disclosure.

FIGS. 2-8 illustrate a sequence of processing steps that may be employed to form the memory die 900 of FIGS. 1A-1D. Referring to FIG. 2, a first vertically alternating sequence of first continuous insulating layers 132L and first continuous sacrificial material layers 142L can be formed over a memory substrate 108. As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the memory substrate 108, and may have a uniform thickness throughout. Each of the first continuous sacrificial material layers 142L includes is a sacrificial material layer that includes a dielectric material and continuously extends over the entire area of the memory substrate 108, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Generally, a vertically alternating sequence of unit layer stacks over a substrate. Each of the unit layer stacks comprises a first insulating layer (such as a first continuous insulating layer 132L) and a first spacer material layer (such as a first continuous sacrificial material layer 142L). Generally, the first spacer material layers are formed as, or are subsequently replaced with, first electrically conductive layers. While the present disclosure is described employing an embodiment in which the first spacer material layers are formed as first continuous sacrificial material layers 142L that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

First stepped surfaces can be formed within the staircase regions of the contact regions 200 which will be filled with the first-tier retro-stepped dielectric material portions 165. For example, a combination of a sacrificial hard mask layer and a trimming mask layer may be employed to form the first stepped surfaces. In one embodiment, a row of multiple first staircase regions can be formed within each area that corresponds to a combination of the area of a laterally-neighboring pair of first-tier retro-stepped dielectric material portions 165 and an intervening area. In this case, the multiple first staircase regions can be subsequently vertically offset by different depths by subsequently performing area recess etch processes.

A first dielectric fill material (such as undoped silicate glass (i.e., silicon oxide) or a doped silicate glass) can be deposited in each first continuous retro-stepped cavity. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in contact regions 200 located between a respective first memory array region 100A and a respective second memory array region 100B that are laterally spaced apart along the first horizontal direction hd1.

Various first-tier openings may be formed through the first vertically alternating sequence (132L, 142L) and into the memory substrate 108. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the memory substrate 108 by a first anisotropic etch process to form the various first-tier openings concurrently, i.e., during the first isotropic etch process. The various first-tier openings may include first-tier memory openings formed in the memory array regions 100 and first-tier support openings formed in the contact regions 200. Each cluster of first-tier memory openings may be formed as a two-dimensional array of first-tier memory openings. The first-tier support openings are openings that are formed in the contact regions 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132L, 142L) (such as from above the top surface of the topmost first continuous insulating layer 132L). The top surfaces of the sacrificial first-tier opening fill portions (148, 128) may be coplanar with the top surface of the topmost first continuous insulating layer 132L. Each of the sacrificial first-tier opening fill portions (148, 128) may, or may not, include cavities therein. The set of all structures located between the bottommost surface of the first vertically alternating sequence (132L, 142L) and the topmost surface of the first vertically alternating sequence (132L, 142L) or embedded within the first vertically alternating sequence (132L, 142L) constitutes a first-tier structure.

Figure 3:
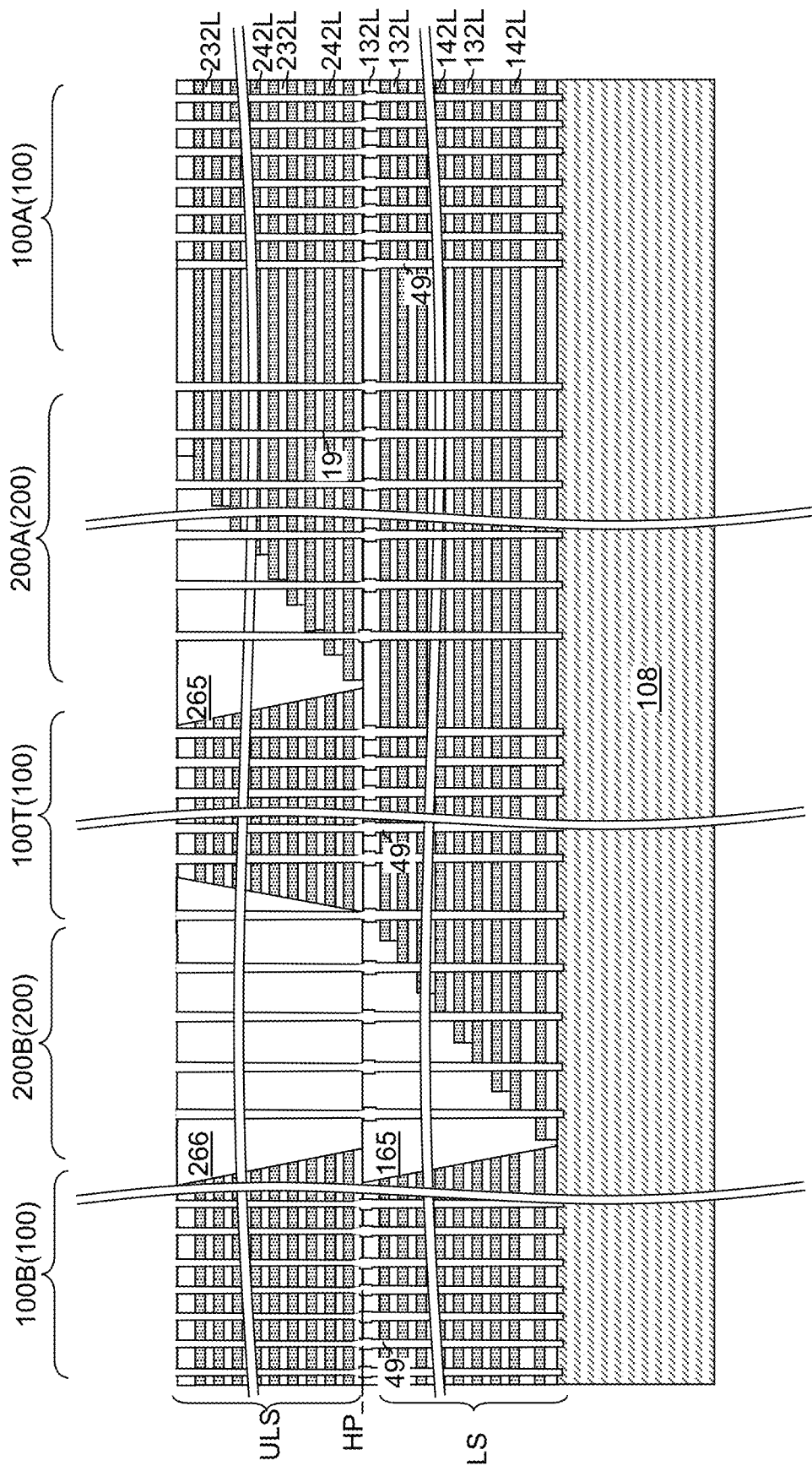
FIG. 3 is a vertical cross-sectional view of the first exemplary structure after formation of a second-tier structure according to the first embodiment of the present disclosure.

Referring to FIG. 3, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first continuous sacrificial material layers 142L.

Generally, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Second stepped surfaces can be formed within the first contact regions 200A. For example, a combination of a sacrificial hard mask layer and a trimming mask layer may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes. A step-less cavity can be formed over the first-tier retro-stepped dielectric material portion 165.

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second continuous retro-stepped cavity constitutes a second-tier retro-stepped dielectric material portion 265. Each remaining portion of the second dielectric fill material that fills a respective step-less cavity constitutes a step-less dielectric material portion 266.

Generally, a second-tier structure is formed, which comprises a second vertically alternating sequence of second continuous insulating layers 232L and second continuous sacrificial material layers 242L and second-tier retro-stepped dielectric material portions 265 overlying second stepped surfaces of the second vertically alternating sequence that are located in the first contact region 200A.

Various second-tier openings may be formed through the second vertically alternating sequence (232L, 242L) and over the sacrificial first-tier opening fill portions (148, 128). A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings concurrently, i.e., during the second isotropic etch process.

The various second-tier openings may include second-tier memory openings formed in the memory array regions 100 and second-tier support openings formed in the contact regions 200. Each second-tier opening may be formed within the area of a respective one of the sacrificial first-tier opening fill portions (148, 128). Thus, a top surface of a sacrificial first-tier opening fill portion (148, 128) can be physically exposed at the bottom of each second-tier opening. Specifically, each second-tier memory openings can be formed directly over a respective sacrificial first-tier memory opening fill portion 148, and each second-tier support opening can be formed directly over a respective sacrificial first-tier support opening fill portion 128. Each cluster of second-tier memory openings may be formed as a two-dimensional array of second-tier memory openings. The second-tier support openings are openings that are formed in the contact regions 200, and are subsequently employed to form support pillar structures. A subset of the second-tier support openings may be formed through a respective horizontal surface of the second stepped surfaces.

The sacrificial first-tier fill material of the sacrificial first-tier opening fill portions (148, 128) may be removed using an etch process that etches the sacrificial first-tier fill material selective to the materials of the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present. Arrays of memory openings 49 can be formed in the first memory array region 100A, the central memory array region 100T, and the second memory array region 100B.

FIGS. 4A-4D illustrate sequential vertical cross-sectional views of a memory opening 49 during formation of a memory opening fill structure 58 according to the first embodiment of the present disclosure.

Referring to FIG. 4A, a memory opening 49 in the first exemplary structure of FIG. 3 is illustrated.

Referring to FIG. 4B, a stack of layers including a blocking dielectric layer 52, a memory material layer 54, a tunneling dielectric layer 56, and a sacrificial cover layer (not shown) may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include a layer stack of an aluminum oxide layer and a silicon oxide layer.

Subsequently, the memory material layer 54 may be formed. In one embodiment, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). The thickness of the memory material layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. The thickness of the tunneling dielectric layer 56 may be in a range from 2 nm to 20 nm, although lesser and greater thicknesses may also be used. The stack of the blocking dielectric layer 52, the memory material layer 54, and the tunneling dielectric layer 56 constitutes a memory film 50 that stores memory bits. The sacrificial cover layer includes a sacrificial material that may be removed selective to the tunneling dielectric layer 56. For example, the sacrificial cover layer may comprise amorphous carbon or amorphous silicon.

An anisotropic etch process may be performed to remove horizontally-extending portions of the sacrificial cover layer. Each remaining contiguous set of cylindrical portions of the blocking dielectric layer 52, the memory material layer 54, and the tunneling dielectric layer constitutes a memory film 50.

A semiconductor channel material layer 60L can be subsequently deposited on the physically exposed surfaces of the memory substrate 108 and on inner sidewalls of the memory films 50. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L). A cavity 49' may be present in an unfilled volume of each memory opening 49.

Referring to FIG. 4C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 4D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the memory material layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a memory material layer 54, and laterally surrounds a vertical semiconductor channel 60. Each adjoining set of a blocking dielectric layer 52, a memory material layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the memory material layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a memory material layer 54 located at levels of the continuous sacrificial material layers (142L, 242L)) and a vertical semiconductor channel 60 that vertically extend through the continuous sacrificial material layers (142L, 242L) adjacent to the respective vertical stack of memory elements.

Figure 5:
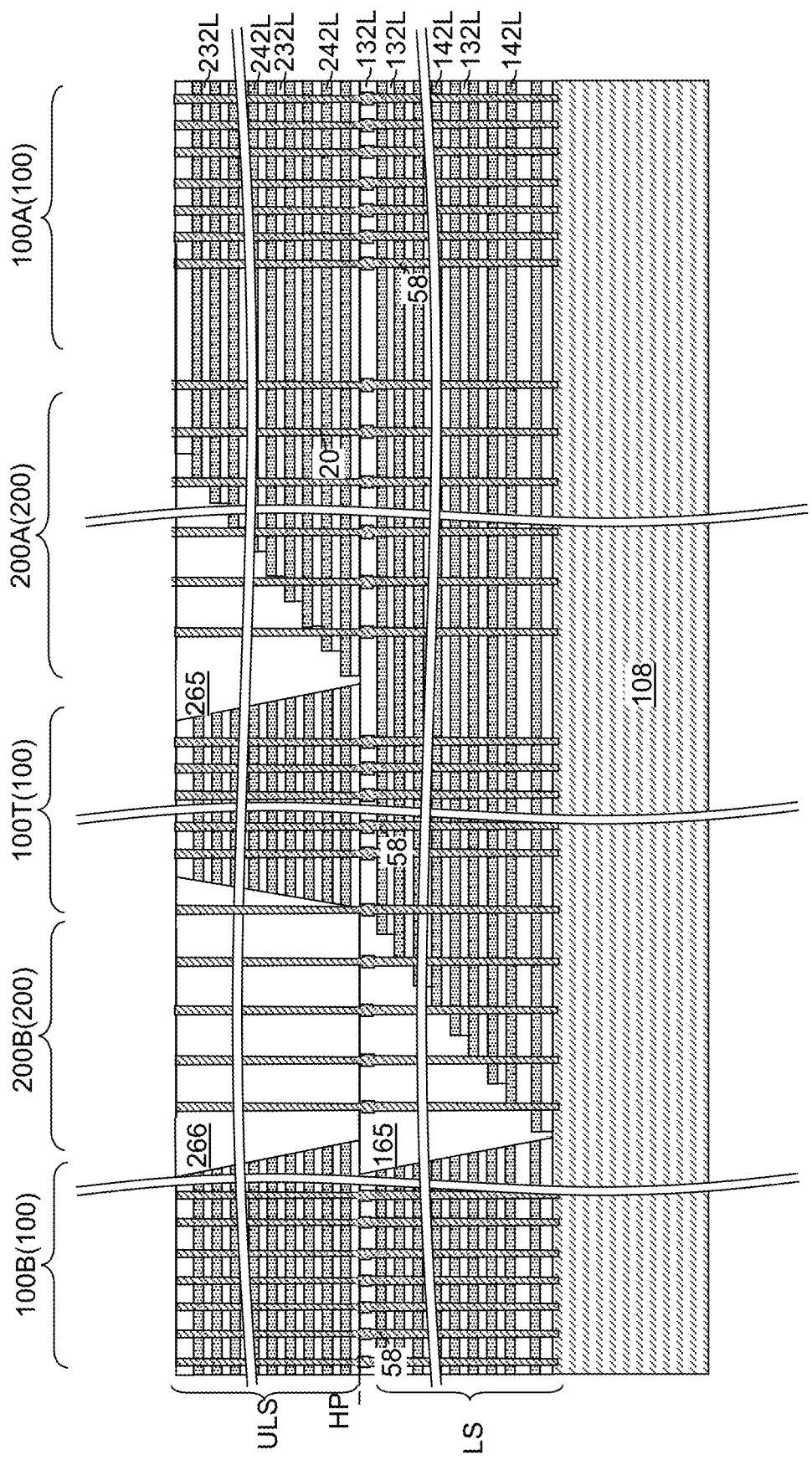
FIG. 5 is a vertical cross-sectional view of the first exemplary structure after formation of memory opening fill structures and support pillar structures according to the first embodiment of the present disclosure.

Referring to FIG. 5, the first exemplary structure is illustrated after formation of the memory opening fill structures 58 and the support pillar structures 20. Generally arrays of memory opening fill structures 58 can be formed within the arrays of memory openings 49.

Figure 6:
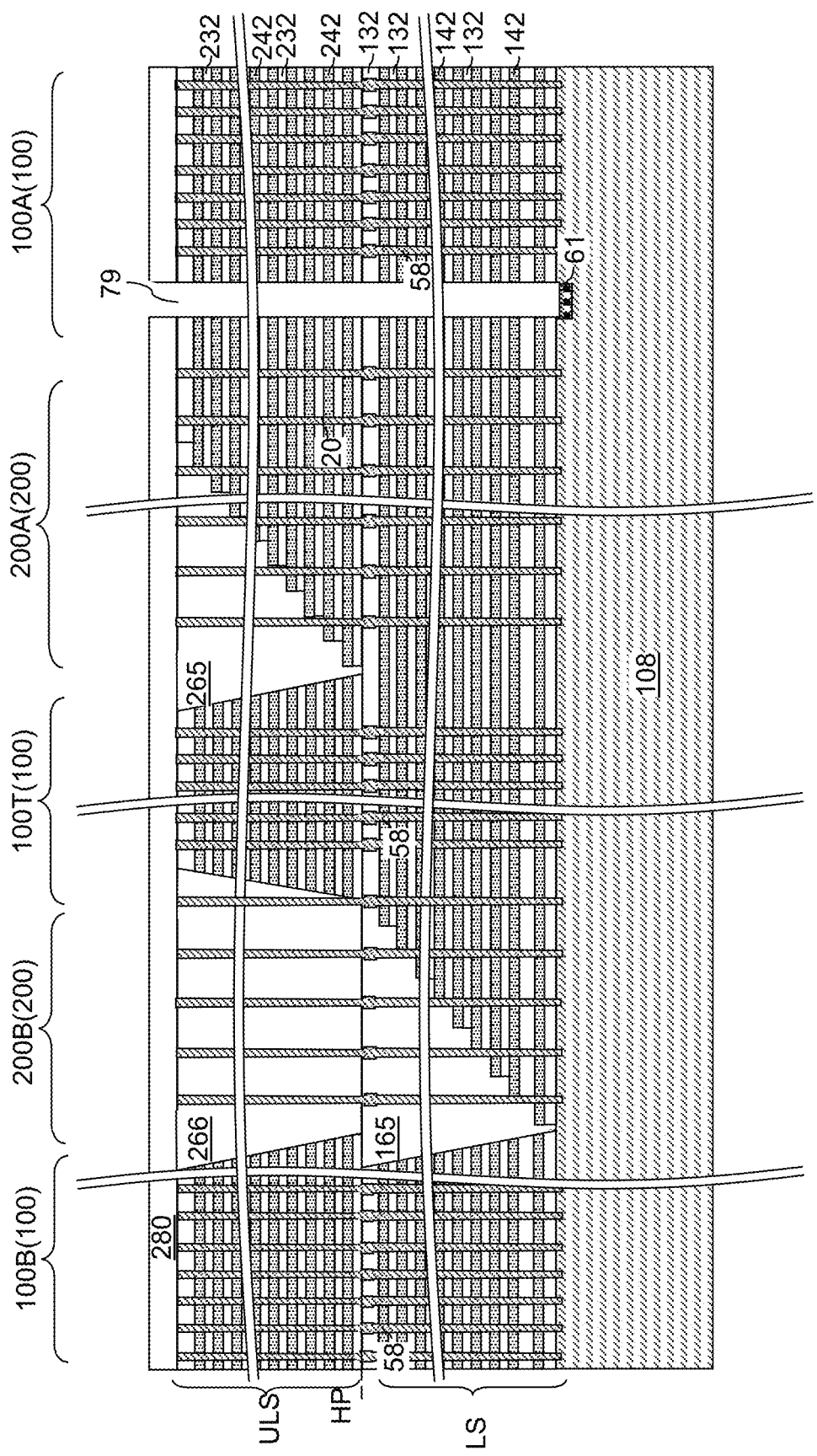
FIG. 6 is a vertical cross-sectional view of the first exemplary structure after formation of backside trenches according to the first embodiment of the present disclosure.

Referring to FIG. 6, a contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the backside trench fill structures 76 illustrated in FIG. 1B-1D. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232L, 242L, 265), and the first-tier structure (132L, 142L, 165), and into the memory substrate 108. The pattern of the backside trenches 79 can be identical to the pattern of the backside trench fill structures 76 illustrated in FIGS. 1B-1D. Portions of the contact-level dielectric layer 280, the second-tier structure (232L, 242L, 265), the first-tier structure (132L, 142L, 165), and the memory substrate 108 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165 or the second-tier retro-stepped dielectric material portions 265. Every even-numbered backside trench 79 can extend through the second vertically alternating sequence (232L, 242L) and the first vertically alternating sequence (132L, 142L) and cut through a respective first-tier retro-stepped dielectric material portion 165 and a respective second-tier retro-stepped dielectric material portion 265.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through am contact regions 200 and a pair of memory array regions 100 that are adjoined to contact regions 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

In one embodiment, the memory substrate 108 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Generally, a plurality of alternating stacks of insulating layers (132, 232) and spacer material layers can be formed over a substrate such as the memory substrate 108. The spacer material layers are formed as, or are subsequently replaced with, electrically conductive layers. Each of the plurality of alternating stacks laterally extends through a series of regions that comprises, in a spatial order along a first horizontal direction hd1, a first memory array region 100A, a first contact region 200A, a central memory array region 100T, a second contact region 200B, and a second memory array region 100B.

Each of the memory opening fill structures 58 comprises a respective vertical stack of memory elements, which may comprise portions of the memory material layers 54 located at levels of the sacrificial material layers (142, 242) that are subsequently replaced with electrically conductive layers. In one embodiment, each alternating stack comprises a lower layer stack LLS including a first subset of the insulating layers 132 and a first subset of the sacrificial material layers 142 located underneath a horizontal plane HP, and an upper layer stack ULS including a second subset of the insulating layers 232 and a second subset of the sacrificial material layers 242 located above the horizontal plane HP.

Figure 7:
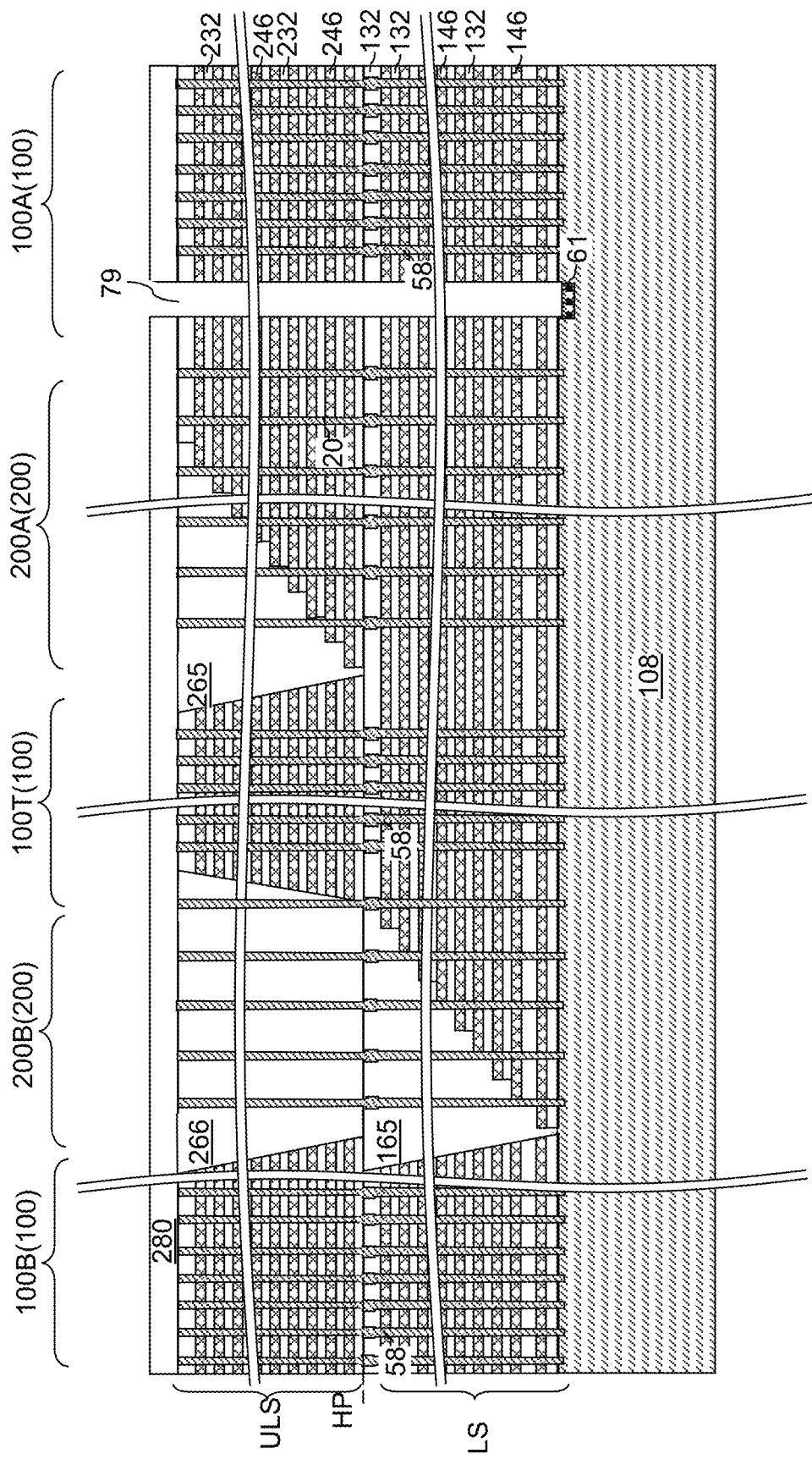
FIG. 7 is a vertical cross-sectional view of the first exemplary structure after replacement of sacrificial material layers with electrically conductive layers according to the first embodiment of the present disclosure.

Referring to FIG. 7, the sacrificial material layers (142, 242) are removed selective to the insulating layers (132, 232), the contact-level dielectric layer 280, and the memory substrate 108. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses are formed in volumes from which the sacrificial material layers (142, 242) are removed. The backside recesses include first backside recesses that are formed in volumes from which the first sacrificial material layers 142 are removed and second backside recesses that are formed in volumes from which the second sacrificial material layers 242 are removed. Each of the backside recesses may be a laterally extending cavity having a lateral dimension that is greater than the vertical extent of the cavity. In other words, the lateral dimension of each of the backside recesses may be greater than the height of the respective backside recess. A plurality of backside recesses may be formed in the volumes from which the material of the sacrificial material layers (142, 242) is removed. Each of the backside recesses may extend substantially parallel to the top surface of the substrate semiconductor layer 9. A backside recess may be vertically bounded by a top surface of an underlying insulating layer (132, 232) and a bottom surface of an overlying insulating layer (132, 232). In one embodiment, each of the backside recesses may have a uniform height throughout.

Generally, the backside recesses can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L.

An optional backside blocking dielectric layer (not shown) may be optionally deposited in the backside recesses and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses, on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses by deposition of the at least one conductive material. A plurality of first electrically conductive layers 146 may be formed in the plurality of first backside recesses, a plurality of second electrically conductive layers 246 may be formed in the plurality of second backside recesses, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Figure 8:
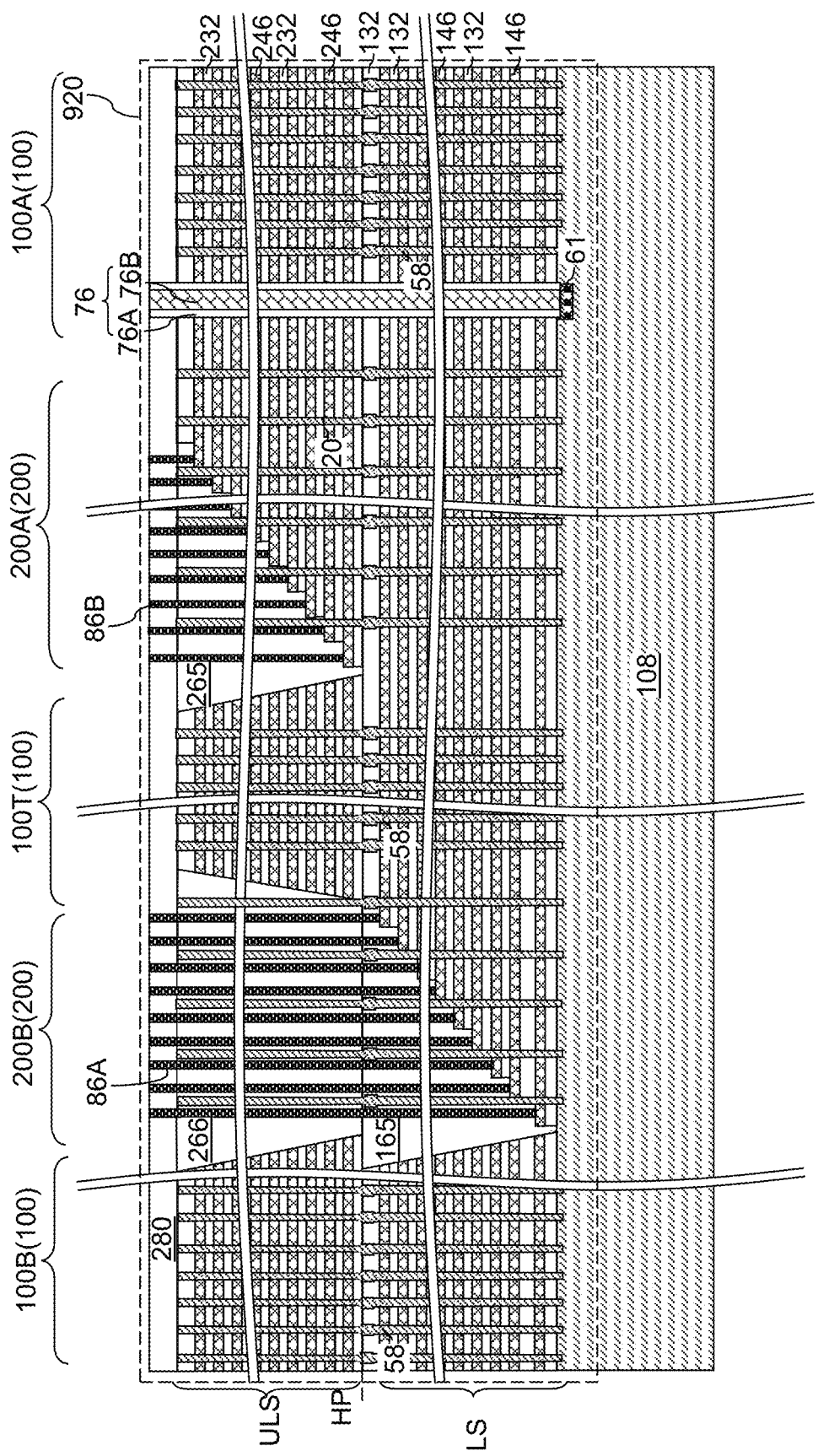
FIG. 8 is a schematic vertical cross-sectional view of the first exemplary structure after formation of layer contact via structures according to the first embodiment of the present disclosure.

Referring to FIG. 8, a trench fill structure 76 can be formed in each backside trench 79. In one embodiment, an insulating liner layer including a dielectric material (such as silicon oxide) can be conformally deposited at a periphery of each backside trench 79, and can be anisotropically etched to form an insulating spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective insulating spacer 76A constitutes a backside contact via structure 76B, which laterally extends along the first horizontal direction hd1. Each contiguous combination of an insulating spacer 76A and a backside contact via structure 76B that fills a backside trench 79 constitutes a trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a trench fill structure 76. In this case, each trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The backside trench fill structures 76 can be arranged in a configuration illustrated in FIGS. 1B-1F. In one embodiment, each first-tier retro-stepped dielectric material portion 165 and each second-tier retro-stepped dielectric material portion 265 can be located between a neighboring pair of the backside trench fill structures 76.

Various contact via structures can be formed through the contact-level dielectric layer 280 and optionally through underlying material portions onto a respective underlying conductive structure. The various contact via structures (88, 86A, 86B) can include layer contact via structures (86A, 86B) that are formed in the contact regions 200. The layer contact via structures (86A, 86B) can include first contact via structures 86A that contact a respective first electrically conductive layer 146 and second contact via structures 86B that contact a respective second electrically conductive layer 246.

For example, a photoresist layer (not shown) can be applied over the second-tier alternating stacks (232, 246), and can be lithographically patterned to form openings within areas of the memory opening fill structures 58, and the second-tier retro-stepped dielectric material portion 265 which is located over the horizontal surfaces of the second stepped surfaces of the second-tier alternating stacks (232, 246). An anisotropic etch process can be performed to transfer the pattern of the openings in the photoresist layer through the contact-level dielectric layer 280, the first-tier retro-stepped dielectric material portions 165, and the second-tier retro-stepped dielectric material portions 265.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A. Each remaining portion of the at least one conductive material filling the second contact via cavities comprise a second contact via structure 86B.

The first contact via structures 86A can be formed through a respective second-tier retro-stepped dielectric material portion 265 and through a respective first-tier retro-stepped dielectric material portion 165 and directly on a first subset of the electrically conductive layers, i.e., the first electrically conductive layers 146. The second contact via structures 86B can be formed through a respective second-tier retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165. The first contact via structures 86A and the second contact via structures 86B contact a respective one of the electrically conductive layers (146, 246), and are collectively referred to as layer contact via structures.

Drain contact via cavities (not shown) can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process. Drain contact via structures (not illustrated) can be formed in the drain contact via cavities.

Bit lines 98A, 98B and 98T are then formed in a manner that provides electrical contact with the drain contact via structures, as shown in FIG. 1C. The bit lines may directly contact top surfaces of a respective subset of the drain contact via structures, or intermediate contact via structures (not shown) may be employed between the drain contact via structures and the bit lines. Generally, memory-side semiconductor devices 920 can be formed on the memory substrate 108. The memory-side semiconductor devices 920 can include a three-dimensional memory array.

While FIGS. 1C and 8 illustrate an embodiment in which the horizontal plane HP is located at a top surface of the first-tier structure, embodiments are expressly contemplated herein in which the horizontal plane HP is located above, or below, the horizontal interface between the first-tier structure and the second-tier structure. Generally, the first contact via structures 86A contact a respective electrically conductive layer 146 of the first subset of the electrically conductive layer 146 that is located above the horizontal plane HP in the second contact region 200B. The second contact via structures 86B contact a respective electrically conductive layer 246 of the second subset of the electrically conductive layers 246 that is located below the horizontal plane HP in the first contact region 200A.

Additional metal interconnect structures (not shown) embedded in additional dielectric material layers (not shown) can be formed to provide a memory die 900 comprising the memory substrate 108, the alternating stacks {(132, 146), (232, 246)}, and the memory opening fill structures 58. Each of the memory opening fill structures 58 comprises a respective vertical semiconductor channel 60. In one embodiment, the memory die 900 comprises first bit lines 98A electrically connected to end portions of a respective subset of the vertical semiconductor channels 60 located in the first memory array region 100A and second bit lines 98T electrically connected to end portions of a respective subset of the vertical semiconductor channels 60 located in the second memory array region 100B.

Figure 9:
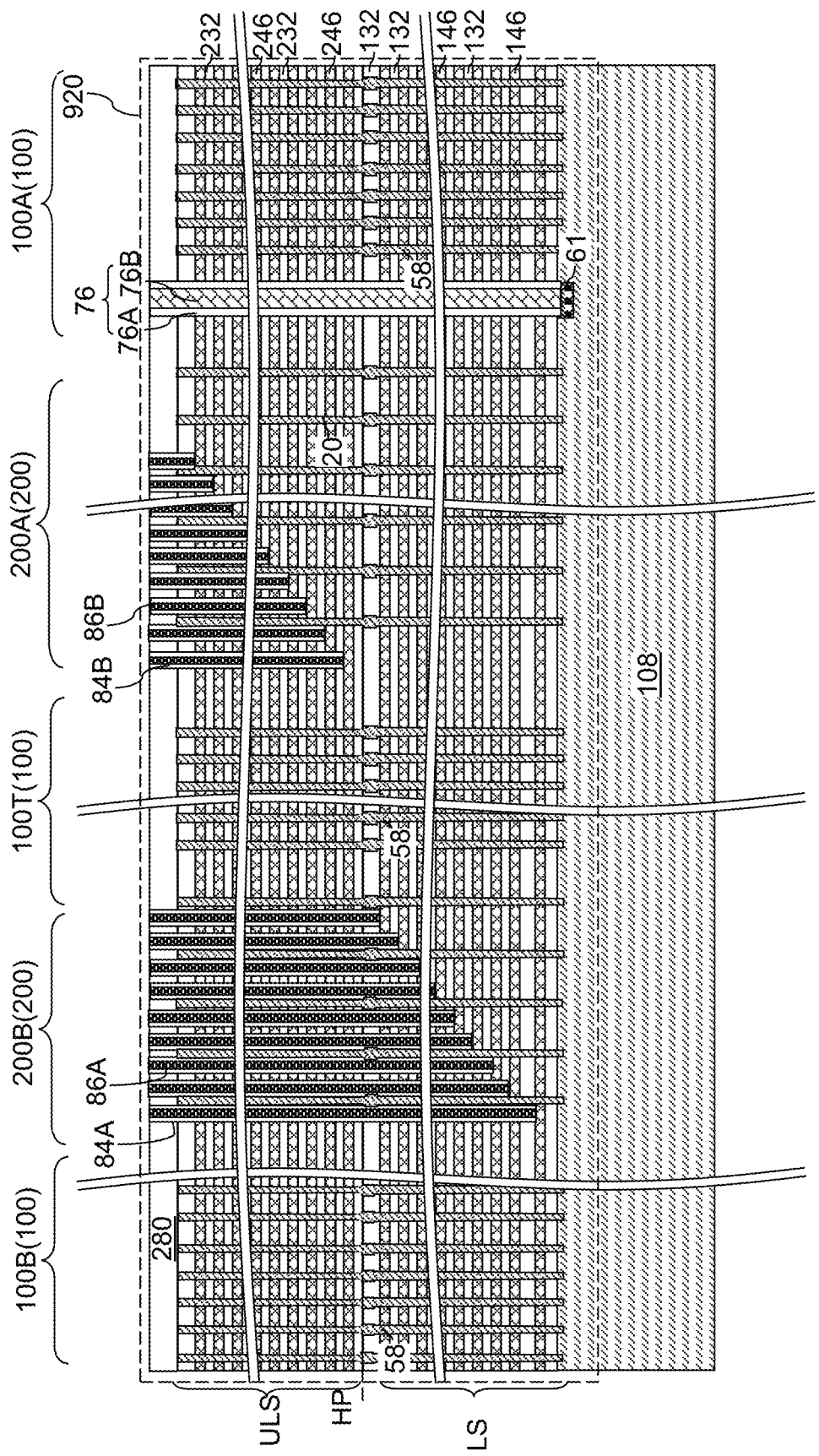
FIG. 9 is a schematic vertical cross-sectional view of an alternative configuration of the first exemplary structure after formation of layer contact via structures according to the first embodiment of the present disclosure.

Referring to FIG. 9, an alternative configuration of the first exemplary structure can be derived from the first exemplary structure illustrated in FIG. 8 by forming laterally-insulated contact via structures {(84A, 86A), (84B, 86B)} in lieu of stepped surfaces, retro-stepped dielectric material portions (165, 265), and layer contact via structures (86A, 86B) in the first exemplary structure of FIG. 8. In one embodiment, the laterally-insulated contact via structures {(84A, 86A), (84B, 86B)} can be formed by forming sacrificial via fill structures in the first contact region 200A and in the second contact region 200B after formation of the contact-level dielectric layer 280 and prior to formation of the backside trenches 79, and by replacing the sacrificial via fill structures with the laterally-insulated contact via structures {(84A, 86A), (84B, 86B)} after formation of the electrically conductive layers (146, 246) and the backside trench fill structures 76. In this case, voids are formed by removing the sacrificial via fill structures after formation of the backside trench fill structures 76, and each void can be filled with a respective laterally-insulated contact via structure {(84A, 86A), (84B, 86B)}. Each laterally-insulated contact via structure {(84A, 86A), (84B, 86B)} includes a tubular insulating spacer (84A, 84B) and a contact via structure (86A, 86B) that is laterally surrounded by the tubular insulating spacer (84A, 84B). For example, a first laterally-insulated contact via structure (84A, 86A) contacting a first electrically conductive layer 146 includes a first tubular insulating spacer 84A and a first contact via structure 86A, and a second laterally-insulated contact via structure (84B, 86B) contacting a second electrically conductive layer 246 includes a second tubular insulating spacer 84B and a second contact via structure 86B.

In one embodiment shown in FIG. 9, each of the first contact via structures 86A and the second contact via structures 86B is laterally surrounded by a respective insulating spacer (84A or 84B) having a tubular configuration, and each of the insulating spacers (84A, 84B) comprises an outer sidewall that contacts each layer within an alternating stack {(132, 146), (232, 246)} located above a horizontal plane including a bottom surface of a respective insulating spacer (84A, 84B).

FIGS. 10A-10F illustrate sequential vertical cross-sectional views of a region of the alternative configuration of the first exemplary structure during a set of processing steps that may be employed to form laterally-insulated contact via structures according to the first embodiment of the present disclosure.

Referring to FIG. 10A, the first and second contact regions (200A, 200B) in the alternative embodiment of the first exemplary structure is illustrated. A hard mask layer 260 can be formed over the first exemplary structure after formation of the contact-level dielectric layer 280, and can be lithographically patterned to form an array of discrete openings therethrough.

Referring to FIG. 10B, a first photoresist layer 261 can be applied over the hard mask layer 260, and can be lithographically patterned to cover the first contact region 200A and not to cover the second contact region 200B. A first anisotropic etch process can be performed to form contact via cavities 85 underneath the openings in the hard mask layer 260 in the second contact region 200B.

Referring to FIG. 10C, the first anisotropic etch process can be extended to etch through the topmost first insulating layer 132 (e.g., a joint level insulating layer) in the first-tier alternating stack. The first photoresist layer 161 can be subsequently removed, for example, by ashing.

Referring to FIG. 10D, a second photoresist layer 262 can be applied over the first exemplary structure, and can be lithographically patterned to cover a subset of the openings in the hard mask layer 260 without covering another subset of the openings in the hard mask layer 260 within each of the first contact regions 200A and the second contact regions 200B. A second anisotropic etch process can be performed to form additional contact via cavities 85 in the first contact region 200A or to vertically extend pre-existing contact via cavities 85 in the second contact region 200B. The depth of the second anisotropic etch process may be about one half of the depth of the first anisotropic etch process. The second photoresist layer 262 can be removed, for example, by ashing.

Referring to FIG. 10E, a third photoresist layer 263 can be applied over the first exemplary structure. For each set of contact via cavities 85 having a same depth, a subset of the respective set of contact via cavities 85 is covered with the third photoresist layer 263 and another subset of the respective set of contact via cavities 85 is not covered with the third photoresist layer 262. For the set of openings in the hard mask layer 260 without any contact via cavity underneath, a subset of the set of openings in the hard mask layer 260 is covered with the third photoresist layer 263 and another subset of the set of openings in the hard mask layer 260 is not covered with the third photoresist layer 263. A third anisotropic etch process can be performed to extend the depth of the pre-existing contact via cavities 85 that are not covered by the third photoresist layer 263, and to form additional contact via cavities 85. The third photoresist layer 263 can be subsequently removed.

Referring to FIG. 10F, additional photoresist layers 264 and additional anisotropic etch processes can be performed to differentiate the depth of the contact via cavities 85 so that each of the continuous sacrificial material layers (142L, 242L) is physically exposed to a respective one of the contact via cavities 85. Subsequently, sacrificial via fill structures can be formed in the contact via cavities 85 by filling the contact via cavities 85 with a sacrificial via fill material such as amorphous silicon. The sacrificial via fill structures are replaced with the laterally-insulated contact via structure {(84A, 86A), (84B, 86B)} after formation of the electrically conductive layers (146, 246) and the backside trench fill structures 76.

Referring to FIGS. 11A and 11B, a memory plane 300 of a memory die 900 of the first exemplary structure is illustrated. Memory-side metal interconnect structures 980 embedded within memory-side dielectric material layers 960 are formed above the memory-side semiconductor devices 920 illustrated in FIG. 8 or FIG. 9. The memory plane 300 includes, from one side to another, a first memory array region 100A, a first contact region 200A, a central memory array region 100T, a second contact region 200A, and a second memory array region 100B. Memory-side bonding pads 988 can be formed in the topmost memory-side dielectric material layer of the memory-side dielectric material layers 960.

Referring to FIGS. 12A and 12B, a logic die 700 according to the first embodiment of the present disclosure is illustrated. The logic die 700 may include as many number of logic planes 302 as the total number of memory planes 300 in the memory die 900. The area of each logic plane 302 in the logic die 700 may be the same as the area of a corresponding memory plane 300 in the memory die 900. While FIGS. 12A and 12B illustrate a single logic plane 302 in the logic die 700, it is understood that the logic die 700 may have the same number of logic planes 302 as the number of memory planes 300 in memory die 900 so that each logic plane 302 of the logic die 700 matches the area of a corresponding memory plane 302 in the memory die 900 upon subsequently bonding the logic die 700 to the memory die 900.

Generally, the logic die 700 is configured to provide control circuits for controlling operation of the three-dimensional memory array in the memory-side semiconductor devices 920 in the memory die 900 of FIG. 8 or FIG. 9. The logic die 700 comprises logic-side semiconductor devices 720, which may include word line drivers 722, bit line drivers (721A, 721B), and peripheral circuits 724. The word line drivers 722 can be configured to drive the word lines in the three-dimensional memory array. The word lines in the three-dimensional array comprise at least a portion of the electrically conductive layers (146, 246). In this case, the word line drivers 722 are configured to drive the electrically conductive layers (146, 246) of the memory die 900.

The bit line drivers (721A, 721B) may comprise first bit line drivers 721A located in a first bit line driver region and second bit line drivers 721B located in a second bit line driver region. The first bit line drivers 721A can be configured to drive the first bit lines 98A located in the first memory array region 100A of the memory die 900, and can be optionally configured to drive a subset of the central bit lines 98T located in the central memory array region 100T. The second bit line drivers 721B can be configured to drive the second bit lines 98B located in the second memory array region 100B of the memory die 900, and can be optionally configured to drive a subset of the central bit lines 98T located in the central memory array region 100T.

The peripheral circuits 724 may comprise a source power supply circuit configured to provide electrical bias to the source regions 61 in the memory die 900, input/output (I/O) control circuit configured to control the input signals and output signals into the logic die 700, data latches, and other peripheral circuitry configured to control operation of the logic die 700.

The logic die 700 comprises logic-side metal interconnect structures 780 embedded in logic-side dielectric material layers 760. Logic-side bonding pads 788 can be embedded in the topmost logic-side dielectric material layer of the logic-side dielectric material layers 760. The logic-side metal interconnect structures 780 can comprise word-line-connection logic-side metal interconnect structures 782, which provide electrical connection between the word line drivers 722 and a subset of the logic-side bonding pads 788. According to an embodiment of the present disclosure, the area of the word-line-connection logic-side metal interconnect structures 782 can be located entirely within the area of the word line drivers 722.

Figure 13:
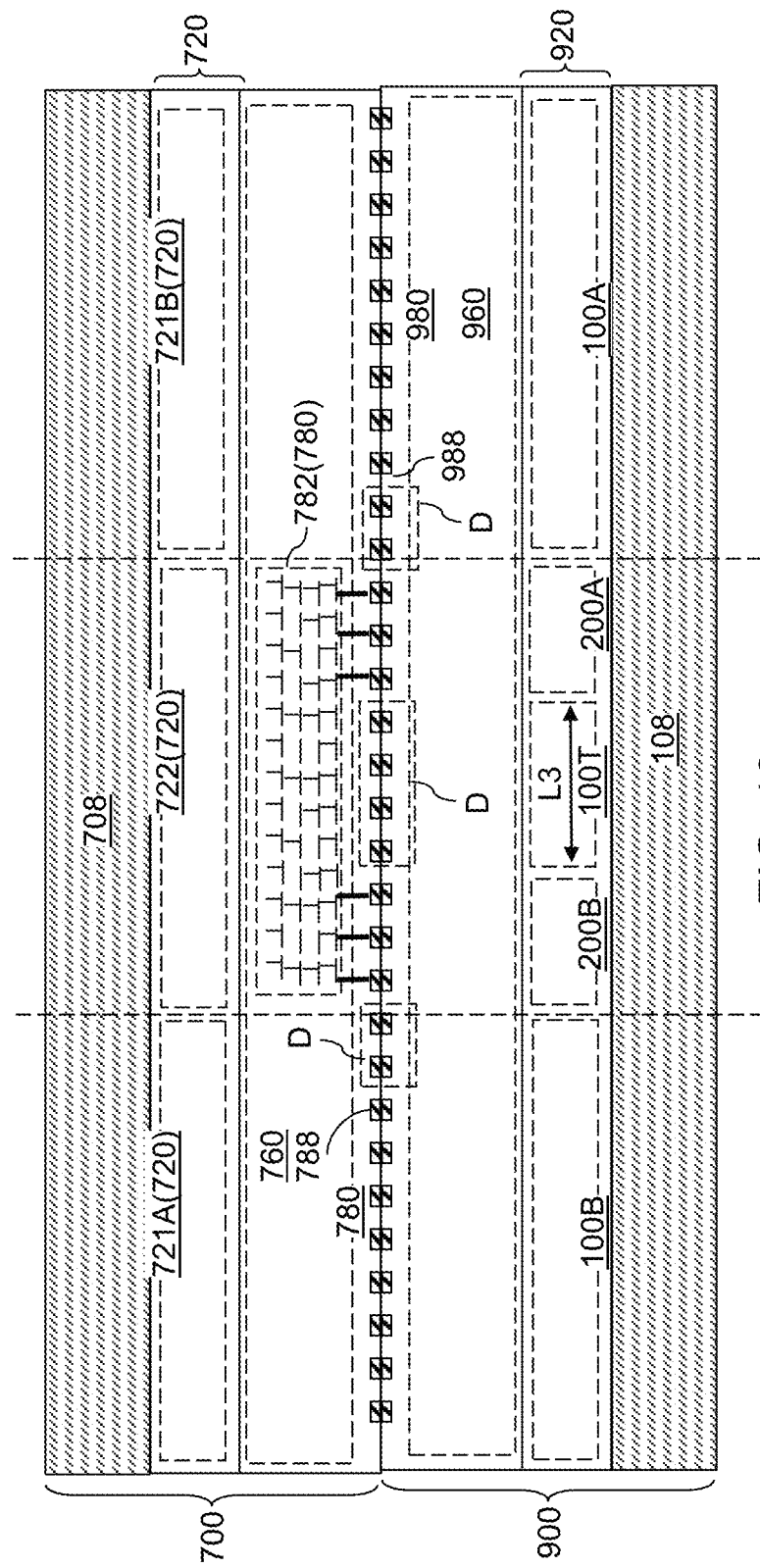
FIG. 13 is a vertical cross-sectional view of the first exemplary structure after bonding the logic die to the memory die according to the first embodiment of the present disclosure.

Referring to FIG. 13, the logic die 700 can be bonded to the memory die 900 by metal-to-metal bonding between the memory-side bonding pads 988 and the logic-side bonding pads 788. For example, copper-to-copper bonding may be employed to bond mating pairs of the memory-side bonding pads 988 and the logic-side bonding pads 788. Optionally, a surface of the memory-side dielectric material layers 960 may be bonded to a surface of the logic-side dielectric material layers 760 by dielectric-to-dielectric bonding. In some embodiments, the memory-side bonding pads 988 and the logic-side bonding pads 788 may include dummy metal bonding pads D that are not electrically connected to the memory-side semiconductor devices 920 or the logic-side semiconductor devices 720.

The word line drivers 722 are electrically connected to nodes of the electrically conductive layers (146, 246) through logic-side metal interconnect structures 780 located in the logic die 700 and through memory-side metal interconnect structures 980 located in the memory die 900. A first boundary between the central memory array region 100T and the first contact region 200A and a second boundary between the central memory array region 100T and the second contact region 200B are laterally spaced apart along the first horizontal direction hd1 by the third length L3, which is the length of the central memory array region 100T along the first horizontal direction hd1.

In one embodiment, each of the memory opening fill structures 58 in the memory die 900 comprises a respective vertical semiconductor channel 60. The memory die 900 comprises first bit lines 98A electrically connected to end portions of a respective subset of the vertical semiconductor channels 60 located in the first memory array region 100A and second bit lines 98B electrically connected to end portions of a respective subset of the vertical semiconductor channels 60 located in the second memory array region 100B. The logic die 700 comprises first bit line drivers 721A located in a first bit line driver region and electrically connected to the first bit lines 98A and second bit line drivers 721B located in a second bit line driver region and electrically connected to the second bit lines 98B.

In one embodiment, the entire area of the first bit line driver region is located entirely within an area of the first memory array region 100A, and the entire area of the second bit line driver region is located within an area of the second memory array region 100B in a plan view, which is a view along a vertical direction that is perpendicular to the bonding interface.

In one embodiment, a portion of the boundary (i.e., the periphery) of the word line drivers 722 may coincide with a boundary between the first contact region 200A and the first memory array region 100A and with a boundary between the second contact region 200B and the second memory array region 100B in the plan view.

Figure 14:
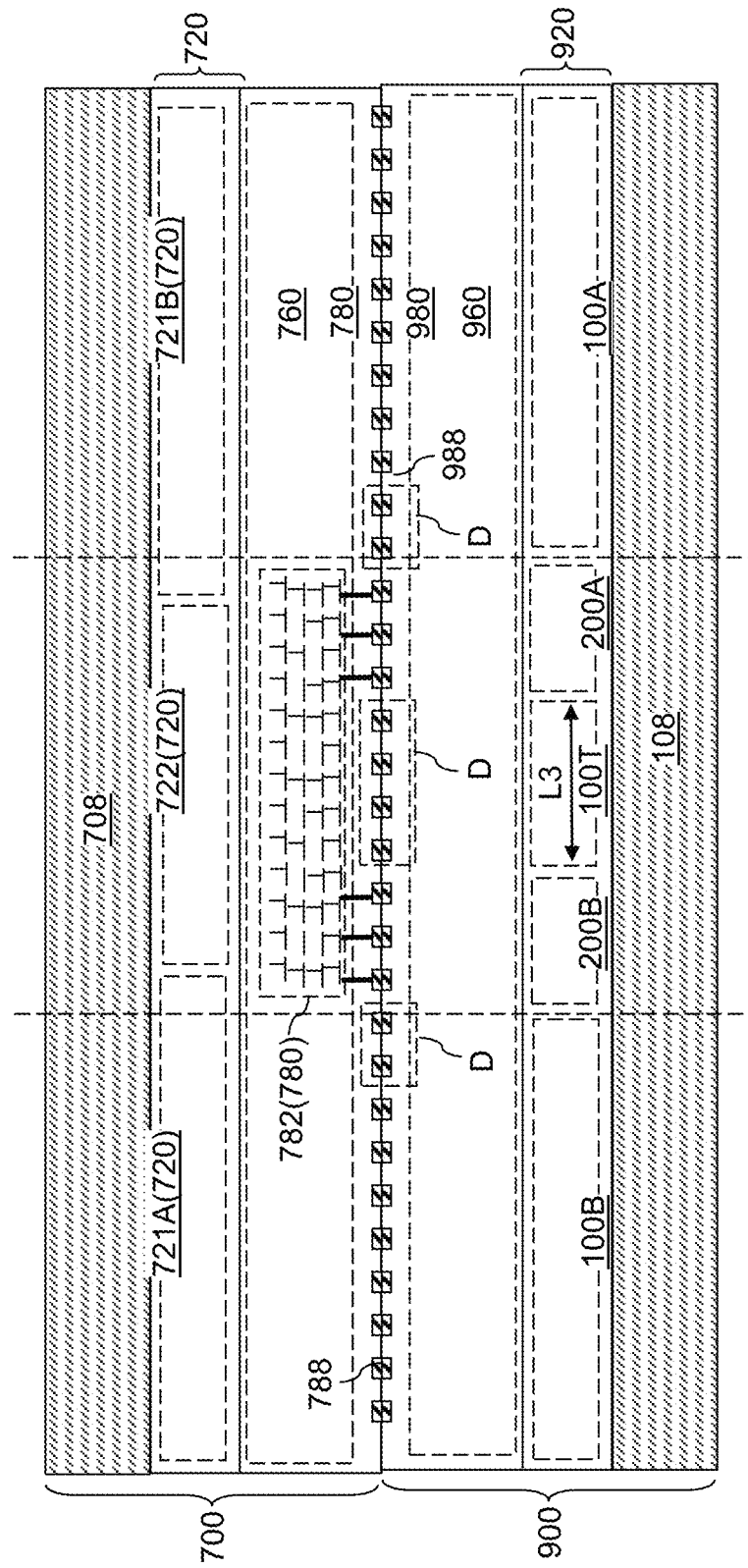
FIG. 14 is a vertical cross-sectional view of a first alternative configuration of the first exemplary structure after bonding the logic die to the memory die according to the first embodiment of the present disclosure.

Referring to FIG. 14, a first alternative configuration of the first exemplary structure is illustrated. In the first alternative configuration, the word line driver region including the word line drivers 722 does not have an areal overlap in the plan view with a boundary between the first contact region 200A and the first memory array region 100A or with a boundary between the second contact region 200B and the second memory array region 100B. In this case, a segment of the area of the first contact region 200A may have an areal overlap with the first bit line drivers 721A in the plan view, and a segment of the area of the second contact region 200A may have an areal overlap with the second bit line drivers 721B in the plan view.

Figure 15:
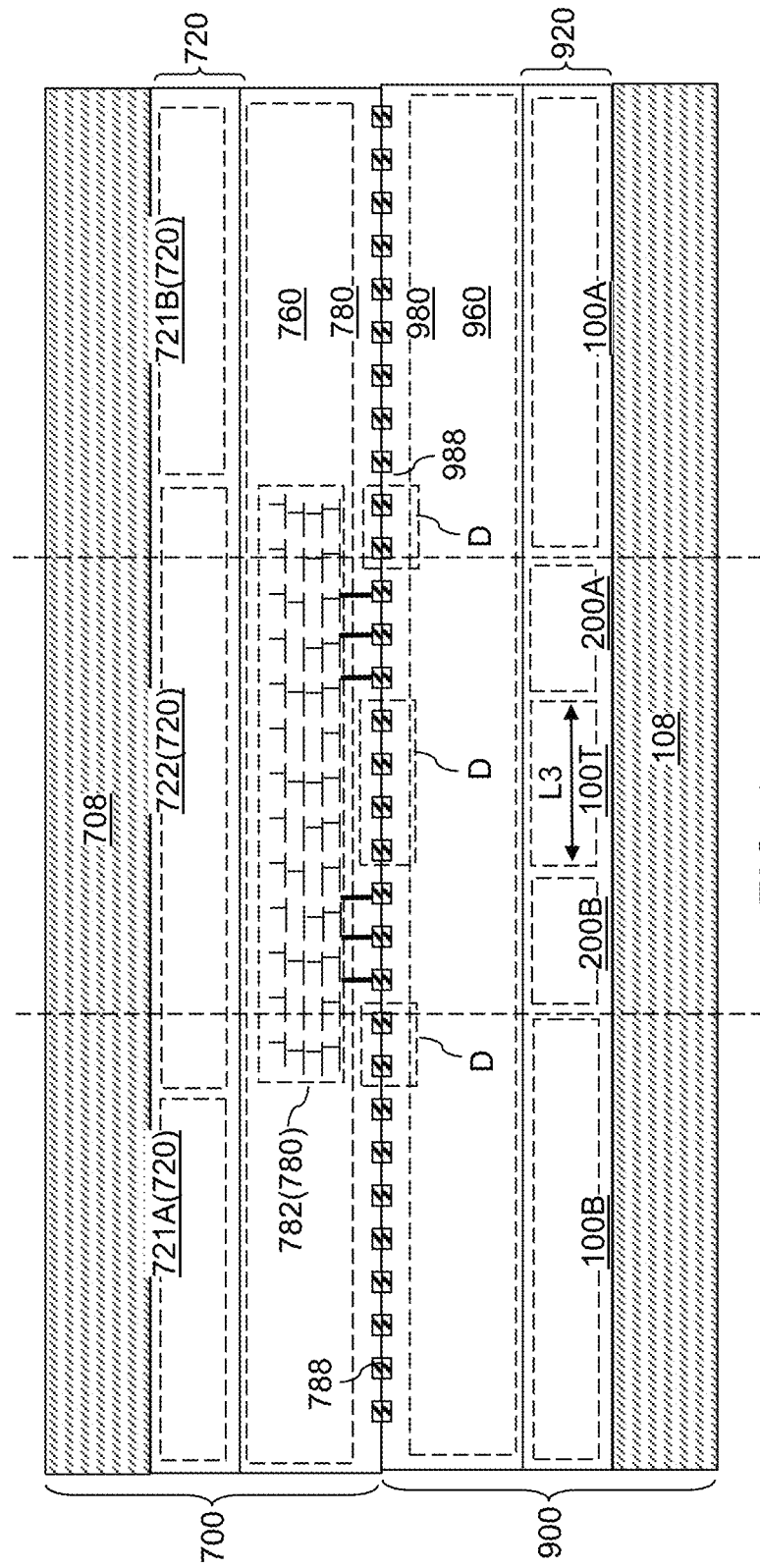
FIG. 15 is a vertical cross-sectional view of a second alternative configuration of the first exemplary structure after bonding the logic die to the memory die according to the first embodiment of the present disclosure.

Referring to FIG. 15, a second alternative configuration of the first exemplary structure is illustrated. The logic die 700 can have a layout in which the word line drivers 722 are located within a word line driver region having an areal overlap with the first boundary (between the first memory array region 100A and the first contact region 200A) and the second boundary (between the second memory array region 100B and the second contact region 200B) in the plan view (which is a view along a direction that is perpendicular to a bonding interface between the memory die 900 and the logic die 700). In other words, the word line driver region has an areal overlap in the plan view with a boundary between the first contact region 200A and the first memory array region 100A and with a boundary between the second contact region 200B and the second memory array region 100B.

Figure 16:
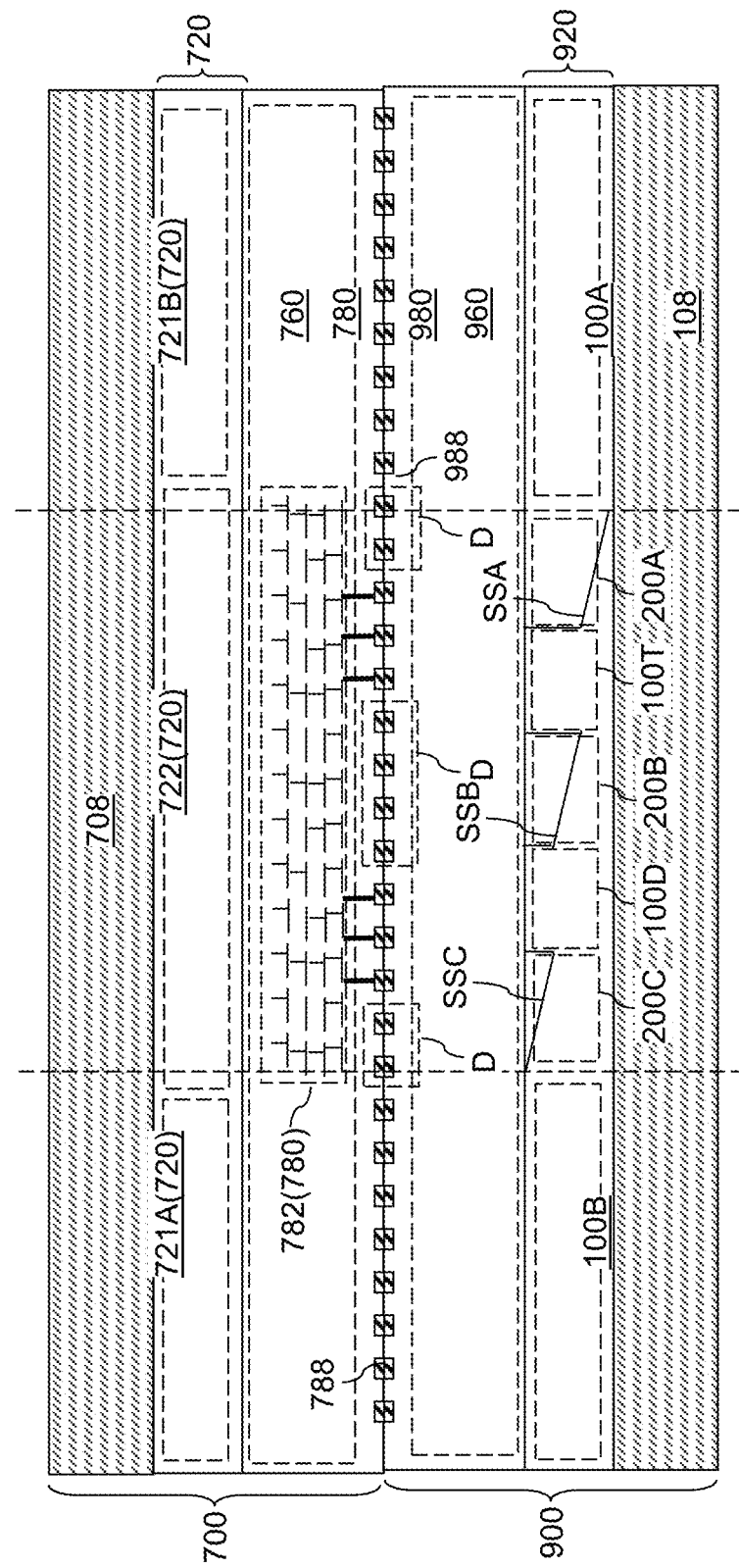
FIG. 16 is a vertical cross-sectional view of a third alternative configuration of the first exemplary structure after bonding the logic die to the memory die according to the first embodiment of the present disclosure.

Referring to FIG. 16, a third alternative configuration of the first exemplary structure is illustrated. The memory die 900 may comprise an additional central memory array region 100D and a third contact region 200C. Each contact region (200A, 200B, 200C) may comprise a respective set of contact via structures that contact a respective subset of the electrically conductive layers (146, 246). For example, the set of contact via structures in the first contact region 200A may contact a proximal set of electrically conductive layers 146 that are proximal to the memory substrate 108, the set of contact via structures in the third contact region 200C may contact a distal set of electrically conductive layers 246 that are distal from the memory substrate 108, and the set of contact via structures in the second contact region 200B may contact a middle set of electrically conductive layers (146, 246) that are more distal from the memory substrate 108 than the proximal set of electrically conductive layers 146 and more proximal to the memory substrate 108 than the distal set of electrically conductive layers 246.

The first contact region 200A may comprise first stepped surfaces SSA of the proximal set of electrically conductive layers 146. The third contact region 200C may comprise third stepped surfaces SSC of the distal set of electrically conductive layers 246. The second contact region 200B may contact second stepped surfaces SSB of the middle set of electrically conductive layers (146, 246). The memory-side semiconductor devices 920 may comprise, from one side to another along the first horizontal direction hd1, a first memory array region 100A, a first contact region 200A, a central memory array region 100T, a second contact region 200B, an additional central memory array region 100D, a third contact region 200C, and a second memory array region 100B.

Figure 17:
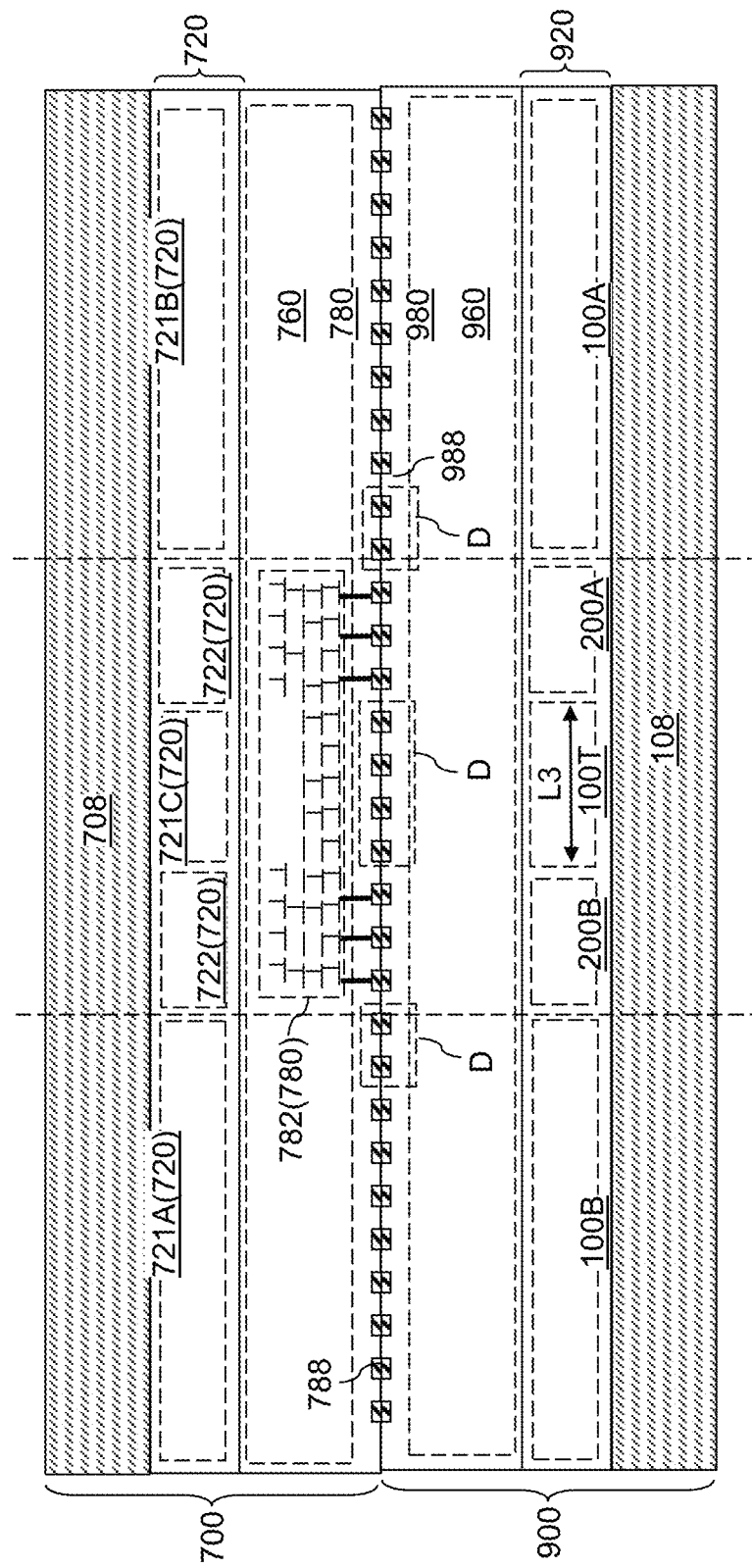
FIG. 17 is a vertical cross-sectional view of a fourth alternative configuration of the first exemplary structure after bonding the logic die to the memory die according to the first embodiment of the present disclosure.

Referring to FIG. 17, a fourth alternative configuration of the first exemplary structure is illustrated. The fourth alternative configuration of the first exemplary structure can be derived from the first exemplary structure or previously described alternative embodiments thereof by forming the word line drivers 722 in two separate word line driver regions that are laterally spaced by third bit line drivers 721C. The area of the third bit line drivers 721C is herein referred to as a third bit line driver region. The third bit line drivers can be configured to drive the central bit lines in the central memory array region 100T.

Referring collectively to FIGS. 1A-17 and according to the first embodiment of the present disclosure, a semiconductor structure comprising a memory die 900 is provided. The memory die 900 comprises: an alternating stack of insulating layers (132, 232) and electrically conductive layers (146, 246) overlying a memory substrate 108 and laterally extending through a series of regions that comprises, in a spatial order along a first horizontal direction hd1, a first memory array region 100A, a first contact region 200A, a central memory array region 100T, a second contact region 200B, and a second memory array region 100B, wherein the electrically conductive layers (146, 246) continuously extend from the first memory array region 100A to the second memory array region 100B; arrays of memory openings 49 located in the first memory array region 100A, the central memory array region 100T, and the second memory array region 100B; and arrays of memory opening fill structures 58 located within the arrays of memory openings 49 and comprising a respective vertical stack of memory elements.

In one embodiment, the alternating stack of insulating layers (132, 232) and electrically conductive layers (146, 246) comprises a lower layer stack LLS including a first subset of the insulating layers (132, 232) and a first subset of the electrically conductive layers (146, 246) located underneath a horizontal plane HP, and an upper layer stack ULS including a second subset of the insulating layers (132, 232) and a second subset of the electrically conductive layers (146, 246) located above the horizontal plane HP. The second contact region 200B comprises first contact via structures 86 contacting a respective electrically conductive layer of the first subset of the electrically conductive layers (146, 246). The first contact region 200A comprises second contact via structures 86 contacting a respective electrically conductive layer of the second subset of the electrically conductive layers (146, 246).

In one embodiment, the semiconductor structure comprises a logic die 700 bonded to the memory die, wherein the logic die 700 comprises word line drivers 722 electrically connected to nodes of the electrically conductive layers (146, 246) through logic-side metal interconnect structures 780 located in the logic die 700 and through memory-side metal interconnect structures 980 located in the memory die 900.

In one embodiment, the first contact region 200A comprises stepped surfaces of the upper layer stack ULS; and the second contact region 200B comprises stepped surfaces of the lower layer stack LLS. In one embodiment, the first contact region 200A comprises an upper retro-stepped dielectric material portion (such as a second-tier retro-stepped dielectric material portion 265) contacting, and overlying the stepped surfaces of the upper layer stack ULS; and the second contact region 200B comprises a lower retro-stepped dielectric material portion (such as a first-tier retro-stepped dielectric material portion 165) contacting, and overlying, the stepped surfaces of the lower layer stack LLS, and a step-less dielectric material portion 266 overlying the lower retro-stepped dielectric material portion.

In one embodiment, the memory die 900 comprises: a first backside trench fill structure 76 having a first lengthwise sidewall that laterally extends along the first horizontal direction hd1 and contacting each layer within the alternating stack {(132, 146), 9232, 246)}; and a second backside trench fill structure 76 having a second lengthwise sidewall that laterally extends along the first horizontal direction hd1 and contacting each layer within the alternating stack {(132, 146), 9232, 246)}, wherein the alternating stack {(132, 146), 9232, 246)} is located entirely between the first backside trench fill structure 76 and the second backside trench fill structure 76. In one embodiment, the second backside trench fill structure 76 is laterally offset from the first backside trench fill structure 76 along a second horizontal direction hd2 that is perpendicular to the first horizontal direction hd1 by a backside trench spacing; and the first contact region 200A and the second contact region 200B have a respective width along the second horizontal direction hd2 that is less than the backside trench spacing.

In one embodiment, the memory die 900 comprises a first connection strip region CSR including laterally-extending portions of each layer within the upper layer stack ULS, located adjacent to the first contact region 200A, and laterally offset from the first contact region 200A along the second horizontal direction hd2; and a second connection strip region CSR including laterally-extending portions of each layer within the lower layer stack LLS, located adjacent to the second contact region 200B, and laterally offset from the second contact region 200B along the second horizontal direction hd2. The electrically conductive layers (146, 246) continuously extend from the first memory array region 100A to the second memory array region 100B through the first connection strip region CSR, the central memory array region 100T and the second connection strip region CSR.

In one embodiment, widths of the laterally-extending portions of layers within the upper layer stack ULS within the first connection strip region along the second horizontal direction hd2 decreases with a vertical distance from the substrate 108; and widths of the laterally-extending portions of layers within the lower layer stack LLS within the second connection strip region along the second horizontal direction hd2 decreases with the vertical distance from the substrate 108.

Figure 18C:
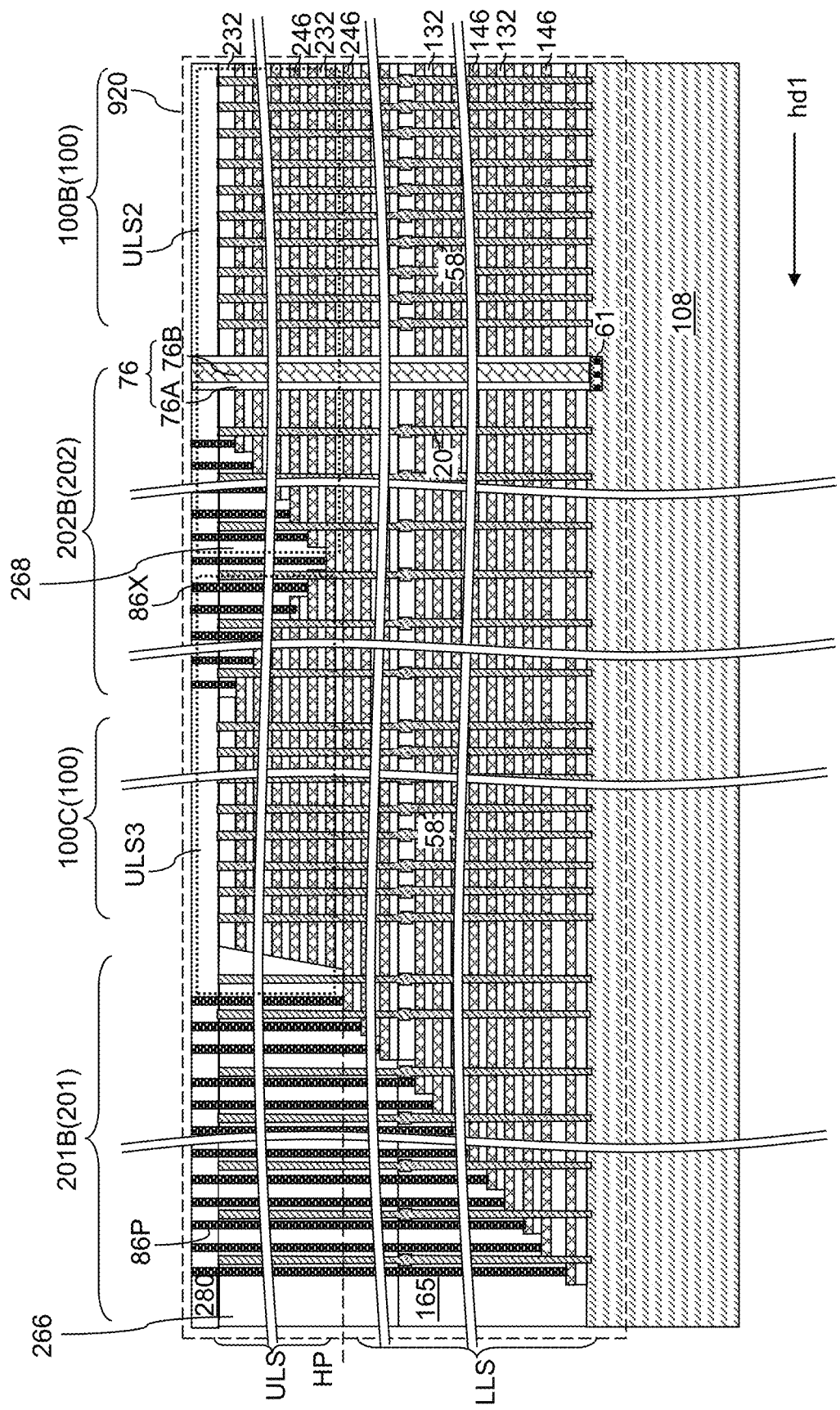
FIG. 18C is a vertical cross-sectional view of a region of the memory die along the vertical plane C-C' of FIG. 18A.

Referring to FIGS. 18A-18C, a second exemplary structure includes a memory die 900, which can be derived from the memory die 900 of the first embodiment by altering the layout of the various regions and the configurations of the stepped surfaces in the contact regions. Generally, the memory die 900 of the second exemplary structure can be formed by forming an alternating stack of insulating layers (132, 232) and spacer material layers over a substrate 108. The spacer material layers are formed as, or are subsequently replaced with, electrically conductive layers (146, 246). The alternating stack laterally extends through a series of regions in the memory plane 300 that comprises, in a spatial order along a first horizontal direction hd1, a first contact region 201A, a first memory array region 100A, an auxiliary contact region 202 (e.g., 202A), a second memory array region 100B, and a second contact region 201B. In one embodiment, the alternating stack laterally extends through a series of regions that comprises, in a spatial order along a first horizontal direction hd1, a first contact region 201A, a first memory array region 100A, a first auxiliary contact region 202A, a second memory array region 100B, a second auxiliary contact region 202B, a third memory array region 100C, and a second contact region 201B.

According to an aspect of the present disclosure, the second memory array region 100B may have a greater length along the first horizontal direction hd1 than the first memory array region 100A or the third memory array region 100C. The ratio of the length of the second memory array region 100B along the first horizontal direction hd1 to the length of the first memory array region 100A along the first horizontal direction hd1 may be in a range from 1 to 128, such as from 2 to 64, and/or from 4 to 32, although lesser and greater ratios may also be employed. The ratio of the length of the second memory array region 100B along the first horizontal direction hd1 to the length of the third memory array region 100C along the first horizontal direction hd1 may be in a range from 1 to 128, such as from 2 to 64, and/or from 4 to 32, although lesser and greater ratios may also be employed.

Arrays of memory openings 49 are located in the first memory array region 100A and the second memory array region 100B, and arrays of memory opening fill structures 58 can be formed within the arrays of memory openings 49. Each of the memory opening fill structures 58 comprises a respective vertical stack of memory elements. The alternating stack comprises a lower layer stack LLS including a first subset of the insulating layers (132, 232) and a first subset of the electrically conductive layers (146, 246) located underneath a horizontal plane HP, a first upper layer stack ULS1 including a second subset of the insulating layers 232 and a second subset of the electrically conductive layers 246 located above the horizontal plane HP, and a second upper layer stack ULS2 including a third subset of the insulating layers 232 and a third subset of the electrically conductive layers 246 located above the horizontal plane HP and laterally spaced apart from the first upper layer stack ULS1. In case the second auxiliary contact region 202B is provided, a fourth subset of the insulating layers 232 and the electrically conductive layers 246 can be located above the horizontal plane HP, and can be laterally spaced apart from the second upper layer stack USL2 and the first upper layer stack ULS1.

Thus, the lower layer stack LLS is located below the horizontal plane HP, and the first upper layer stack ULS1 and the second upper layer stack ULS1 are located above the horizontal plane HP. Generally, the horizontal plane HP may be located at, above, or below, the horizontal interface between the first-tier structure and the second-tier structure. The first upper layer stack ULS1 laterally extends through the first memory array region 100A and a first portion of the auxiliary contact region 202, and the second upper layer stack ULS2 laterally extends through a second portion of the auxiliary contact region 202 and the second memory array region 100B. The first upper layer stack ULS1 and the second upper layer stack ULS2 may be laterally spaced apart by the auxiliary contact region 202. The first upper layer stack ULS1 may be located in the first memory array region 100A, and may have stepped surfaces located in the first auxiliary contact region 202A. The second upper layer stack ULS2 may be located in the second memory array region 100B, and may have stepped surfaces located in the first auxiliary contact region 202A and in the second auxiliary contact region 202B. The third upper layer stack ULS3 may be located in the third memory array region 100C, and may have stepped surfaces located in the second auxiliary contact region 202B.

In one embodiment, the electrically conductive layers 246 in the first upper layer stack ULS1 are physically separated from the electrically conductive layers 246 in the second upper layer stack ULS2. Likewise, the electrically conductive layers 246 in the third upper layer stack ULS2 are physically separated from the electrically conductive layers 246 in the second upper layer stack ULS2. In contrast, the electrically conductive layers (146, 246) in the lower layer stack LLS extend continuously from the first memory array region 100A to the third memory array region 100C through the second memory array region 100B and the auxiliary contact regions (202A, 202B). In this embodiment, the connection strip regions CSR are omitted.

Figure 34A:
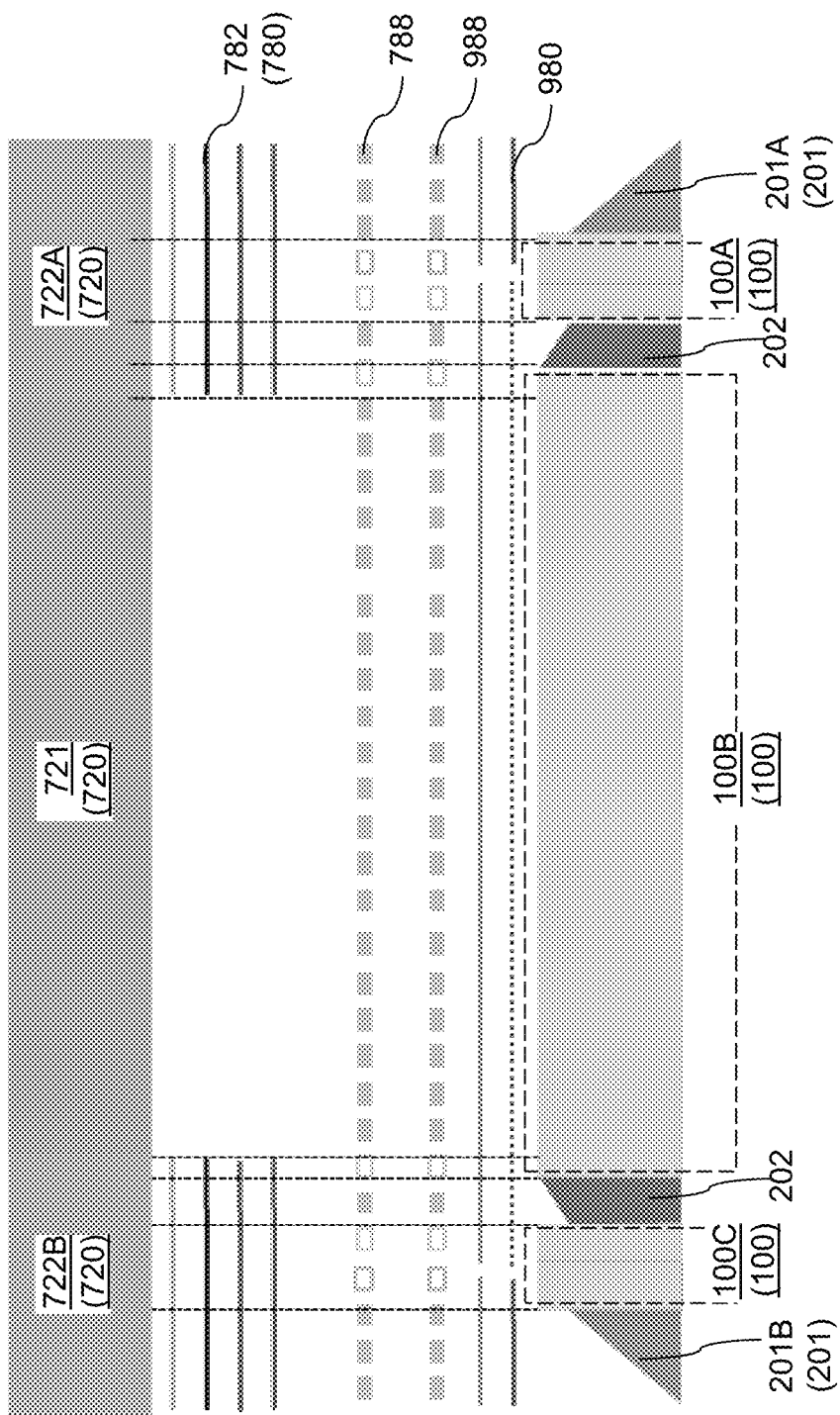
FIG. 34A is a vertical cross-sectional view of a second alternative embodiment of the fourth exemplary structure after bonding the logic die to the memory die according to the fourth embodiment of the present disclosure.
Figure 34B:
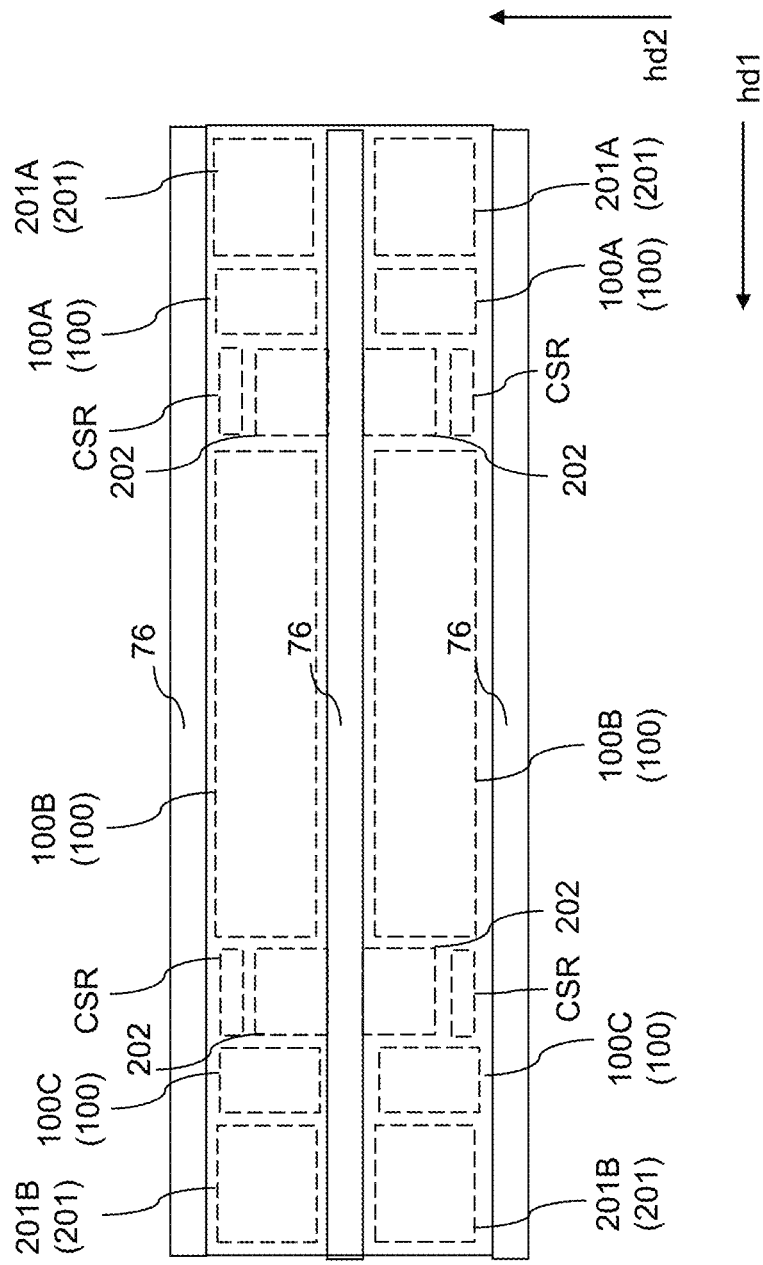
FIG. 34B is a plan view of the plane of the memory die of FIG. 34A.

In an alternatively embodiment, the electrically conductive layers 246 in the upper layer stacks (ULS1, ULS2, ULS3) are physically connected to each other and extend continuously from the first memory array region 100A to the third memory array region 100C through the second memory array region 100B and through connection strip regions CSR which are located adjacent to the first and second auxiliary contact regions (202A 202B), and which are laterally offset from the first and second auxiliary contact region (202A, 202B) along the second horizontal direction hd2, similar to the layout shown in FIG. 34B, and described in more detail below.

The first contact region 201A is located at a first edge (i.e., end) of a memory plane 300. The second contact region 201B is located at a second edge (i.e., end) of the memory plane 300 opposite to the first edge. First primary stepped surfaces PSS1 may be provided within the first contact region 201A, and second primary stepped surfaces PSS2 may be provided within the second contact region 201B. The first primary stepped surfaces PSS1 increase in height (i.e., ascend) in the same horizontal direction (e.g., the horizontal direction hd1). The second primary stepped surfaces PSS2 decrease in height (i.e., descend) in the same horizontal direction (e.g., the first horizontal direction hd1).

The first primary stepped surfaces PSS1 and the second primary stepped surfaces PSS2 can be stepped surfaces of at least the lower layer stack LLS. First complementary stepped surfaces CSS1 can be formed in the first auxiliary contact region 202A, and second complementary stepped surfaces CSS2 can be formed in the second auxiliary contact region 202B. The first complementary stepped surfaces CSS1 may be both ascending and descending in the first horizontal direction hd1. Likewise, second complementary stepped surfaces CSS2 may be both ascending and descending in the first horizontal direction hd1.

First contact via structures 86P (also referred to as primary contact via structures) contact respective electrically conductive layers of the first subset of the electrically conductive layers (146, 246). A first subset of the first contact via structures 86P is formed in the first contact region 201A and a second subset of the first contact via structures 86P is formed in the second contact region 201B. Second contact via structures 86X (also referred to as auxiliary contact via structures) contact a respective electrically conductive layer 246 of the second subset of the electrically conductive layers 246 and the third subset of the electrically conductive layers 246. The second contact via structures 86X can be formed in the auxiliary contact regions 202.

Generally, the memory die 900 of the second exemplary structure comprises: an alternating stack of insulating layers (132, 232) and electrically conductive layers (146, 246), wherein the alternating stack comprises a lower layer stack LLS including a first subset of the insulating layers (132, 232) and a first subset of the electrically conductive layers (146, 246) located underneath a horizontal plane HP, a first upper layer stack ULS1 including a second subset of the insulating layers 232 and a second subset of the electrically conductive layers 246 located above the horizontal plane HP, and a second upper layer stack ULS2 including a third subset of the insulating layers 232 and a third subset of the electrically conductive layers 246 located above the horizontal plane HP and laterally spaced apart from the first upper layer stack ULS1. The lower layer stack LLS laterally extends through a series of regions that comprises, in a spatial order along a first horizontal direction hd1, a first contact region 201A, a first memory array region 100A, an auxiliary contact region 202, a second memory array region 100B, and a second contact region 201B. The first upper layer stack ULS1 laterally extends through the first memory array region 100A and a first portion of the auxiliary contact region 202 (e.g., 202A), and the second upper layer stack ULS2 laterally extends through a second portion of the auxiliary contact region 202 (e.g., 202A) and the second memory array region 100B. The memory die 900 of the second exemplary structure further comprises arrays of memory openings 49 located in the central memory array region 100T and the first memory array region 100A, and arrays of memory opening fill structures 58 located within the arrays of memory openings 49 and comprising a respective vertical stack of memory elements.

In one embodiment, the first contact region 201A and the second contact region 201B comprise a respective subset of first contact via structures 86P contacting a respective electrically conductive layer 246 of the first subset of the electrically conductive layers 246; and the auxiliary contact region 202 comprises second contact via structures 86X contacting a respective electrically conductive layer of the second subset of the electrically conductive layers, 246. In one embodiment, the first contact region 201A comprises first stepped surfaces of the lower layer stack LLS; the second contact region 201B comprises second stepped surfaces of the lower layer stack LLS; and the auxiliary contact region 202 comprises stepped surfaces of an upper layer stack ULS which includes the first and the second upper layer stacks (ULS1, ULS2).

In one embodiment, the memory die 900 comprises a retro-stepped dielectric material portion (such as a first-tier retro-stepped dielectric material portion 165) contacting the first stepped surfaces of the lower layer stack LLS; and a step-less dielectric material portion 266 comprising a straight sidewall that vertically extends from the horizontal plane HP to a topmost surface of the alternating stack {(132, 146), (232, 246)} and laterally extends along a second horizontal direction hd2 that is perpendicular to the first horizontal direction hd1.

In one embodiment, the auxiliary contact region 202 comprises stepped surfaces of the upper layer stack ULS; the stepped surfaces of the upper layer stack ULS comprise a descending staircase that are surfaces of the first upper layer stack ULS1 and an ascending staircase that are surfaces of the second upper layer stack ULS2. The descending staircase includes horizontal surfaces having a decreasing vertical distance from the substrate 108 within an increasing lateral distance along the first horizontal direction hd1, and the ascending staircase includes horizontal surfaces having an increasing vertical distance from the substrate 108 with the increasing lateral distance along the first horizontal direction hd1. An auxiliary stepped dielectric material portion 268 is located on the descending staircase and the ascending staircase.

In one embodiment, for each alternating stack in the memory die 900, a first backside trench fill structure 76 having a first lengthwise sidewall that laterally extends along the first horizontal direction hd1 can contact each layer within the alternating stack, and a second backside trench fill structure 76 having a second lengthwise sidewall that laterally extends along the first horizontal direction hd1 can contact each layer within the alternating stack. The alternating stack comprises a memory block which is located entirely between the first backside trench fill structure 76 and the second backside trench fill structure 76. In one embodiment, the second backside trench fill structure 76 is laterally offset from the first backside trench fill structure 76 along a second horizontal direction hd2 that is perpendicular to the first horizontal direction hd1 by a backside trench spacing, and the auxiliary stepped dielectric material portion contacts the first backside trench fill structure 76 and the second backside trench fill structure 76 and has a same width as the backside trench spacing along the second horizontal direction hd2.

Referring to FIGS. 19A and 19B, a logic die 700 for the second exemplary structure can be derived from the logic die 700 of the first exemplary structure by changing the layout of the logic-side semiconductor devices 720. The logic die 700 can comprise first word line drivers 722A located in a first word line driver region and configured to drive a respective electrically conductive layers of the first subset of the electrically conductive layers (146, 246), the second subset of the electrically conductive layers 246, and the third subset of the electrically conductive layers 246. Further, the logic die 700 can comprise second word line drivers 722B located in a second word line driver region and configured to drive a respective electrically conductive layer of the first subset of the electrically conductive layers (146, 246), the second subset of the electrically conductive layers 246, and the third subset of the electrically conductive layers 246.

The logic die 700 may comprise bit line drivers 721 located in a bit line driver region. The bit line drivers 721 can be configured to drive first bit lines located in the first memory array region 100A of the memory die 900, second bit lines located in the second memory array region 100B of the memory die 900, and third bit lines located in the third memory array region 100C of the memory die 900. The peripheral circuits 724 may comprise a source power supply circuit configured to provide electrical bias to the source regions 61 in the memory die 900, input/output (I/O) control circuit configured to control the input signals and output signals into the logic die 700, data latches, and other peripheral circuitry configured to control operation of the logic die 700.

The logic die 700 comprises logic-side metal interconnect structures 780 embedded in logic-side dielectric material layers 760. Logic-side bonding pads 788 can be embedded in the topmost logic-side dielectric material layer of the logic-side dielectric material layers 760. The logic-side metal interconnect structures 780 can comprise word-line-connection logic-side metal interconnect structures 782, which provide electrical connection between the word line drivers (722A, 722B) and a subset of the logic-side bonding pads 788. According to an embodiment of the present disclosure, the area of the word-line-connection logic-side metal interconnect structures 782 can be located entirely within the area of the word line drivers (722A, 722B).

Figure 20:
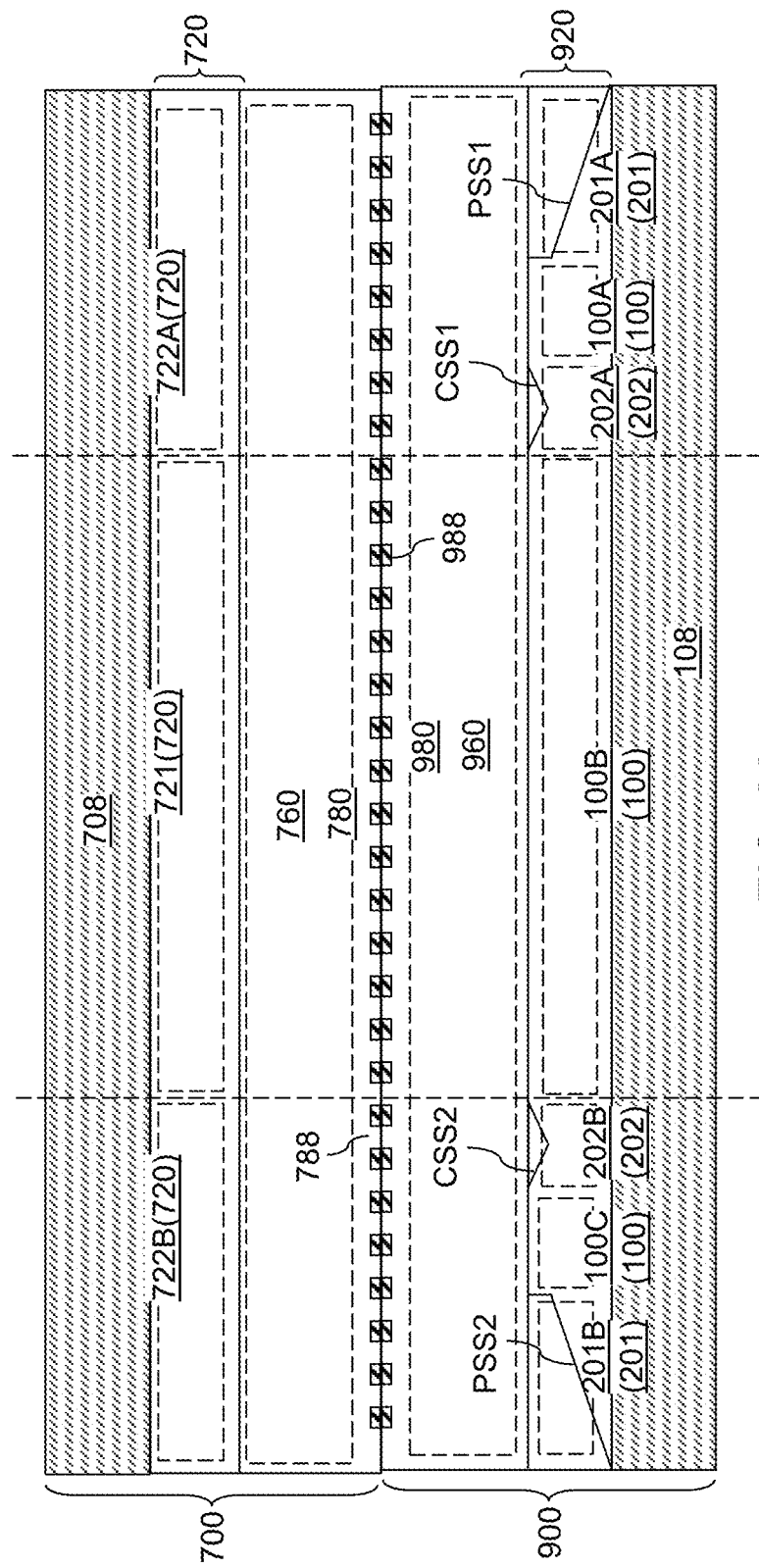
FIG. 20 is a vertical cross-sectional view of the second exemplary structure after bonding the logic die to the memory die according to the second embodiment of the present disclosure.

Referring to FIG. 20, the logic die 700 can be bonded to the memory die 900 by metal-to-metal bonding between the memory-side bonding pads 988 and the logic-side bonding pads 788. For example, copper-to-copper bonding may be employed to bond mating pairs of the memory-side bonding pads 988 and the logic-side bonding pads 788. Optionally, a surface of the memory-side dielectric material layers 960 may be bonded to a surface of the logic-side dielectric material layers 760 by dielectric-to-dielectric bonding. In some embodiments, the memory-side bonding pads 988 and the logic-side bonding pads 788 may include dummy metal bonding pads D that are not electrically connected to the memory-side semiconductor devices 920 or the logic-side semiconductor devices 720.

The word line drivers (722A, 722B) can be electrically connected to a respective electrically conductive layer within the first subset of the electrically conductive layers (146, 246) in the lower layer stack LLS, the second subset of the electrically conductive layers 246 in the first upper layer stack ULS1, the third subset of the electrically conductive layers 246 in the second upper layer stack ULS2, and a fourth subset of the electrically conductive layers 246 in a third upper layer stack ULS3. The first upper layer stack may be located in the first memory array region 100A, and may have stepped surfaces located in the first auxiliary contact region 202A. The second upper layer stack ULS2 may be located in the second memory array region 100B, and may have stepped surfaces located in the first auxiliary contact region 202A and in the second auxiliary contact region 202B. The third upper layer stack ULS3 may be located in the third memory array region 100C, and may have stepped surfaces located in the second auxiliary contact region 202B.

In one embodiment, the logic die 700 comprises first word line drivers 722A located in a first word line driver region and electrically connected to a respective electrically conductive layer within the first subset of the electrically conductive layers (146, 246) in the lower layer stack LLS, the second subset of the electrically conductive layers 246 in the first upper layer stack ULS1, and the third subset of the electrically conductive layers 246 in the second upper layer stack ULS2. In one embodiment, the logic die 700 also comprises second word line drivers 722B located in a second word line driver region and electrically connected to a respective electrically conductive layer within the first subset of the electrically conductive layers (146, 246) in the lower layer stack LLS, the third subset of the electrically conductive layers 246 in the second upper layer stack ULS2, and the fourth subset of the electrically conductive layers 246 in the third upper layer stack ULS3.

In one embodiment, the first word line driver region 722A has an areal overlap in a plan view with each of the first contact region 201A, the first memory array region 100A, and the first auxiliary contact region 202A. In one embodiment, the second word line driver region 722B has an areal overlap in a plan view with each of the second contact region 201B, the second memory array region 100B, and the second auxiliary contact region 202B.

In one embodiment, each of the memory opening fill structures 58 comprises a respective vertical semiconductor channel 60. The memory die 900 comprises first bit lines electrically connected to end portions of a respective subset of the vertical semiconductor channels 60 located in the first memory array region 100A, second bit lines electrically connected to end portions of a respective subset of the vertical semiconductor channels 60 located in the second memory array region 100B, and third bit lines electrically connected to end portions of a respective subset of the vertical semiconductor channels 60 located in the third memory array region 100C. The logic die 700 comprises bit line drivers 721 located in a bit line driver region and electrically connected to the first bit lines, the second bit lines, and the third bit lines.

In one embodiment, the logic die 700 may have a configuration in which the bit line driver region is located entirely outside areas of the first contact region 201A, the first memory array region 100A, and the auxiliary contact region 202 in a plan view.

Figure 21:
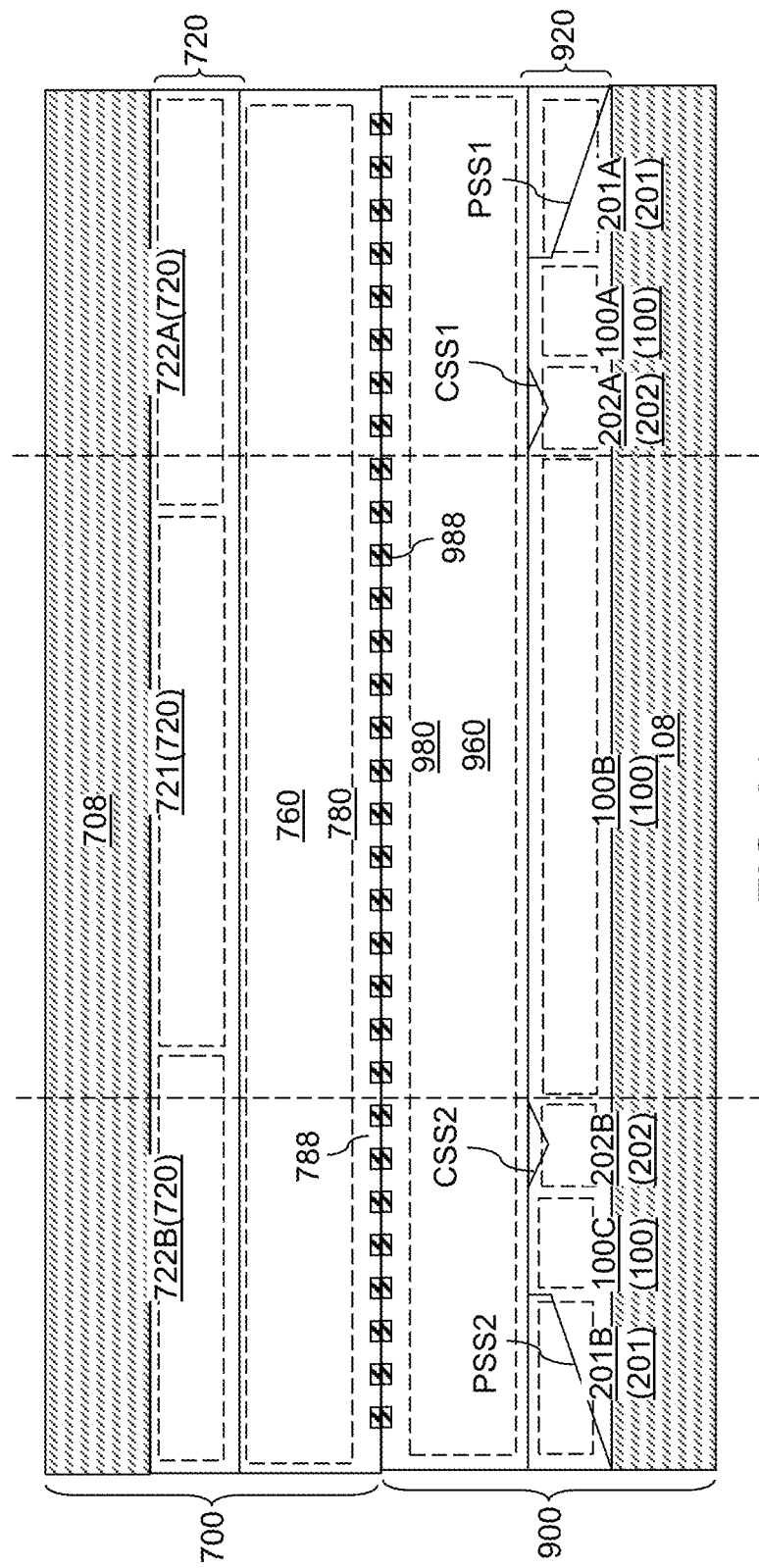
FIG. 21 is a vertical cross-sectional view of an alternative configuration of the second exemplary structure after bonding the logic die to the memory die according to the second embodiment of the present disclosure.

Referring to FIG. 21, an alternative configuration of the second exemplary structure is illustrated. In one embodiment, the first word line driver region has an areal overlap in a plan view with each of the first contact region 201A, the first memory array region 100A, and the first auxiliary contact region 202A, and the second word line drive region has an areal overlap in the plan view with each of the second contact region 201B, the third memory array region 100C, and the second auxiliary contact region 202B (i.e., an additional auxiliary contact region).

In one embodiment, the first word line driver region 722A may an areal overlap in the plan view with a peripheral portion of the second memory array region 100B, and the second word line drive region 722B may have an areal overlap in the plan view with another peripheral portion of the second memory array region 100B. In one embodiment, the second exemplary structure can have a configuration in which the bit line driver region 721 has an areal overlap in the plan view with the second memory array region 100B, and does not have any areal overlap with the first memory array region 100A, the first contact region 201A, the first auxiliary contact region 202A, the third memory array region 100C, the second contact region 201B, or the second auxiliary contact region 202B.

Figure 22B:
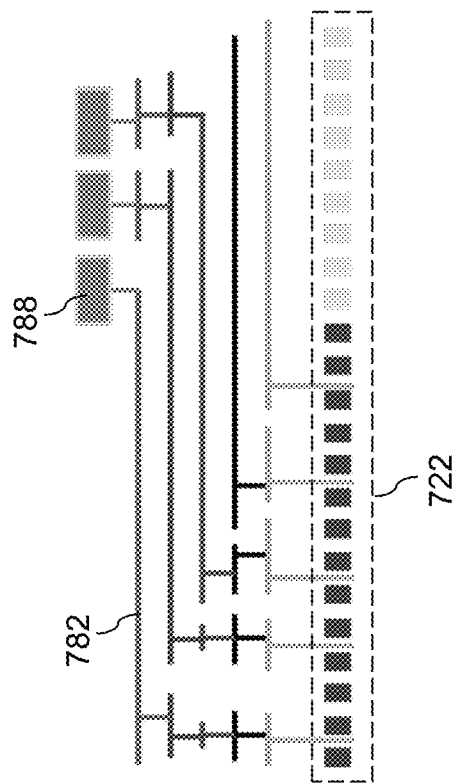
FIG. 22B is a schematic vertical cross-sectional view of a region within a logic die in a comparative exemplary structure.
Figure 22A:
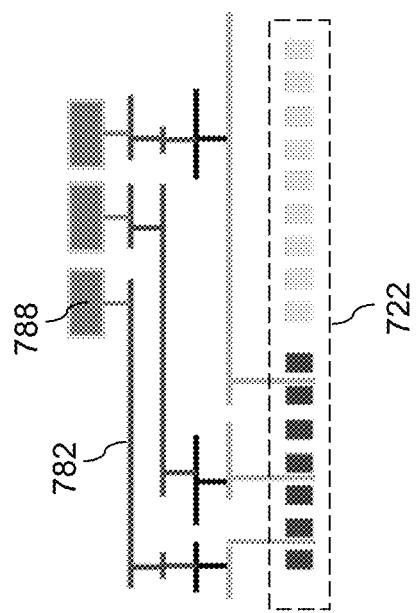
FIG. 22A is a schematic vertical cross-sectional view of a region within the logic die of FIG. 21 according to the second embodiment of the present disclosure.

FIG. 22A is a schematic vertical cross-sectional view of a region within the logic die of FIG. 21 according to the second embodiment of the present disclosure. FIG. 22B is a schematic vertical cross-sectional view of a region within a logic die in a comparative exemplary structure. FIGS. 22A and 22B illustrate that lateral distances of the word-line-connection logic-side metal interconnect structures 782 are shorter in the embodiments of the present disclosure than in the comparative exemplary structure. The comparative exemplary structure is a structure in which a memory plane 300 consists of a single memory array region and a pair of contact regions located on both sides of the single memory array region. Each contact region has a staircase region extending from a bottommost layer of an alternating stack to a topmost layer of the alternating stack.

Specifically, formation of a combination of a first contact region 201A, a first memory array region 100A, and a first auxiliary contact region 202A in the structure of FIG. 22A reduces the maximum lateral dimension of the word-line-connection logic-side metal interconnect structures 782 because the maximum lateral dimensions of the word-line-connection logic-side metal interconnect structures 782 can be the greater of one half of the length of the first memory array region 100A along the first horizontal direction hd1, the maximum lateral offset distance for the word line drivers from the boundary of the first contact region 201A and the first memory array region 100A, and the maximum lateral offset distance of the word line drivers from the boundary of the second memory array region 100B and the first auxiliary contact region 202A.

In contrast, the maximum lateral distance of the word-line-connection logic-side metal interconnect structures 782 in the comparative exemplary structure of FIG. 22B is the lateral offset distance between a boundary between a word line driver region a bit line driver region and a boundary between the memory array region and a contact region. Insertion of a combination of an additional memory array region (such as the first memory array region 100A) and an auxiliary contact region (such as the first auxiliary contact region 202A) between a large memory array region (such as the second memory array region 100B) and the first contact region 201A has the effect of reducing the maximum lateral dimension of the word-line-connection logic-side metal interconnect structures 782. Furthermore, the number of laterally word-line-connection logic-side metal interconnect structures 782 is reduced in half in the structure of FIG. 22A compared to the structure of FIG. 22B.

Figure 23:
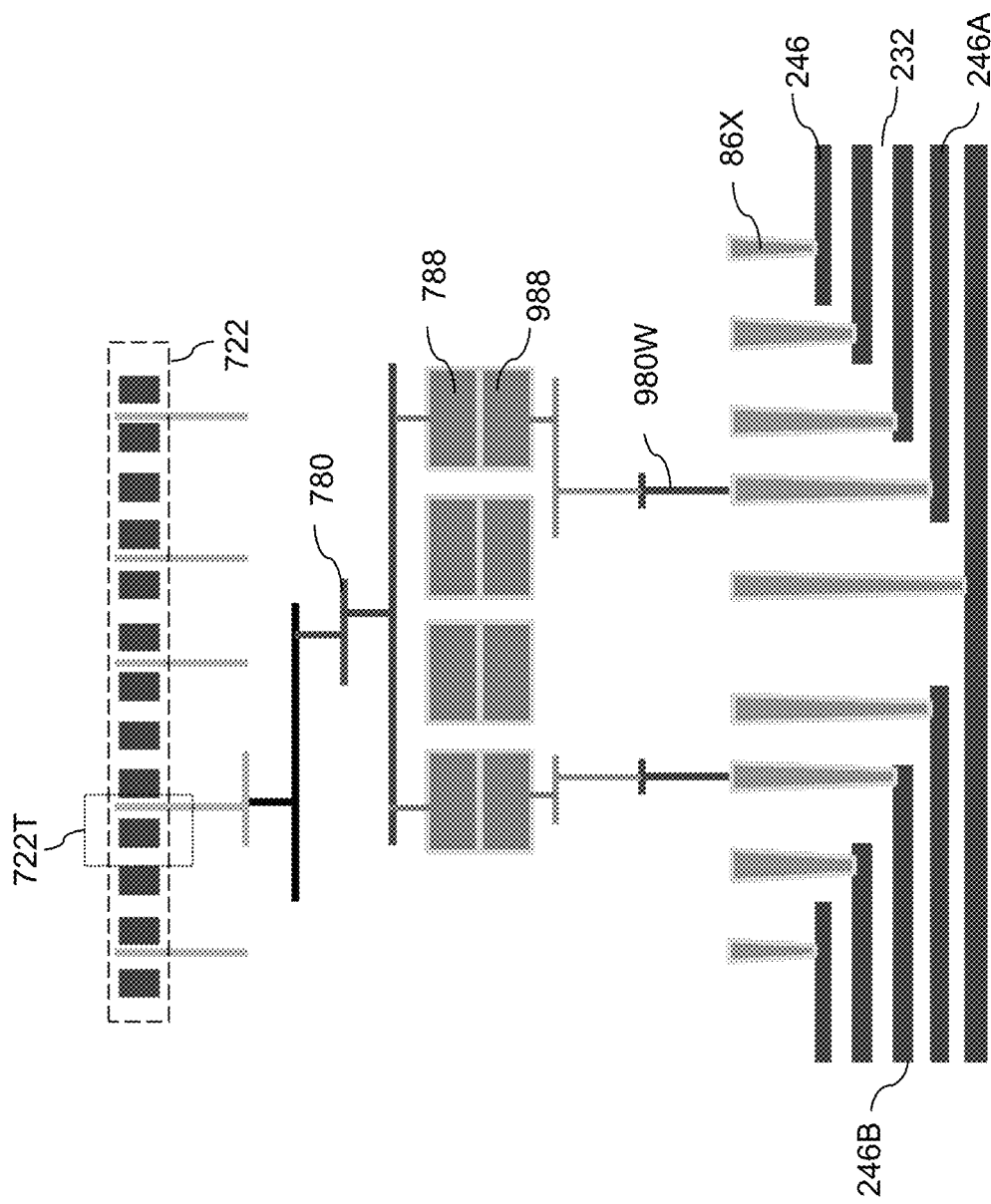
FIG. 23 is a schematic vertical cross-sectional view of a region within the second exemplary structure according to the second embodiment of the present disclosure.

FIG. 23 schematically illustrates the electrical connection between the word line drivers 722 and the subset of the electrically conductive layers (146, 246) within a second, third, or fourth subset of the insulating layers 232 and the electrically conductive layers 246, which can be one of the three upper layer stacks ULS1, ULS2 or ULS2 through word line memory-side metal interconnect structures 980W. A single word line driver transistor 722T may control a first word line (e.g., electrically conductive layer 246A) in one upper level stack, and a different second word line (e.g., electrically conductive layer 246B) in a different upper level stack, where the first word line and the second word lines are not physically connected to each other.

Figure 24:
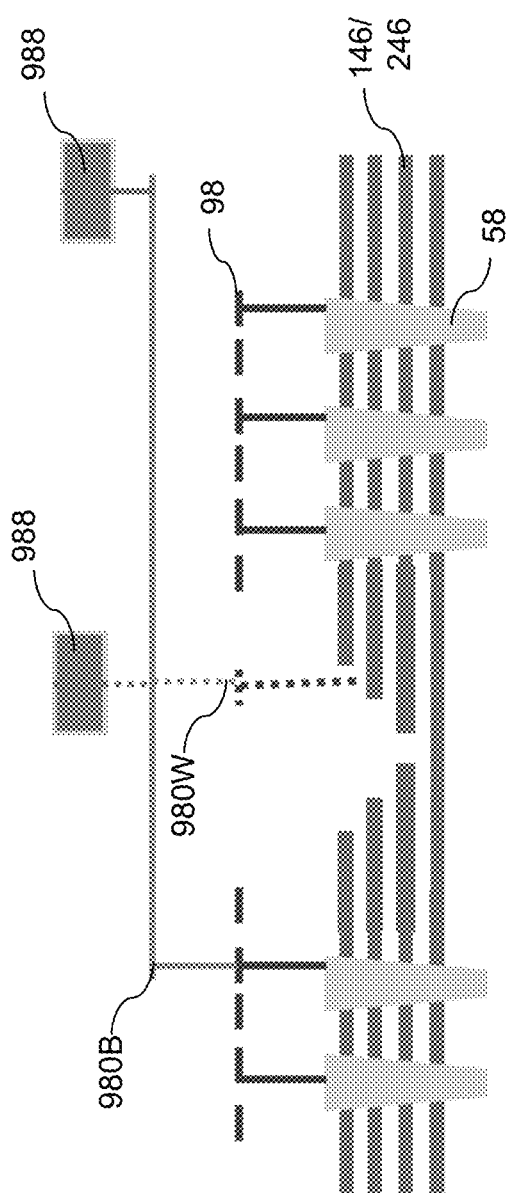
FIG. 24 is a schematic vertical cross-sectional view of a region in the memory die in the second exemplary structure according to the second embodiment of the present disclosure.

FIG. 24 schematically illustrates connection of the bit lines 98 to the memory opening fill structures 58. The various bit lines 98 located in different memory array regions (100A, 100B, 100C) can be electrically connected to a respective bit line driver 721 of the logic die 700 through various bit line memory-side metal interconnect structures 980B and logic-side metal interconnect structures 780 that can provide lateral connection within the bonded assembly of the memory die 900 and the logic die 700. The bit line memory-side metal interconnect structures 980B are laterally offset in the second horizontal direction hd2 from the word line memory-side metal interconnect structures 980W, since the metal interconnect density in this region is relatively low, and permits lateral routing of interconnect structures around each other.

Figure 25:
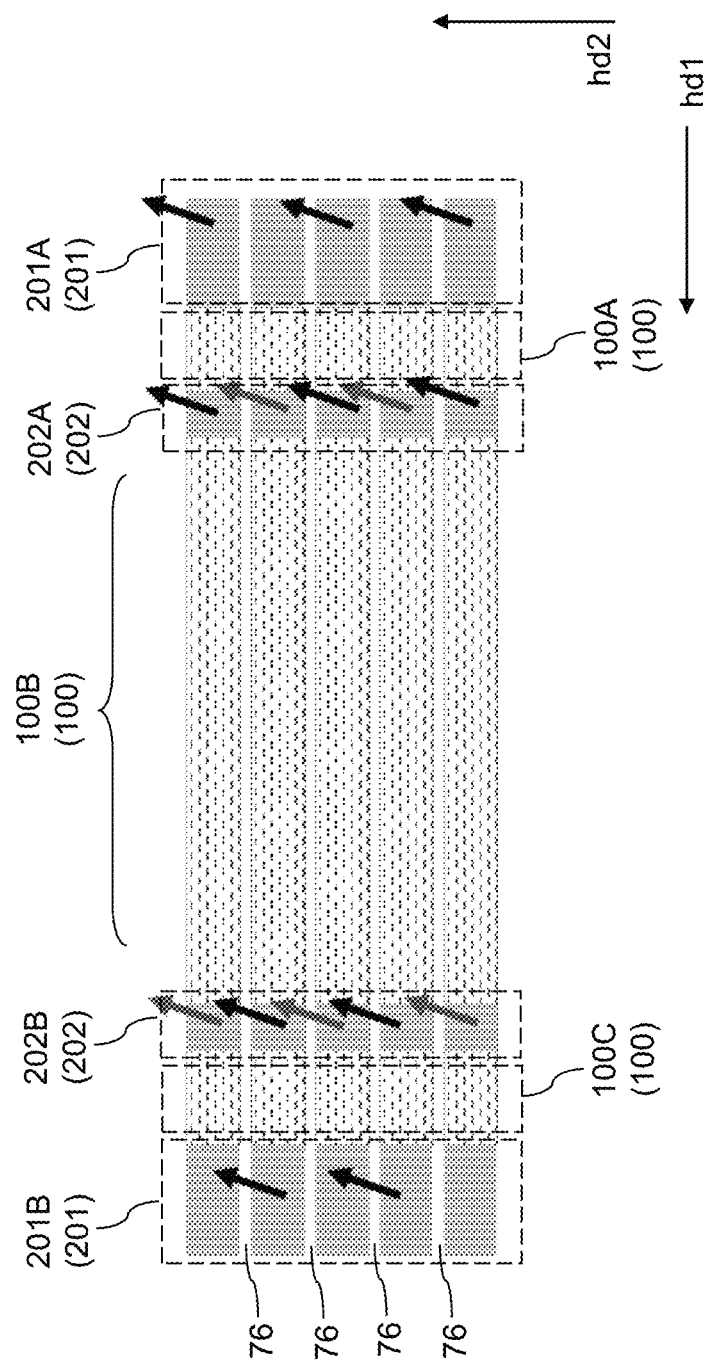
FIG. 25 is a schematic plan view of a plane of a first configuration of the memory die of the second exemplary structure according to the second embodiment of the present disclosure.

FIG. 25 is a schematic plan view of a plane of a first configuration of the memory die 900 of the second exemplary structure according to the second embodiment of the present disclosure. The first configuration corresponds to the configuration illustrated in FIG. 21. Various arrows schematically represent electrical connections to the word line drivers in the logic die 700 through various word line memory-side metal interconnect structures 980W and through various logic-side metal interconnect structures 780. In this embodiment, the electrically conductive layers (146, 246) in the lower level stacks LLS in odd numbered memory blocks are connected to the first word line drivers 722A located in the first word line driver region via primary contact via structures 86P located in the first contact region 201A. A memory block comprises an alternating stack located between adjacent backside trench fill structures 76. The electrically conductive layers (146, 246) in the lower level stacks LLS in even numbered memory blocks are connected to the second word line drivers 722B located in the second word line driver region via primary contact via structures 86P located in the second contact region 201B. Alternatively, the designation of odd and even numbered memory blocks may be reversed. However, the electrically conductive layers 246 in the upper level stacks (ULS1, ULS2, ULS3) located in both odd and even numbered memory blocks are electrically connected to the respective word line drivers (722A, 722B) located in the first and the second word line driver regions.

Figure 26:
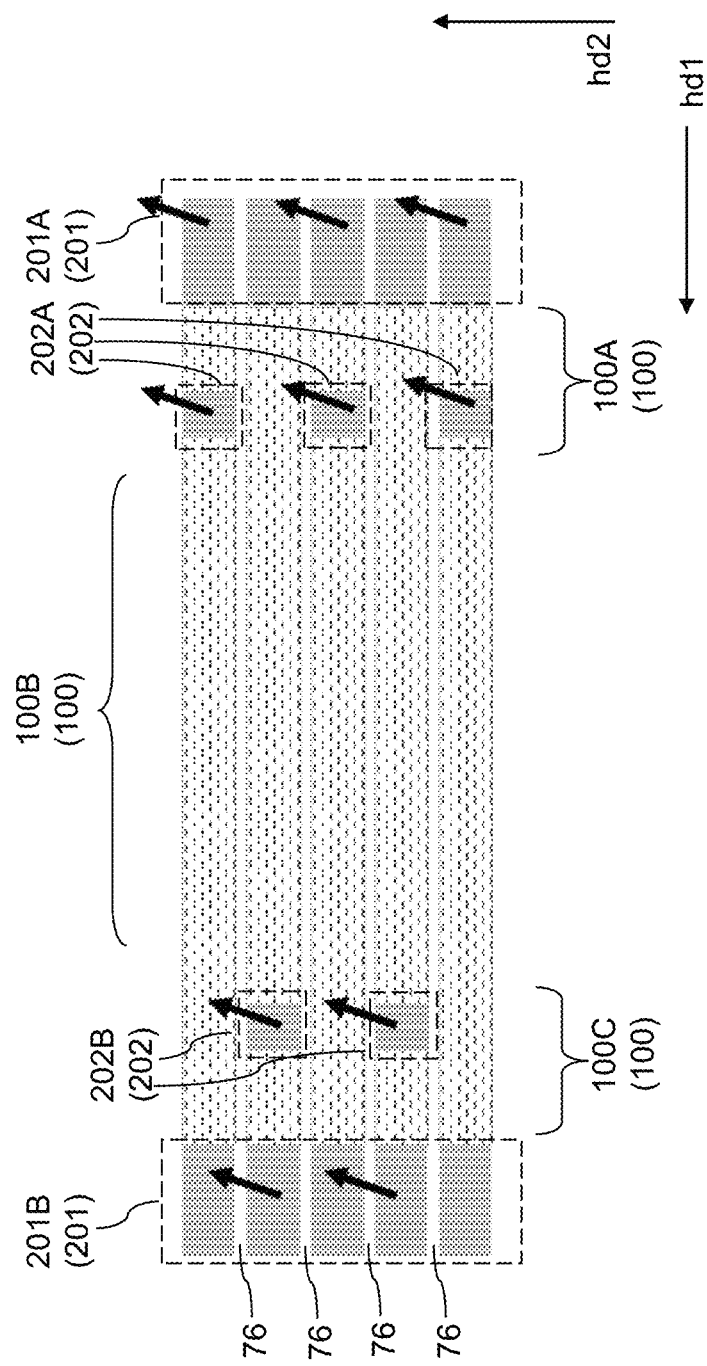
FIG. 26 is a schematic plan view of a plane of a second configuration of the memory die of the second exemplary structure according to the second embodiment of the present disclosure.

FIG. 26 is a schematic plan view of a plane of a second configuration of the memory die of the second exemplary structure according to the second embodiment of the present disclosure. In this case, each memory block (i.e., alternating stack of insulating layers (132, 232) and electrically conductive layers (146, 246) located between a neighboring pair of backside trench fill structures 76) has only one auxiliary contact region 202, which may be a first auxiliary contact region 202A or a second auxiliary contact region 202B. Thus, the electrically conductive layers 246 in the upper level stacks (ULS1, ULS2, ULS3) located in either odd or even numbered memory blocks are electrically connected to the one of the respective word line drivers (722A, 722B) located either in the first or the second word line driver regions.

In this case, the memory die 900 of the second configuration of the second exemplary structure comprises: an alternating stack of insulating layers (132, 232) and electrically conductive layers (146, 246), wherein the alternating stack comprises a lower layer stack LLS including a first subset of the insulating layers (132, 232) and a first subset of the electrically conductive layers (146, 246) located underneath a horizontal plane HP, a first upper layer stack ULS1 including a second subset of the insulating layers 232 and a second subset of the electrically conductive layers 246 located above the horizontal plane HP, and a second upper layer stack ULS2 including a third subset of the insulating layers 232 and a third subset of the electrically conductive layers 246 located above the horizontal plane HP and laterally spaced apart from the first upper layer stack ULS1. The lower layer stack LLS laterally extends through a series of regions that comprises, in a spatial order along a first horizontal direction hd1, a first contact region 201A, a first memory array region 100A, an auxiliary contact region 202, a second memory array region 100B, and a second contact region 201B. The first upper layer stack ULS1 laterally extends through the first memory array region 100A and a first portion of the auxiliary contact region 202, and the second upper layer stack ULS2 laterally extends through a second portion of the auxiliary contact region 202 and the second memory array region 100B. The memory die 900 of the second exemplary structure further comprises arrays of memory openings 49 located in the second memory array region 100B and the first memory array region 100A, and arrays of memory opening fill structures 58 located within the arrays of memory openings 49 and comprising a respective vertical stack of memory elements.

Figure 27C:
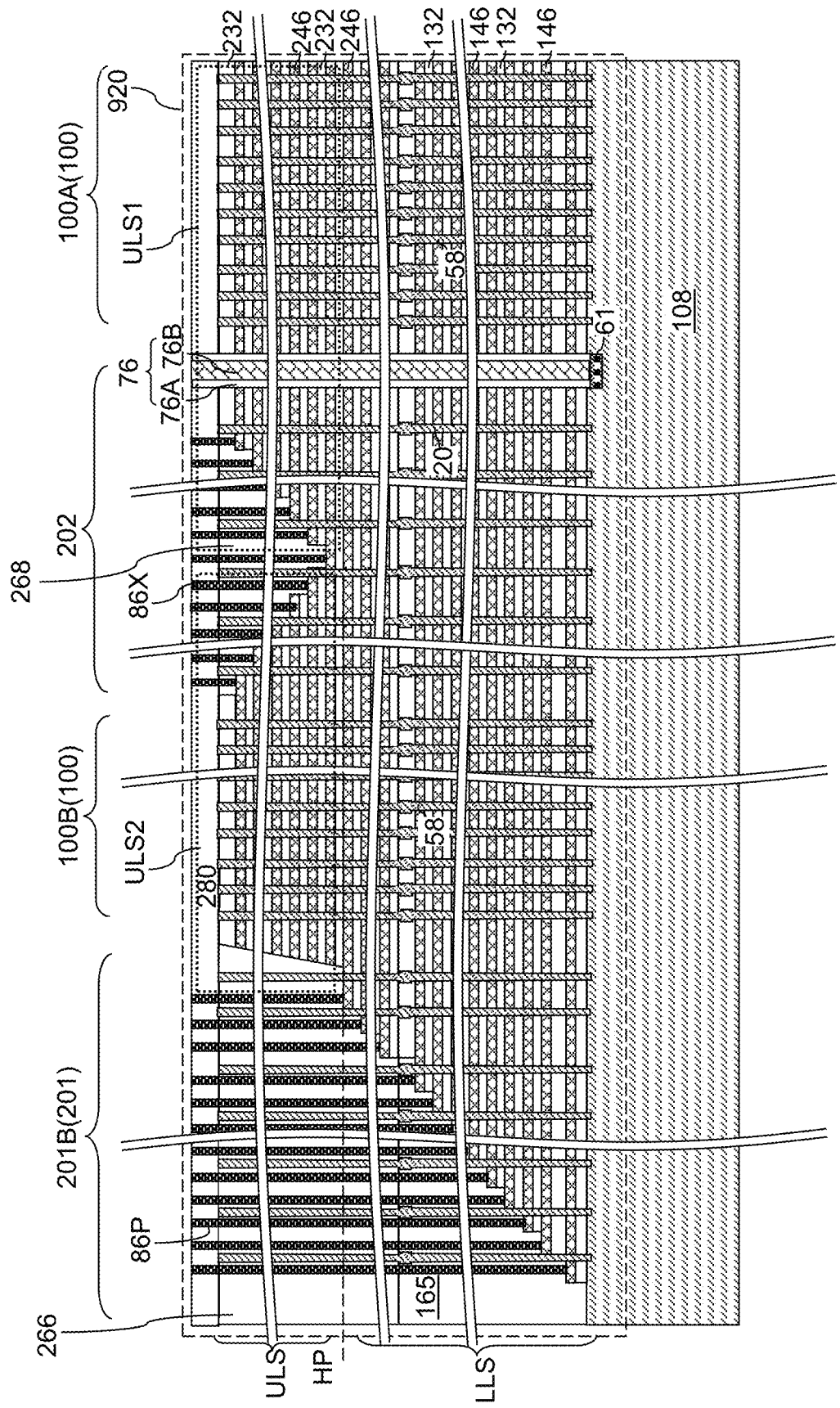
FIG. 27C is a vertical cross-sectional view of a region of the memory die along the vertical plane C-C' of FIG. 27A.

Referring to FIGS. 27A-27C, a memory die 900 of a third exemplary structure is illustrated according to a third embodiment of the present disclosure. In the third exemplary structure, the first memory array region 100A may have the same or similar horizontal length as the second memory array region 100B. For example, the ratio of the length of the first memory array region 100A along the first horizontal direction hd1 to the length of the second memory array region 100B along the first horizontal direction hd1 may be in a range from 0.25 to 4, such as from 0.5 to 2, and/or from 0.8 to 1.25, e.g. 1.

The memory die 900 of the third exemplary structure comprises: an alternating stack of insulating layers (132, 232) and electrically conductive layers (146, 246), wherein the alternating stack comprises a lower layer stack LLS including a first subset of the insulating layers (132, 232) and a first subset of the electrically conductive layers (146, 246) located underneath a horizontal plane HP, a first upper layer stack ULS1 including a second subset of the insulating layers 232 and a second subset of the electrically conductive layers 246 located above the horizontal plane HP, and a second upper layer stack ULS2 including a third subset of the insulating layers 232 and a third subset of the electrically conductive layers 246 located above the horizontal plane HP and laterally spaced apart from the second layer stack. The lower layer stack LLS laterally extends through a series of regions that comprises, in a spatial order along a first horizontal direction hd1, a first contact region 201A, a first memory array region 100A, an auxiliary contact region 202, a second memory array region 100B, and a second contact region 201B. The first upper layer stack ULS1 laterally extends through the first memory array region 100A and a first portion of the auxiliary contact region 202, and the second upper layer stack ULS2 laterally extends through a second portion of the auxiliary contact region 202 and the second memory array region 100B. The memory die 900 of the second exemplary structure further comprises arrays of memory openings 49 located in the central memory array region 100T and the first memory array region 100A, and arrays of memory opening fill structures 58 located within the arrays of memory openings 49 and comprising a respective vertical stack of memory elements.

Referring to FIGS. 28A and 28B, a logic die 700 for the third exemplary structure can be derived from the logic die 700 of the second exemplary structure by changing the layout of the logic-side semiconductor devices 720. The logic die 700 can comprise first word line drivers 722A located in a first word line driver region and configured to drive a respective electrically conductive layer of the first subset of the electrically conductive layers (146, 246) located in the lower layer stack LLS, and second word line drivers 722B located in a second word line driver region and configured to drive a respective electrically conductive layer of the first subset of the electrically conductive layers (146, 246). Further, the logic die 700 comprises third word line drivers 722C located in a third word line driver region and configured to drive a respective electrically conductive layer of the second subset of the electrically conductive layers 246 in the first upper layer stack ULS1 and/or in the third subset of the electrically conductive layers 246 in the second upper layer stack ULS2. In one embodiment, the third word line drivers 722C may be configured to drive each electrically conductive layer of the electrically conductive layers in the first upper layer stack ULS1 and the second upper layer stack ULS1. The third word line driver region is laterally positioned between the first and the second word line driver regions along the first horizontal direction hd1.

The logic die 700 may comprise first bit line drivers 721A located in a first bit line driver region and second bit line drivers 721B located in a second bit line driver region. The first bit line drivers 721A can be configured to drive first bit lines located in the first memory array region 100A of the memory die 900, and the second bit line drivers 721B can be configured to drive second bit lines located in the second memory array region 100B of the memory die 900. The peripheral circuits 724 may comprise a source power supply circuit configured to provide electrical bias to the source regions 61 in the memory die 900, input/output (I/O) control circuit configured to control the input signals and output signals into the logic die 700, data latches, and other peripheral circuitry configured to control operation of the logic die 700. In one embodiment, the logic die 700 may comprise, form one side to another along the first horizontal direction hd1, first word line drivers 722A, first bit line drivers 721A, third word line drivers 722C, second bit line drivers 721B, and second word line drivers 722B.

The logic die 700 comprises logic-side metal interconnect structures 780 embedded in logic-side dielectric material layers 760. Logic-side bonding pads 788 can be embedded in the topmost logic-side dielectric material layer of the logic-side dielectric material layers 760. The logic-side metal interconnect structures 780 can comprise word-line-connection logic-side metal interconnect structures 782, which provide electrical connection between the word line drivers (722A, 722B) and a subset of the logic-side bonding pads 788. According to an embodiment of the present disclosure, the areas of the word-line-connection logic-side metal interconnect structures 782 can be located entirely within the areas of the word line drivers (722A, 722B, 722C).

Figure 29:
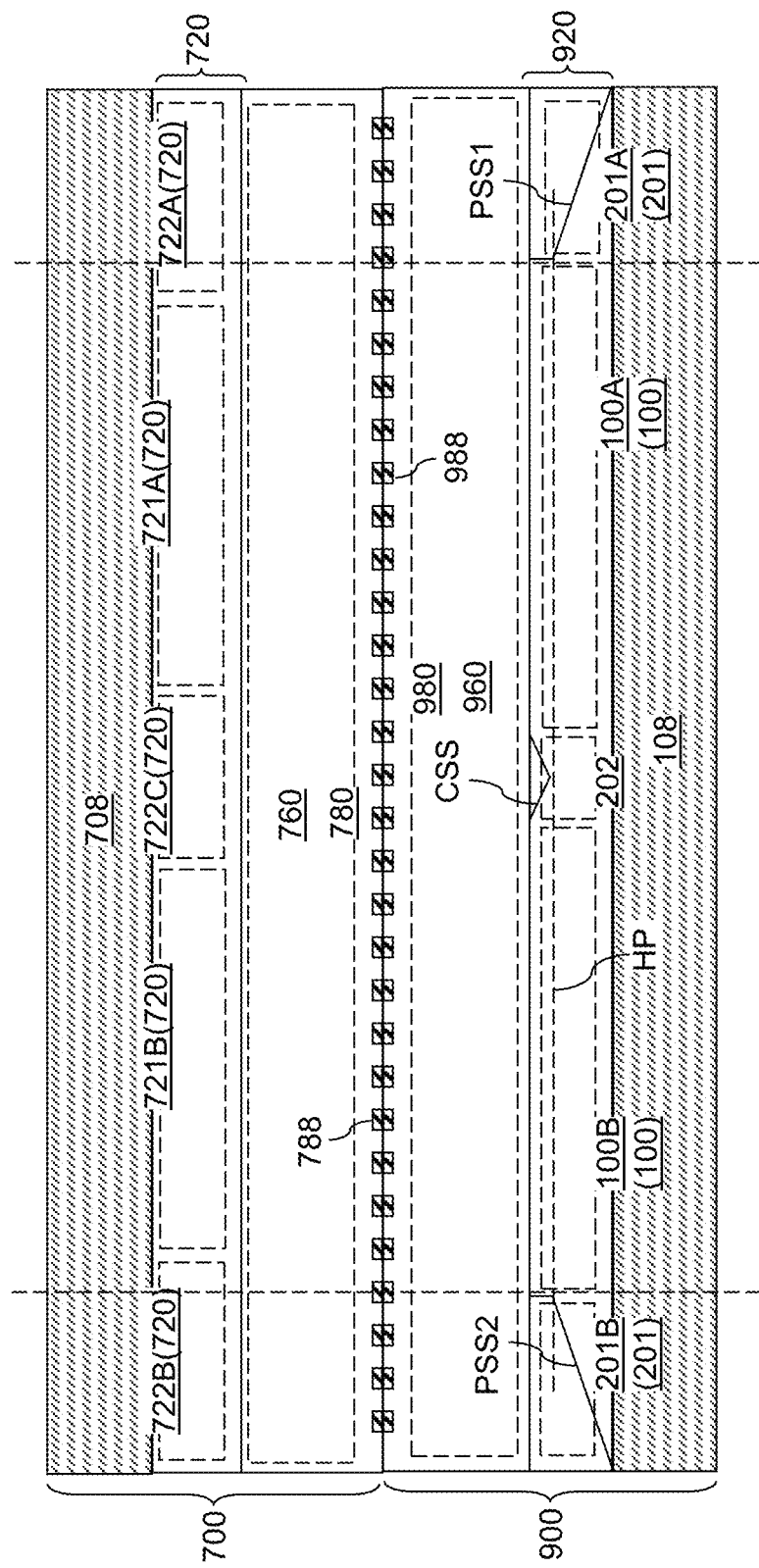
FIG. 29 is a vertical cross-sectional view of the third exemplary structure after bonding the logic die to the memory die according to the third embodiment of the present disclosure.

Referring to FIG. 29, the logic die 700 can be bonded to the memory die 900 by metal-to-metal bonding between the memory-side bonding pads 988 and the logic-side bonding pads 788. For example, copper-to-copper bonding may be employed to bond mating pairs of the memory-side bonding pads 988 and the logic-side bonding pads 788. Optionally, a surface of the memory-side dielectric material layers 960 may be bonded to a surface of the logic-side dielectric material layers 760 by dielectric-to-dielectric bonding.

The first and second word line drivers (722A, 722B) can be electrically connected to a respective electrically conductive layer within the first subset of the electrically conductive layers (146, 246) in the lower layer stack LLS. The third word line drivers 722C can be electrically connected to a respective electrically conductive layer within the second subset of the electrically conductive layers 246 in the first upper layer stack ULS1 and the third subset of the electrically conductive layers 246 in the second upper layer stack ULS2. The first upper layer stack may be located in the first memory array region 100A, and may have stepped surfaces located in the auxiliary contact region 202. The second upper layer stack may be located in the second memory array region 100B, and may have stepped surfaces located in the auxiliary contact region 202.

In one embodiment, the first word line driver region 722A has an areal overlap in a plan view with the first contact region 201A, and optionally with a peripheral portion of the first memory array region 100A. In one embodiment, the second word line driver region 722B has an areal overlap in the plan view with the second contact region 201B, and optionally with a peripheral portion of the second memory array region 100B.

In one embodiment, each of the memory opening fill structures 58 comprises a respective vertical semiconductor channel 60. The memory die 900 comprises first bit lines electrically connected to end portions of a respective subset of the vertical semiconductor channels 60 located in the first memory array region 100A, and second bit lines electrically connected to end portions of a respective subset of the vertical semiconductor channels 60 located in the second memory array region 100B. The logic die 700 comprises first bit line drivers 721A located in a first bit line driver region and electrically connected to the first bit lines, and second bit line drivers 721B located in a second bit line driver region and electrically connected to the second bit lines.

In one embodiment, the logic die 700 may have a configuration in which the first bit line driver region is located entirely outside areas of the first contact region 201A in a plan view. In one embodiment, the logic die 700 may have a configuration in which the second bit line driver region is located entirely outside areas of the second contact region 201B in the plan view.

FIG. 30A is a vertical cross-sectional view of a plane of the memory die in the third exemplary structure of FIG. 29 according to the third embodiment of the present disclosure. FIG. 30B is a plan view of the plane of the memory die of FIG. 30A. In this embodiment, the first, second and auxiliary contact regions (201A, 201B and 202) extend along the entire width of the memory block located between a neighboring pair of backside trench fill structures 76.

FIGS. 31A-31H schematically illustrates a sequence of processing steps that may be employed to pattern the staircase regions within the memory die of FIGS. 27A-27C according to the third embodiment of the present disclosure.

Referring to FIG. 31A, a first trimmable mask layer 171 can be applied over a vertically alternating sequence of continuous insulating layers (132L, 232L) and continuous sacrificial material layers (142L, 242L) after formation of the vertically alternating sequence of the continuous insulating layers (132L, 232L) and the continuous sacrificial material layers (142L, 242L).

Referring to FIG. 31B, stepped surfaces are formed in the first contact region 201A, the second contact region 201B, and the auxiliary contact region 202 by repeating a unit processing sequence that includes an anisotropic etch step that transfers the pattern of the edges of the first trimmable mask layer 171 and a mask trimming step that isotropically trims the first trimmable mask layer 171. The unit processing sequence is repeated until all stepped surfaces of the auxiliary contact region 202 are formed.

Referring to FIG. 31C, the first trimmable mask layer 171 can be removed, for example, by ashing. Auxiliary stepped surfaces CSS (which are also referred to as complementary stepped surfaces) are physically exposed in the auxiliary contact region 202. The auxiliary stepped surfaces CSS are formed above the horizontal plane HP in the third exemplary structure.

Referring to FIG. 31D, a second trimmable mask layer 173 can be formed such that previously formed stepped surfaces are physically exposed in the first contact region 201A and the second contact region 201B, while the auxiliary stepped surface CSS in the auxiliary contact region 202 are covered with the second trimmable mask layer 173.

Referring to FIG. 31E, additional stepped surfaces are formed in the first contact region 201A and the second contact region 201B by repeating a unit processing sequence that includes an anisotropic etch step that transfers the pattern of the edges of the second trimmable mask layer 173 and a mask trimming step that isotropically trims the second trimmable mask layer 173. The unit processing sequence is repeated until the total number of steps in the first contact region 201A and the second contact region 201B is the same as the total number of the continuous spacer material layers (such as the continuous sacrificial material layers (142L, 242L)) below the horizontal plane HP.

Referring to FIG. 31F, the second trimmable mask layer 173 can be removed, for example, by ashing.

Referring to FIG. 31G, a photoresist layer 175 can be applied over the vertically alternating sequence, and can be lithographically patterned to cover the first memory array region 100A, the second memory array region 100B, and the auxiliary contact region 202, while exposing the first and second contact regions (201A, 201B).

Referring to FIG. 31H, an anisotropic etch process can be performed to vertically recess the first stepped surfaces in the first contact region 201A and the second stepped surfaces in the second contact region 201B by a vertical distance that is the same as the distance between the topmost surface of the vertically alternating sequence {(132L, 142L), (232L, 242L)} and the horizontal plane HP. The first stepped surfaces and the second stepped surfaces are vertically shifted down by the vertical distance. First primary stepped surfaces PSS1 are formed in the first contact region 201A, and second primary stepped surfaces PSS2 are formed in the second contact region 201B. The photoresist layer 175 can be removed, for example, by ashing.

The first primary stepped surfaces PSS1 and the second primary stepped surfaces PSS2 are stepped surfaces of the lower layer stack LLS. The auxiliary stepped surfaces CSS are stepped surfaces of the upper layer stacks ULS1 and ULS2. Subsequently, dielectric material portions are formed over the various stepped surfaces of the third exemplary structure, and the processing steps of FIGS. 3-8 can be performed with any needed changes to form memory openings 49, memory opening fill structures 58, backside trenches 79, electrically conductive layers (146, 246), backside trench fill structures 76, and various contact via structures (86A, 86B).

Referring collectively to FIGS. 18A-31H and all related drawings and according to the second embodiment and the third embodiment of the present disclosure, a semiconductor structure comprising a memory die 900 is provided. The memory die 900 comprises: an alternating stack of insulating layers (132, 232) and electrically conductive layers (146, 246), wherein the alternating stack comprises a lower layer stack LLS including a first subset of the insulating layers (132, 232) and a first subset of the electrically conductive layers (146, 246) located underneath a horizontal plane HP, a first upper layer stack ULS including a second subset of the insulating layers (132, 232) and a second subset of the electrically conductive layers (146, 246) located above the horizontal plane HP, and a second upper layer stack ULS including a third subset of the insulating layers (132, 232) and a third subset of the electrically conductive layers (146, 246) located above the horizontal plane HP and laterally spaced apart from the second layer stack, wherein the lower layer stack LLS laterally extends through a series of regions that comprises, in a spatial order along a first horizontal direction hd1, a first contact region 201A, a first memory array region 100A, an auxiliary contact region 202, a second memory array region 100B, and a second contact region 201B, wherein the first upper layer stack ULS laterally extends through the first memory array region 100A and a first portion of the auxiliary contact region 202, and the second upper layer stack ULS laterally extends through a second portion of the auxiliary contact region 202 and the second memory array region 100B; arrays of memory openings 49 located in the second memory array region 100B and the first memory array region 100A; and arrays of memory opening fill structures 58 located within the arrays of memory openings 49 and comprising a respective vertical stack of memory elements.

In one embodiment, the first contact region 201A and the second contact region 201B comprise a respective subset of first contact via structures 86 contacting a respective electrically conductive layer of the first subset of the electrically conductive layers (146, 246); and the auxiliary contact region 202 comprises second contact via structures 86 contacting a respective electrically conductive layer of the second subset of the electrically conductive layers (146, 246).

In one embodiment, the first contact region 201A comprises first stepped surfaces of the lower layer stack LLS; the second contact region 201B comprises second stepped surfaces of the lower layer stack LLS; and the auxiliary contact region 202 comprises stepped surfaces of the upper layer stack ULS.

In one embodiment, the semiconductor structure comprises: a retro-stepped dielectric material portion (such as a first-tier retro-stepped dielectric material portion 165) contacting the first stepped surfaces of the lower layer stack LLS; and a step-less dielectric material portion 266 comprising a straight sidewall that vertically extends from the horizontal plane HP to a topmost surface of the alternating stack {(132, 146), (232, 246)} and laterally extends along a second horizontal direction hd2 that is perpendicular to the first horizontal direction hd1.

In one embodiment, the semiconductor structure further comprises a logic die 700 bonded to the memory die 900, wherein the logic die 700 comprises first word line drivers 722A located in a first word line driver region and electrically connected to a respective electrically conductive layer within the first subset of the electrically conductive layers (146, 246) in the lower layer stack LLS, the second subset of the electrically conductive layers (146, 246) in the first upper layer stack ULS, and the third subset of the electrically conductive layers (146, 246) in the second upper layer stack ULS. In one embodiment, the first word line driver region has an areal overlap in a plan view with each of the first contact region 201A, the first memory array region 100A, and the auxiliary contact region 202. In one embodiment, the first word line driver region has an areal overlap in the plan view with a peripheral portion of the second memory array region 100B.

In one embodiment, the logic die 700 comprises second word line drivers 722B located in a second word line driver region and electrically connected to a respective electrically conductive layer within the first subset of the electrically conductive layers (146, 246) in the lower layer stack LLS, and having an areal overlap in the plan view with the second contact region 201B. In one embodiment, the series of regions comprises an additional auxiliary contact region 202 (such as a second auxiliary contact region 202B) and a third memory array region 100C located between the second memory array region 100B and the second contact region 201B. In one embodiment, the second word line driver region 722B has an areal overlap in the plan view with each of the additional auxiliary contact region 202, the third memory array region 100C, and a peripheral portion of the second memory array region 100B.

In one embodiment, each of the memory opening fill structures 58 comprises a respective vertical semiconductor channel 60; the memory die 900 comprises first bit lines electrically connected to end portions of a respective subset of the vertical semiconductor channels 60 located in the first memory array region 100A and second bit lines electrically connected to end portions of a respective subset of the vertical semiconductor channels located in the second memory array region 100B; and the logic die 700 comprises bit line drivers 721 located in a bit line driver region and electrically connected to the first bit lines and the second bit lines.

In one embodiment, the semiconductor structure has a configuration selected from: a first configuration in which the bit line driver region is located entirely outside areas of the first contact region 201A, the first memory array region 100A, and the auxiliary contact region 202 in a plan view; or a second configuration in which the bit line driver region has an areal overlap in the plan view with the second memory array region 100B, and does not have any areal overlap with the first memory array region 100A or the first contact region 201A.

In one embodiment, the auxiliary contact region 202 comprises stepped surfaces of the upper layer stack ULS; the stepped surfaces of the upper layer stack ULS comprise a descending staircase that are surfaces of the first upper layer stack ULS and an ascending staircase that are surfaces of the second upper layer stack ULS, wherein the descending staircase includes horizontal surfaces having a decreasing vertical distance from the substrate 108 within an increasing lateral distance along the first horizontal direction hd1, and the ascending staircase includes horizontal surfaces having an increasing vertical distance from the substrate 108 with the increasing lateral distance along the first horizontal direction hd1; and an auxiliary stepped dielectric material portion 268 is located on the descending staircase and the ascending staircase.

In one embodiment, the semiconductor structure comprise: a first backside trench fill structure 76 having a first lengthwise sidewall that laterally extends along the first horizontal direction hd1 and contacting each layer within the alternating stack {(132, 146), (232, 246)}; a second backside trench fill structure 76 having a second lengthwise sidewall that laterally extends along the first horizontal direction hd1 and contacting each layer within the alternating stack {(132, 146), (232, 246)}, wherein the alternating stack {(132, 146), (232, 246)} is located entirely between the first backside trench fill structure 76 and the second backside trench fill structure 76. In one embodiment, the second backside trench fill structure 76 is laterally offset from the first backside trench fill structure 76 along a second horizontal direction hd2 that is perpendicular to the first horizontal direction hd1 by a backside trench spacing; and the auxiliary stepped dielectric material portion contacts the first backside trench fill structure 76 and the second backside trench fill structure 76 and has a same width as the backside trench spacing along the second horizontal direction hd2.

Figure 32C:
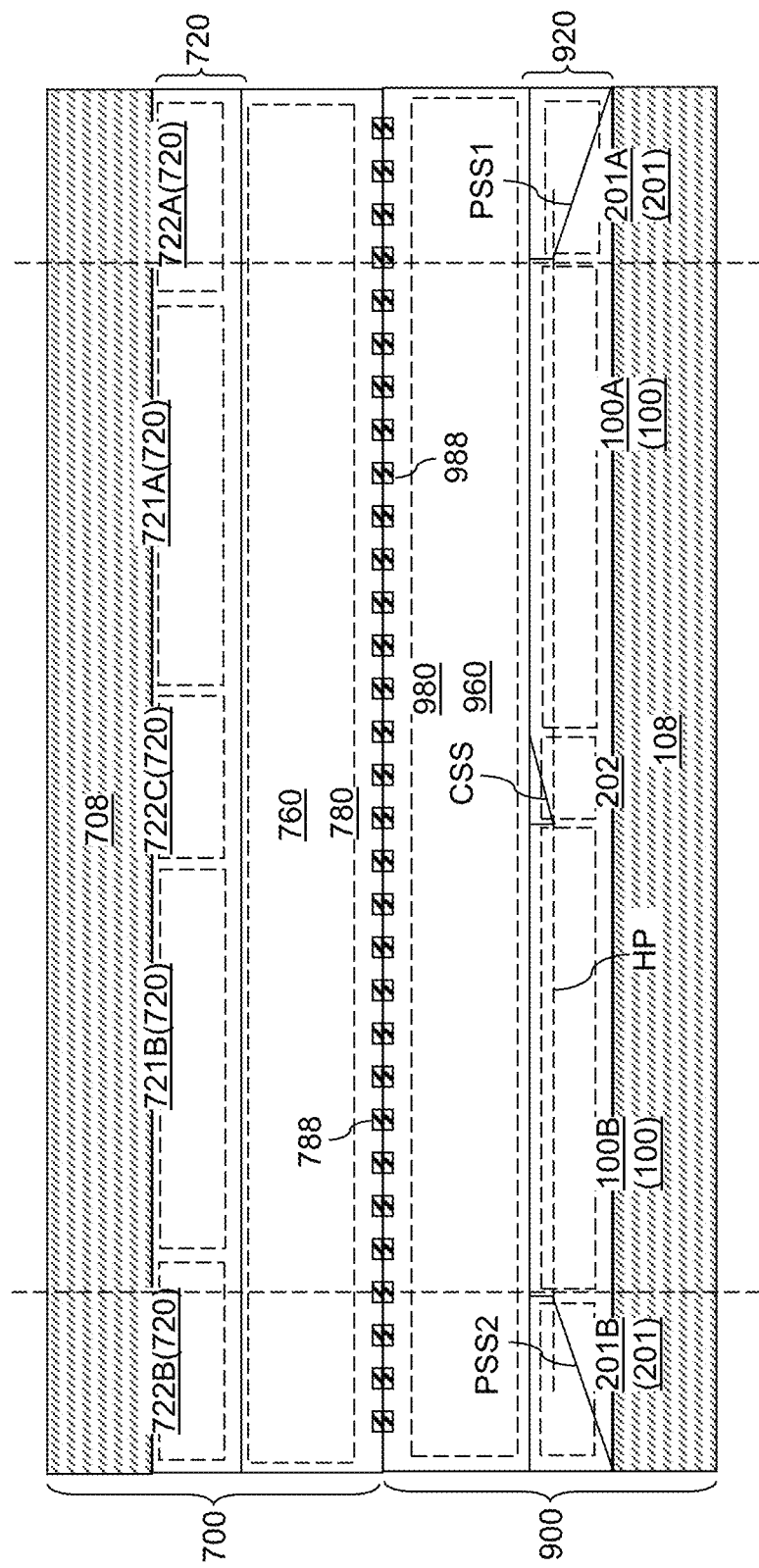
FIG. 32C is a vertical cross-sectional view of the fourth exemplary structure after bonding the logic die to the memory die according to the fourth embodiment of the present disclosure.

Referring to FIGS. 32A-32C, a memory die 900 according to a fourth embodiment of the present disclosure can be derived from the third exemplary structure by reducing the lateral extent of each auxiliary contact region 202 such that each auxiliary contact region 202 has a width along the second horizontal direction hd2 that is less than the lateral separation distance between neighboring pairs of backside trench fill structures 76 (i.e., the auxiliary contact region 202 is narrower than the memory block width). In this case, a connection strip region CSR including laterally-extending portions of each layer within the upper layer stack ULS can be formed adjacent to each auxiliary contact region 202. The connection strip region can be laterally offset from the auxiliary contact region 202 along the second horizontal direction hd2.

The memory die 900 of the fourth exemplary can be formed, for example, by forming an alternating stack of insulating layers (132, 232) and spacer material layers over a memory substrate 108. The spacer material layers are formed as, or are subsequently replaced with, electrically conductive layers (146, 246). The alternating stack laterally extends through a series of regions that comprises, in a spatial order along a first horizontal direction hd1, a first contact region 201A, a first memory array region 100A, an auxiliary contact region 202, a second memory array region 100B, and a second contact region 201B. Arrays of memory openings 49 can be formed in the first memory array region 100A and the second memory array region 100B. Arrays of memory opening fill structures 58 within the arrays of memory openings 49, wherein each of the memory opening fill structures 58 can be formed in the memory openings 49. The memory opening fill structures 58 comprise a respective vertical stack of memory elements. The alternating stack comprises a lower layer stack LLS including a first subset of the insulating layers (132, 232) and a first subset of the electrically conductive layers (146, 246) located underneath a horizontal plane HP, and an upper layer stack ULS including a second subset of the insulating layers 232 and a second subset of the electrically conductive layers 246 located above the horizontal plane HP. First contact via structures 86A (which are illustrated in FIGS. 8 and 9) contacting a respective electrically conductive layer of the first subset of the electrically conductive layers (146, 246) can be formed in the first contact region 201A and the second contact region 201B. Second contact via structures 86B (which are illustrated in FIGS. 8 and 9) contacting a respective electrically conductive layer of the second subset of the electrically conductive layers 246 can be formed in the auxiliary contact region 202. The memory die 900 comprising the memory substrate 108 and the alternating stack {(132, 146), (232, 246)} can be thereby provided.

A logic die 700 can be provided, which comprises first word line drivers 722A located in a first word line driver region, second word line drivers 722B located in a second word line driver region, and auxiliary word line drivers 722C (also referred to as third word line drivers) located in an auxiliary word line driver region (also referred to as a third word line driver region).

The logic die 700 can be bonded to the memory die 900. The first word line drivers 722A and the second word line drivers 722B are electrically connected a respective electrically conductive layer within the first subset of the electrically conductive layers (146, 246), and the auxiliary word line drivers 722C are electrically connected to a respective electrically conductive layer within the second subset of the electrically conductive layers (146, 246).

In one embodiment, an entirety of the auxiliary contact region 202 has an areal overlap with the auxiliary word line driver region in a plan view along a direction that is perpendicular to a bonding interface between the memory die 900 and the logic die 700.

In one embodiment, a first boundary between the first contact region 201A and the first memory array region 100A laterally extends along a second horizontal direction hd2 that is perpendicular to the first horizontal direction hd1 and has an areal overlap with the first word line driver region in the plan view; and a second boundary between the second contact region 201B and the second memory array region 100B laterally extends along the second horizontal direction hd2 and has an areal overlap with the second word line driver region in the plan view.

In one embodiment, each of the memory opening fill structures 58 comprises a respective vertical semiconductor channel 60; the memory die 900 comprises first bit lines electrically connected to end portions of a respective subset of the vertical semiconductor channels 60 located in the first memory array region 100A and second bit lines electrically connected to end portions of a respective subset of the vertical semiconductor channels 60 located in the second memory array region 100B; and the logic die 700 comprises first bit line drivers 721A located in a first bit line driver region and electrically connected to the first bit lines and second bit line drivers 721B located in a second bit line driver region and electrically connected to the second bit lines. In one embodiment, the first bit line driver region is located entirely within an area of the first memory array region 100A; and the second bit line driver region is located entirely within an area of the second memory array region 100B.

In one embodiment shown in FIGS. 32A and 32C, the stepped surfaces in each auxiliary contact region 202 may be one-sided, i.e., may consist of an ascending staircase or a descending staircase. In this case, a dielectric material portion overlying the stepped surfaces of each auxiliary contact region 202 may have a straight sidewall that vertically extends through each layer within the upper layer stack ULS.

In one embodiment, the first contact region 201A comprises a first retro-stepped dielectric material portion 65 contacting, and overlying the first stepped surfaces of the lower layer stack LLS, and the second contact region 201B comprises a second retro-stepped dielectric material portion 65 contacting, and overlying, the second stepped surfaces of the lower layer stack LLS. In one embodiment, the first retro-stepped dielectric material portion 65 comprises a first straight sidewall laterally extending along a second horizontal direction hd2 that is perpendicular to the first horizontal direction hd1 and contacting first sidewalls of each layer within the upper layer stack ULS, and the second retro-stepped dielectric material portion 65 comprises a second straight sidewall laterally extending along the second horizontal direction hd2 and contacting second sidewalls of each layer within the upper layer stack ULS.

Figure 33C:
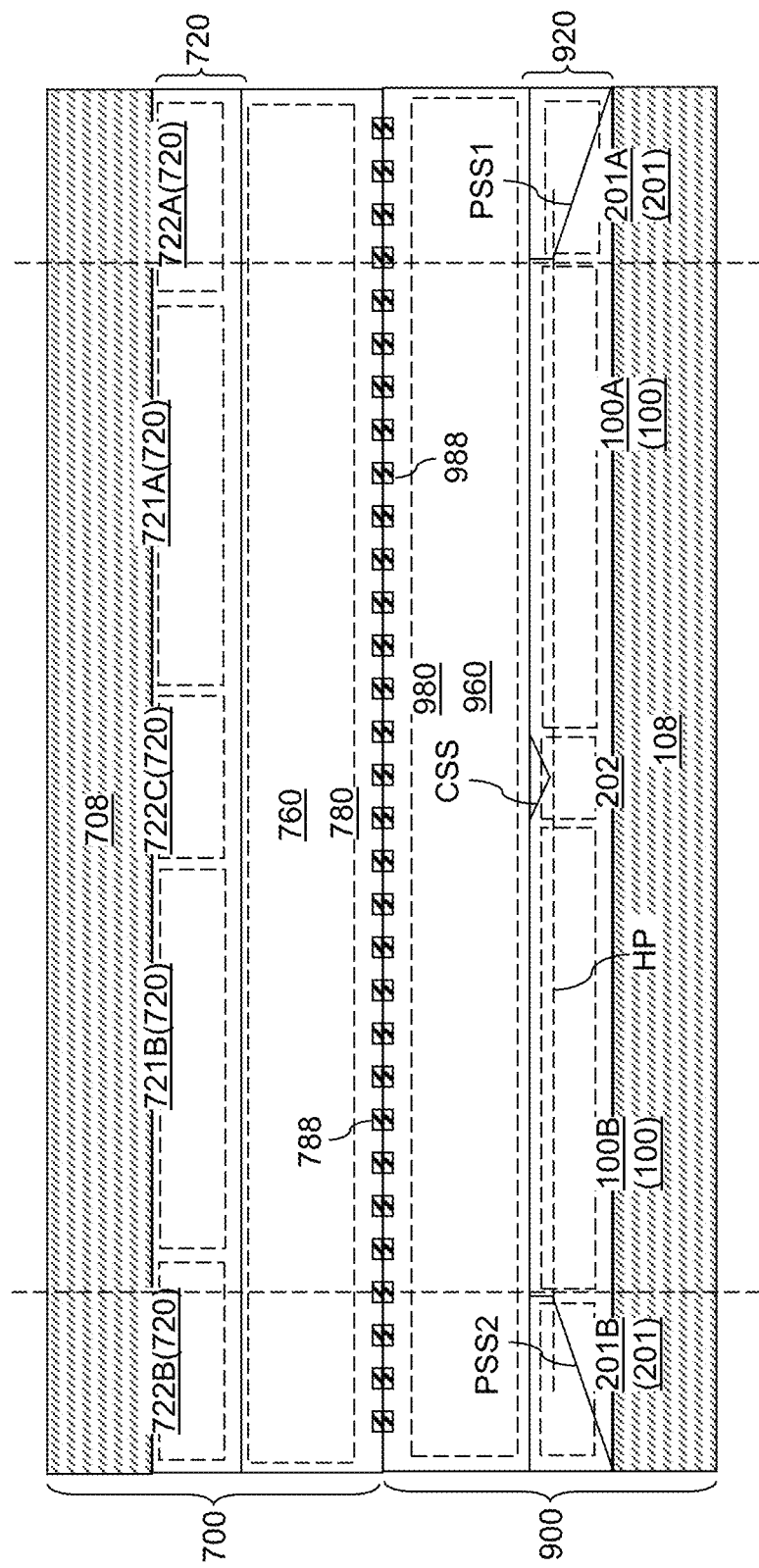
FIG. 33C is a vertical cross-sectional view of the first alternative embodiment of the fourth exemplary structure after bonding the logic die to the memory die according to the fourth embodiment of the present disclosure.

Referring to FIGS. 33A-33C, a first alternative embodiment of the fourth exemplary structure is illustrated. The first alternative embodiment of the fourth exemplary structure can be derived from the fourth exemplary structure by patterning the auxiliary stepped surfaces in the auxiliary contact region 202 such that the auxiliary stepped surfaces comprise a descending staircase and an ascending staircase. In this case, the auxiliary contact region 202 comprises stepped surfaces of the upper layer stack ULS1, which include a descending staircase that are surfaces of the first upper layer stack ULS1 and an ascending staircase that are surfaces of the second upper layer stack ULS2. The descending staircase includes horizontal surfaces having a decreasing vertical distance from the substrate 108 within an increasing lateral distance along the first horizontal direction hd1, and the ascending staircase includes horizontal surfaces having an increasing vertical distance from the substrate 108 with the increasing lateral distance along the first horizontal direction hd1. An auxiliary stepped dielectric material portion 268 (shown, for example, in FIG. 27) can be formed on the descending staircase and the ascending staircase.

Referring to FIGS. 34A and 34B, a second alternative embodiment of the fourth exemplary structure can be derived from the fourth exemplary structure by forming two or more auxiliary contact regions 202 within each alternating stack of insulating layers (132, 232) and electrically conductive layers (146, 246). A first memory array region 100A, a second memory array region 100B, and a third memory array region 100C may be formed.

Each auxiliary contact region 202 has a width along the second horizontal direction hd2 that is less than the lateral separation distance between neighboring pairs of backside trench fill structures 76. In this case, a connection strip region CSR including laterally-extending portions of each layer within the upper layer stack ULS can be formed adjacent to each auxiliary contact region 202. The connection strip region CSR can be laterally offset from the auxiliary contact region 202 along the second horizontal direction hd2.

Referring to FIGS. 32A-34B and all related drawings and according to the fourth embodiment of the present disclosure, a semiconductor structure comprising a memory die 900 is provided. The memory die 900 comprises: an alternating stack of insulating layers (132, 232) and electrically conductive layers (146, 246) overlying a substrate and laterally extending through a series of regions that comprises, in a spatial order along a first horizontal direction hd1, a first contact region 201A, a first memory array region 100A, an auxiliary contact region 202, a second memory array region 100B, and a second contact region 201B; arrays of memory openings 49 located in the first memory array region 100A and the second memory array region 100B; and arrays of memory opening fill structures 58 located within the arrays of memory openings 49 and comprising a respective vertical stack of memory elements. The alternating stack of insulating layers (132, 232) and electrically conductive layers (146, 246) comprises a lower layer stack LLS including a first subset of the insulating layers (132, 232) and a first subset of the electrically conductive layers (146, 246) located underneath a horizontal plane HP, and an upper layer stack ULS including a second subset of the insulating layers (132, 232) and a second subset of the electrically conductive layers (146, 246) located above the horizontal plane HP. The first contact region 201A and the second contact region 201B comprise first contact via structures 86 contacting a respective electrically conductive layer of the first subset of the electrically conductive layers (146, 246). The auxiliary staircase region comprises second contact via structures 86 contacting a respective electrically conductive layer of the second subset of the electrically conductive layers (146, 246).

In one embodiment, the semiconductor structure further comprises a logic die 700 bonded to the memory die 900. The logic die 700 comprises: first word line drivers 722A located in a first word line driver region; second word line drivers 722B located in a second word line driver region, wherein the first word line drivers 722A and the second word line drivers 722B are electrically connected to a respective electrically conductive layer within the first subset of the electrically conductive layers (146, 246); and auxiliary word line drivers 722C located in an auxiliary word line driver region and electrically connected to the second subset of the electrically conductive layers (146, 246).

In one embodiment, an entirety of the auxiliary contact region 202 has an areal overlap with the auxiliary word line driver region in a plan view along a direction that is perpendicular to a bonding interface between the memory die 900 and the logic die 700.

A first boundary between the first contact region 201A and the first memory array region 100A laterally extends along a second horizontal direction hd2 that is perpendicular to the first horizontal direction hd1 and has an areal overlap with the first word line driver region in the plan view; and a second boundary between the second contact region 201B and the second memory array region 100B laterally extends along the second horizontal direction hd2 and has an areal overlap with the second word line driver region in the plan view.

In one embodiment, each of the memory opening fill structures 58 comprises a respective vertical semiconductor channel 60. The memory die 900 comprises first bit lines electrically connected to end portions of a respective subset of the vertical semiconductor channels 60 located in the first memory array region 100A and second bit lines electrically connected to end portions of a respective subset of the vertical semiconductor channels 60 located in the second memory array region 100B. The logic die 700 comprises first bit line drivers 721 located in a first bit line driver region and electrically connected to the first bit lines and second bit line drivers 721 located in a second bit line driver region and electrically connected to the second bit lines.

In one embodiment, the first bit line driver region is located entirely within an area of the first memory array region 100A. The second bit line driver region is located entirely within an area of the second memory array region 100B. In one embodiment, a first boundary between the auxiliary word line driver region and the first bit line driver region laterally extends along a second horizontal direction hd2 that is perpendicular to the first horizontal direction hd1 and has an overlap with the first memory array region 100A in a plan view. A second boundary between the auxiliary word line driver region and the second bit line driver region extends along the second horizontal and has an overlap with the second memory array region 100B in the plan view.

In one embodiment, the first contact region 201A comprises first stepped surfaces of the lower layer stack LLS. The second contact region 201B comprises second stepped surfaces of the lower layer stack LLS. The auxiliary contact region 202 comprises stepped surfaces of the upper layer stack ULS. In one embodiment, the first contact region 201A comprises a first retro-stepped dielectric material portion 65 contacting, and overlying the first stepped surfaces of the lower layer stack LLS, and the second contact region 201B comprises a second retro-stepped dielectric material portion 65 contacting, and overlying, the second stepped surfaces of the lower layer stack LLS. In one embodiment, the first retro-stepped dielectric material portion 65 comprises a first straight sidewall laterally extending along a second horizontal direction hd2 that is perpendicular to the first horizontal direction hd1 and contacting first sidewalls of each layer within the upper layer stack ULS, and the second retro-stepped dielectric material portion 65 comprises a second straight sidewall laterally extending along the second horizontal direction hd2 and contacting second sidewalls of each layer within the upper layer stack ULS.

In one embodiment, the semiconductor structure comprises: a first backside trench fill structure 76 having a first lengthwise sidewall that laterally extends along the first horizontal direction hd1 and contacting each layer within the alternating stack {(132, 146), (232, 246)}; and a second backside trench fill structure 76 having a second lengthwise sidewall that laterally extends along the first horizontal direction hd1 and contacting each layer within the alternating stack {(132, 146), (232, 246)}, wherein the alternating stack {(132, 146), (232, 246)} is located entirely between the first backside trench fill structure 76 and the second backside trench fill structure 76.

In one embodiment, the second backside trench fill structure 76 is laterally offset from the first backside trench fill structure 76 along a second horizontal direction hd2 that is perpendicular to the first horizontal direction hd1 by a backside trench spacing. The first contact region 201A and the second contact region 201B have a respective width along the second horizontal direction hd2 that is the same as the backside trench spacing. In one embodiment, the auxiliary contact region 202 has a width along the second horizontal direction hd2 that is less than the backside trench spacing. In one embodiment, the semiconductor structure comprises a connection strip region including laterally-extending portions of each layer within the upper layer stack ULS, located adjacent to the first contact region 201A, and laterally offset from the first contact region 201A along the second horizontal direction hd2. In one embodiment, widths of the laterally-extending portions of layers within the upper layer stack ULS within the connection strip region along the second horizontal direction hd2 decreases with a vertical distance from the substrate 108.

In the various embodiments of the present disclosure, the length of the portion of the word line drivers 722 which stick out laterally past the respective contact region (200A, 200B) in the first horizontal direction hd1 is reduced in half by laterally splitting the contact regions (200A, 200B) in the first horizontal direction hd1, compared to a single contact region in the memory die 900. Furthermore, the number of word-line-connection logic-side metal interconnect structures 782 from the portion of the word line drivers 722 which stick out laterally past the respective contact region (200A, 200B) in the first horizontal direction hd1 is also reduced in half. Thus, the length and complexity of laterally routing word-line-connection logic-side metal interconnect structures 782 from the end "stick-out" portions of the word line drivers 722 to the respective contact region (200A, 200B) is reduced. Therefore, the various embodiments of the present disclosure can be employed to reduce lateral extent of word-line-connection logic-side metal interconnect structures 782, thereby reducing the RC delay of the word-line-connection logic-side metal interconnect structures 782 and enhancing the efficiency of electrical wiring of all the logic-side metal interconnect structures 780.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
    forming an alternating stack of insulating layers and spacer material layers over a substrate, wherein the spacer material layers are formed as, or are subsequently replaced with, electrically conductive layers, wherein the alternating stack laterally extends through a series of regions that comprises, in a spatial order along a first horizontal direction, a first contact region, a first memory array region, an auxiliary contact region, a second memory array region, and a second contact region;
    forming arrays of memory openings located in the first memory array region and the second memory array region; and
    forming arrays of memory opening fill structures within the arrays of memory openings, wherein each of the memory opening fill structures comprises a respective vertical stack of memory elements,
    wherein the alternating stack comprises a lower layer stack including a first subset of the insulating layers and a first subset of the electrically conductive layers located underneath a horizontal plane, a first upper layer stack including a second subset of the insulating layers and a second subset of the electrically conductive layers located above the horizontal plane, and a second upper layer stack including a third subset of the insulating layers and a third subset of the electrically conductive layers located above the horizontal plane and laterally spaced apart from the first upper layer stack;

wherein the lower layer stack laterally extends through a series of regions that comprises, in a spatial order along a first horizontal direction, a first contact region, a first memory array region, an auxiliary contact region, a second memory array region, and a second contact region; and wherein the first upper layer stack laterally extends through the first memory array region and a first portion of the auxiliary contact region, and the second upper layer stack laterally extends through a second portion of the auxiliary contact region and the second memory array region.

2. The method of claim 1, further comprising forming first contact via structures contacting a respective electrically conductive layer of the first subset of the electrically conductive layers, wherein a first subset of the first contact via structures is formed in the first contact region and a second subset of the first contact via structures is formed in the second contact region.

3. The method of claim 2, further comprising forming second contact via structures contacting a respective electrically conductive layer of the second subset of the electrically conductive layers and the third subset of the electrically conductive layers in the auxiliary contact region.

4. The method of claim 1, further comprising:
providing a logic die comprising word line drivers configured to drive a respective electrically conductive layer of the first subset of the electrically conductive layers, the second subset of the electrically conductive layers, and the third subset of the electrically conductive layers; and
bonding the logic die to the memory die, wherein the word line drivers are electrically connected to a respective electrically conductive layer within the first subset of the electrically conductive layers in the lower layer stack, the second subset of the electrically conductive layers in the first upper layer stack, and the third subset of the electrically conductive layers in the second upper layer stack.

5. The method of claim 4, wherein the word line drivers comprise first word line drivers located in a first word line driver region and second word line drivers located in a second word line driver region, and the first word line driver region has an areal overlap in a plan view with each of the first contact region, the first memory array region, and the auxiliary contact region.

6. A semiconductor structure comprising a memory die, wherein the memory die comprises:
an alternating stack of insulating layers and electrically conductive layers, wherein the alternating stack comprises:
a lower layer stack including a first subset of the insulating layers and a first subset of the electrically conductive layers located underneath a horizontal plane;
a first upper layer stack including a second subset of the insulating layers and a second subset of the electrically conductive layers located above the horizontal plane; and
a second upper layer stack including a third subset of the insulating layers and a third subset of the electrically conductive layers located above the horizontal plane and laterally spaced apart from the first upper layer stack, wherein the lower layer stack laterally extends through a series of regions that comprises, in a spatial order along a first horizontal direction, a first contact region, a first memory array region, an auxiliary contact region, a second memory array region, and a second contact region; and wherein the first upper layer stack laterally extends through the first memory array region and a first portion of the auxiliary contact region, and the second upper layer stack laterally extends through a second portion of the auxiliary contact region and the second memory array region;

arrays of memory openings located in the second memory array region and the first memory array region; and arrays of memory opening fill structures located within the arrays of memory openings and comprising a respective vertical stack of memory elements.

7. The semiconductor structure of claim 6, wherein:
the first contact region and the second contact region comprise a respective subset of first contact via structures contacting a respective electrically conductive layer of the first subset of the electrically conductive layers; and
the auxiliary contact region comprises second contact via structures contacting a respective electrically conductive layer of the second subset of the electrically conductive layers.

8. The semiconductor structure of claim 7, wherein:
the first contact region comprises first stepped surfaces of the lower layer stack;
the second contact region comprises second stepped surfaces of the lower layer stack; and
the auxiliary contact region comprises stepped surfaces of an upper layer stack comprising the first and the second upper layer stacks.

9. The semiconductor structure of claim 8, further comprising:
a retro-stepped dielectric material portion contacting the first stepped surfaces of the lower layer stack; and
a step-less dielectric material portion comprising a straight sidewall that vertically extends from the horizontal plane to a topmost surface of the alternating stack and laterally extends along a second horizontal direction that is perpendicular to the first horizontal direction.

10. The semiconductor structure of claim 6, wherein:
the auxiliary contact region comprises stepped surfaces of an upper layer stack comprising the first and the second upper layer stacks;
the stepped surfaces of the upper layer stack comprise a descending staircase that are surfaces of the first upper layer stack and an ascending staircase that are surfaces of the second upper layer stack, wherein the descending staircase includes horizontal surfaces having a decreasing vertical distance from the substrate within an increasing lateral distance along the first horizontal direction, and the ascending staircase includes horizontal surfaces having an increasing vertical distance from the substrate with the increasing lateral distance along the first horizontal direction; and
an auxiliary stepped dielectric material portion is located on the descending staircase and the ascending staircase.

11. The semiconductor structure of claim 10, further comprising:

a first backside trench fill structure having a first lengthwise sidewall that laterally extends along the first horizontal direction and contacting each layer within the alternating stack; and a second backside trench fill structure having a second lengthwise sidewall that laterally extends along the first horizontal direction and contacting each layer within the alternating stack, wherein the alternating stack comprises a memory block which is located entirely between the first backside trench fill structure and the second backside trench fill structure.

12. The semiconductor structure of claim 11, wherein:
the second backside trench fill structure is laterally offset from the first backside trench fill structure along a second horizontal direction that is perpendicular to the first horizontal direction by a backside trench spacing; and the auxiliary stepped dielectric material portion contacts the first backside trench fill structure and the second backside trench fill structure and has a same width as the backside trench spacing along the second horizontal direction.

13. The semiconductor structure of claim 6, further comprising a logic die bonded to the memory die, wherein the logic die comprises word line drivers electrically connected to respective electrically conductive layers within the first subset of the electrically conductive layers in the lower layer stack, the second subset of the electrically conductive layers in the first upper layer stack, and the third subset of the electrically conductive layers in the second upper layer stack.

14. The semiconductor structure of claim 13, wherein the word line drivers comprise first word line drivers located in a first word line driver region, and the first word line driver region has an areal overlap in a plan view with each of the first contact region, the first memory array region, and the auxiliary contact region.

15. The semiconductor structure of claim 14, wherein the first word line driver region has an areal overlap in the plan view with a peripheral portion of the second memory array region.

16. The semiconductor structure of claim 13, wherein:
each of the memory opening fill structures comprises a respective vertical semiconductor channel;
the memory die comprises first bit lines electrically connected to end portions of a respective subset of the vertical semiconductor channels located in the first memory array region and second bit lines electrically connected to end portions of a respective subset of the vertical semiconductor channels located in the second memory array region; and
the logic die comprises bit line drivers located in a bit line driver region and electrically connected to the first bit lines and the second bit lines.

17. The semiconductor structure of claim 16, wherein the semiconductor structure has a configuration selected from:
a first configuration in which the bit line driver region is located entirely outside areas of the first contact region, the first memory array region, and the auxiliary contact region in a plan view; or
a second configuration in which the bit line driver region has an areal overlap in the plan view with the second memory array region and does not have any areal overlap with the first memory array region or the first contact region.

18. The semiconductor structure of claim 13, wherein the word line drivers further comprise second word line drivers located in a second word line driver region and electrically connected to a respective electrically conductive layer within the first subset of the electrically conductive layers in the lower layer stack, and having an areal overlap in the plan view with the second contact region.

19. The semiconductor structure of claim 18, wherein the series of regions comprises an additional auxiliary contact region and a third memory array region located between the second memory array region and the second contact region.

20. The semiconductor structure of claim 19, wherein the second word line driver region has an areal overlap in the plan view with each of the additional auxiliary contact region, the third memory array region, and a peripheral portion of the second memory array region.

* * * * *